United States Patent
Jung et al.

(10) Patent No.: US 12,279,519 B2
(45) Date of Patent: *Apr. 15, 2025

(54) ORGANIC ELECTROLUMINESCENCE DEVICE

(71) Applicant: Samsung Display Co., Ltd., Yongin-si (KR)

(72) Inventors: Hyejin Jung, Hwaseong-si (KR); Minje Kim, Suwon-si (KR); Eung Do Kim, Seoul (KR); Hyunyoung Kim, Yongin-si (KR); Hyojeong Kim, Hwaseong-si (KR); Hyosup Shin, Hwaseong-si (KR); Seokgyu Yoon, Hwaseong-si (KR); Youngki Lee, Asan-si (KR); Jungsub Lee, Hwaseong-si (KR); Jiyoung Lee, Hwaseong-si (KR); Kunwook Cho, Seoul (KR); Hyeon Gu Cho, Yongin-si (KR); Minsoo Choi, Hwaseong-si (KR); Youngeun Choi, Jeonju-si (KR); Hyein Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 455 days.

This patent is subject to a terminal disclaimer.

(21) Appl. No.: 16/997,715

(22) Filed: Aug. 19, 2020

(65) Prior Publication Data

US 2021/0098721 A1    Apr. 1, 2021

(30) Foreign Application Priority Data

Oct. 1, 2019    (KR) .................. 10-2019-0121388

(51) Int. Cl.
H01L 51/00    (2006.01)
H10K 85/30    (2023.01)
(Continued)

(52) U.S. Cl.
CPC .......... *H10K 85/40* (2023.02); *H10K 85/322* (2023.02); *H10K 85/342* (2023.02);
(Continued)

(58) Field of Classification Search
None
See application file for complete search history.

(56) References Cited

U.S. PATENT DOCUMENTS 9,604,928 B2    3/2017  Shitagaki et al.
9,666,817 B2    5/2017  Kim et al.
(Continued)

FOREIGN PATENT DOCUMENTS

CN    106910831 A    6/2017
CN    107275496 A    10/2017
(Continued)

OTHER PUBLICATIONS

Liang, Xiao, et al. "Peripheral amplification of multi-resonance induced thermally activated delayed fluorescence for highly efficient OLEDs." Angewandte Chemie 130.35 (2018): 11486-11490. (Year: 2018).*

(Continued)

*Primary Examiner* — Robert S Loewe
(74) *Attorney, Agent, or Firm* — Womble Bond Dickinson (US) LLP

(57) ABSTRACT

An organic electroluminescence device of an embodiment includes a first electrode, a second electrode on the first electrode, and an emission layer between the first electrode and the second electrode, wherein the emission layer includes a first host and a second host which are different from each other, a first dopant including an organic metal complex containing Ir, Ru, Rh, Pt, Pd, Cu, or Os as a central metal atom, and a second dopant represented by Formula (Continued)

D-2 below, and thereby the organic electroluminescence device may exhibit high luminous efficiency and long service life characteristics.

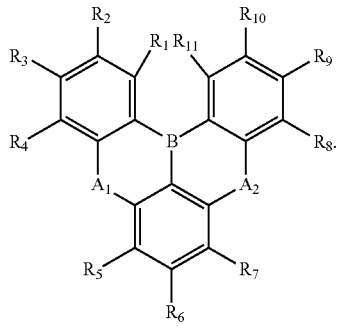

Formula D-2

22 Claims, 2 Drawing Sheets

(51) Int. Cl.
　　　H10K 85/40　　(2023.01)
　　　H10K 85/60　　(2023.01)
　　　H10K 50/11　　(2023.01)
　　　H10K 50/12　　(2023.01)
　　　H10K 101/10　(2023.01)
(52) U.S. Cl.
　　　CPC .......... H10K 85/346 (2023.02); H10K 85/654 (2023.02); H10K 85/6572 (2023.02); H10K 85/6574 (2023.02); H10K 85/6576 (2023.02); H10K 50/11 (2023.02); H10K 50/12 (2023.02); H10K 2101/10 (2023.02)

(56) References Cited

U.S. PATENT DOCUMENTS

| | | |
|---|---|---|
| 9,741,939 B2 | 8/2017 | Kim et al. |
| 9,923,155 B2 | 3/2018 | Li et al. |
| 9,980,358 B2 | 5/2018 | Kim |
| 9,985,233 B2* | 5/2018 | Hashimoto ......... H01L 51/5016 |
| 10,008,676 B2 | 6/2018 | Han et al. |
| 10,062,850 B2 | 8/2018 | Jung et al. |
| 10,090,483 B2 | 10/2018 | Kim et al. |
| 10,374,166 B2 | 8/2019 | Hatakeyama et al. |
| 10,418,573 B2 | 9/2019 | Kim et al. |
| 10,431,766 B2 | 10/2019 | Ito et al. |
| 10,886,478 B2 | 1/2021 | Li et al. |
| 10,916,715 B2 | 2/2021 | Ko et al. |
| 11,316,124 B2 | 4/2022 | Ito et al. |
| 11,482,680 B2 | 10/2022 | Kim et al. |
| 2013/0264560 A1 | 10/2013 | Dobbs et al. |
| 2014/0077172 A1 | 3/2014 | So et al. |
| 2015/0001502 A1* | 1/2015 | Seo ..................... H01L 51/5024 257/40 |
| 2015/0105556 A1 | 4/2015 | Li et al. |
| 2015/0207079 A1 | 7/2015 | Cho et al. |
| 2015/0295197 A1 | 10/2015 | Adamovich et al. |
| 2016/0028028 A1 | 1/2016 | Li et al. |
| 2016/0087227 A1 | 3/2016 | Kim et al. |
| 2016/0164020 A1 | 6/2016 | Kim et al. |
| 2016/0233442 A1 | 8/2016 | Yen et al. |
| 2016/0301014 A1 | 10/2016 | Kawamura et al. |
| 2017/0179395 A1 | 6/2017 | Kim et al. |
| 2017/0294613 A1 | 10/2017 | Cho et al. |
| 2017/0346029 A1* | 11/2017 | Kim ..................... H01L 51/5016 |
| 2018/0033987 A1* | 2/2018 | Kim ..................... H01L 51/506 |
| 2018/0108857 A1 | 4/2018 | Adachi et al. |
| 2018/0151821 A1* | 5/2018 | Peng ................... H01L 51/5096 |
| 2018/0312533 A1 | 11/2018 | Ahn et al. |
| 2018/0323394 A1 | 11/2018 | Haldi et al. |
| 2018/0337361 A1 | 11/2018 | Lee et al. |
| 2018/0375036 A1 | 12/2018 | Chen et al. |
| 2019/0013478 A1* | 1/2019 | Iijima ................. H01L 51/0071 |
| 2019/0019964 A1 | 1/2019 | Jeon et al. |
| 2019/0019971 A1* | 1/2019 | Xie ........................ C09K 11/06 |
| 2019/0036055 A1 | 1/2019 | Lin et al. |
| 2019/0058124 A1 | 2/2019 | Hatakeyama et al. |
| 2019/0058137 A1* | 2/2019 | Ko ........................... H01L 51/50 |
| 2019/0062312 A1 | 2/2019 | Zink |
| 2019/0067616 A1 | 2/2019 | Jeon et al. |
| 2019/0093009 A1 | 3/2019 | Yen et al. |
| 2019/0097155 A1 | 3/2019 | Kim et al. |
| 2019/0148640 A1 | 5/2019 | Lim et al. |
| 2019/0157351 A1 | 5/2019 | Kim et al. |
| 2019/0203114 A1 | 7/2019 | Ihn et al. |
| 2019/0207112 A1 | 7/2019 | Hatakeyama et al. |
| 2019/0296254 A1 | 9/2019 | Ko et al. |
| 2019/0393422 A1 | 12/2019 | Sakamoto |
| 2020/0083461 A1 | 3/2020 | Duan et al. |
| 2020/0136046 A1 | 4/2020 | Béalle et al. |
| 2020/0203651 A1* | 6/2020 | Duan ................... H01L 51/0059 |
| 2020/0321539 A1* | 10/2020 | Zhao ................... H01L 51/0072 |
| 2021/0098713 A1 | 4/2021 | Choi et al. |
| 2021/0098714 A1 | 4/2021 | Choi et al. |
| 2021/0098716 A1 | 4/2021 | Lee et al. |
| 2021/0098721 A1 | 4/2021 | Jung et al. |
| 2021/0104681 A1 | 4/2021 | Kim et al. |
| 2021/0292342 A1 | 9/2021 | Suzuki et al. |
| 2022/0024958 A1 | 1/2022 | Ko et al. |
| 2022/0131086 A1 | 4/2022 | Lee et al. |
| 2023/0127039 A1 | 4/2023 | Naijo et al. |
| 2023/0138754 A1 | 5/2023 | Lee et al. |

FOREIGN PATENT DOCUMENTS

| | | |
|---|---|---|
| CN | 109192874 A | 1/2019 |
| CN | 109786569 A | 5/2019 |
| EP | 3109253 A1 | 12/2016 |
| EP | 3435438 A2 | 1/2019 |
| EP | 3800683 A1 | 4/2021 |
| JP | 2004273190 A | 9/2004 |
| JP | 2011-153276 A | 8/2011 |
| JP | 2016-130231 A | 7/2016 |
| JP | 2019-169710 A | 10/2019 |
| KR | 10-1219668 B1 | 1/2013 |
| KR | 10-1419810 B1 | 7/2014 |
| KR | 10-2016-0012941 A | 2/2016 |
| KR | 10-2016-0034528 A | 3/2016 |
| KR | 10-2016-0039974 A | 4/2016 |
| KR | 10-1617877 B1 | 5/2016 |
| KR | 10-2016-0067629 A | 6/2016 |
| KR | 10-2016-0101519 A | 8/2016 |
| KR | 10-1646732 B1 | 8/2016 |
| KR | 10-2016-0119683 A | 10/2016 |
| KR | 10-1680934 B1 | 11/2016 |
| KR | 10-2017-0014797 A | 2/2017 |
| KR | 10-1706752 B1 | 2/2017 |
| KR | 10-2017-0026075 A | 3/2017 |
| KR | 10-2017-0078573 A | 7/2017 |
| KR | 10-2017-0083960 A | 7/2017 |
| KR | 20180013380 A | 2/2018 |
| KR | 10-2018-0033094 A | 4/2018 |
| KR | 20180043886 A | 5/2018 |
| KR | 20180108604 A | 10/2018 |
| KR | 10-2018-0120865 A | 11/2018 |
| KR | 20180134850 A | 12/2018 |
| KR | 10-2019-0000812 A | 1/2019 |
| KR | 10-2019-0008481 A | 1/2019 |
| KR | 10-2019-0034126 A | 4/2019 |
| WO | WO 2011081286 A2 | 7/2011 |

(56) References Cited

FOREIGN PATENT DOCUMENTS

| WO | WO 2016/152605 A1 | 9/2016 |
| WO | 2019/128105 A1 | 7/2019 |

OTHER PUBLICATIONS

Martin C. E. Huber, et al., "The measurement of oscillator strengths," Reports on Progress in Physics, Institute of Physics Publishing, Bristol, GB, Vo. 49, No. 4, Apr. 1, 1986, pp. 397-490, XP020024846, DOI: 10.1088/0034-4885/49/4/002.

Translation—JP-2004273190-A (Year: 2004).

Translation—WO-2011081286-A2 (Year: 2011).

U.S. Office Action dated Jan. 24, 2023, issued in U.S. Appl. No. 16/919,858 (25 pages).

US Notice of Allowance dated Jun. 1, 2023, issued in U.S. Appl. No. 18/064,787 (8 pages).

JP-2011153276-A—translation (Year: 2011).

US Final Office Action dated Aug. 2, 2023, issued in U.S. Appl. No. 16/919,858 (26 pages).

Chiu, et al., "High-Efficiency Blue Phosphorescence Organic Light-Emitting Diode with Ambipolar Carbozole-Triazole Host," J. Phys. Chem. C (2015), vol. 119, pp. 16846-16852.

Choi, et al., "Simultaneous achievement of High Efficiency and Long Lifetime in Deep Blue Phosphorescent Organic Light-Emitting Diodes," Advanced Optical Materials (2019), vol. 7, No. 23, pp. 1901374-1901374.

Finkenzeller, et al., "Emission of Ir(ppy)$_3$. Temperature dependence, Decay Dynamics, and Magnetic Field Properties", Chemical Physics Letters (2003), vol. 377 pp. 299-305.

Hatakeyama, et al., "Ultrapure Blue Thermally Activated Delayed Fluorescence Molecules: Efficient HOMO-LUMO Separation by the Multiple Resonance Effect," Adv. Mater. (2016), vol. 28, pp. 2777-2781.

Hedley, et al., "Ultrafast Luminescence in Ir(ppy)$_3$," Chemical Physics Letters (2008), vol. 450, pp. 292-296.

Huang, et al., "Investigation of Exciton Recombination Zone in Quantum Dot Light-Emitting Diodes Using a Fluorescent Probe", ACS Appl. Mater. Interfaces (2017), vol. 9, pp. 27809-27816.

Joo, et al., "Development of Solution-Processable Blue/Hybrid-White OLEDs Based on Thermally Activated Delayed Fluorescence", Journal of Industrial and Engineering Chemistry (2018), vol. 65, pp. 35-39.

Lee, et al., "Phosphor Sensitized Thermally Activated Delayed Fluorescence Organic Light-Emitting Diodes with Ideal Deep Blue Device Performances", Journal of Materials Chemistry C (2019), vol. 7, pp. 8562-8568.

Li, et al. "Efficient and Stable White Organic Light-Emitting Diodes Employing a Single Emitter," Adv. Mater. (2014), vol. 26, pp. 2931-2936.

Li, et al., "Efficient Solution-Processed Blue and White OLEDs Based on a High-Triplet Bipolar Host and a Blue TADF Emitter", Organic Electronics (2018), vol. 58, pp. 276-282.

Office Action for U.S. Appl. No. 17/131,555 dated Oct. 18, 2023, 20 pages.

Park, et al., "High Efficiency of Over 25% and Long Device Lifetime of Over 500 h at 1000 nit in Blue Fluorescent Organic Light-Emitting Diodes" Adv. Mater. (2022), vol. 34, 7 pages.

Saghaei, et al., "Effect of PEDOT:PSS on the Performance of Solution-Processed Blue Phosphorescent Organic Light-emitting Diodes with an Exciplex Host," Mater. Adv. (2022), vol. 3, pp. 1055-1063.

Zhao, et al., "Highly Efficient Red OLEDs Using DCJTB as the Dopant and Delayed Fluorescent Exciplex as the Host," Scientific Reports (2015), vol. 5, 8 pages.

US Office Action dated Feb. 12, 2024, issued in U.S. Appl. No. 16/919,858 (19 pages).

US Final Office Action dated Mar. 8, 2024, issued in U.S. Appl. No. 17/131,555 (19 pages).

US Final Office Action dated Jun. 12, 2024, issued in U.S. Appl. No. 16/919,858 (20 pages).

Wong, Michael Y. and Eli Zysman-Colman. "Purely organic thermally activated delayed fluorescence materials for organic light-emitting diodes." Advanced Materials 29.22 (2017): 1605444. (Year: 2017).

US Office Action dated Oct. 10, 2024, issued in U.S. Appl. No. 18/528,604 (8 pages).

US Office Action dated Oct. 10, 2024, issued in U.S. Appl. No. 17/131,555 (25 pages).

US Office Action dated Dec. 18, 2024, issued in U.S. Appl. No. 16/919,858 (20 pages).

US Notice of Allowance dated Feb. 12, 2025, issued in U.S. Appl. No. 18/528,604 (6 pages).

\* cited by examiner

ORGANIC ELECTROLUMINESCENCE DEVICE

CROSS-REFERENCE TO RELATED APPLICATION

This application claims priority to and the benefit of Korean Patent Application No. 10-2019-0121388, filed on Oct. 1, 2019, the entire content of which is hereby incorporated by reference.

BACKGROUND

One or more aspects of embodiments of the present disclosure relate to an organic electroluminescence device, and more particularly, to an organic electroluminescence device including a plurality of emission layer materials in an emission layer.

Recently, the development of an organic electroluminescence display as an image display is being actively conducted. The organic electroluminescence display is a self-luminescent display, which is different from a liquid crystal display, and in which holes and electrons injected from a first electrode and a second electrode recombine in an emission layer, and thus a luminescence material including an organic compound in the emission layer emits light to attain display of images.

In the application of an organic electroluminescence device to a display, a low driving voltage, high luminous efficiency, and long service life of the organic electroluminescence device are required (or desired), and development of materials for the organic electroluminescence device that is capable of stably attaining these characteristics is being continuously required.

In particular, to implement a high-efficient organic electroluminescence display, recently, a technology of phosphorescent light emission using energy in a triplet state, or delayed fluorescent light emission using a phenomenon which generates singlet excitons by colliding triplet excitons (triplet-triplet annihilation or TTA), is being developed, and development of a thermally activated delayed fluorescence (TADF) material using a delayed fluorescent light emission phenomenon is being conducted.

SUMMARY

One or more aspects of embodiments of the present disclosure are directed toward an organic electroluminescence device exhibiting good service life characteristics and excellent luminous efficiency.

An embodiment of the present disclosure provides an organic electroluminescence device, including: a first electrode; a second electrode on the first electrode; and an emission layer between the first electrode and the second electrode, wherein the emission layer includes a first host; a second host different from the first electrode; a first dopant including an organic metal complex containing Ir, Ru, Rh, Pt, Pd, Cu, or Os as a central metal atom; and a second dopant represented by the following Formula D-2:

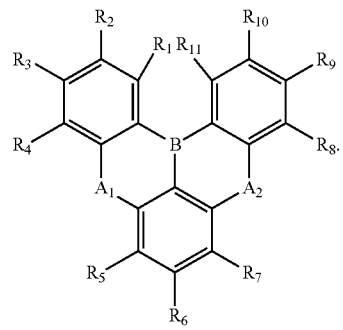

Formula D-2

In Formula D-2, $A_1$ and $A_2$ may each independently be $NR_m$ or O, and $R_m$ may be a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group of 2 to 30 carbon atoms for forming a ring. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and any of $R_1$ to $R_{11}$ may be combined with an adjacent group to form a ring.

The first host may be represented by the following Formula H-1:

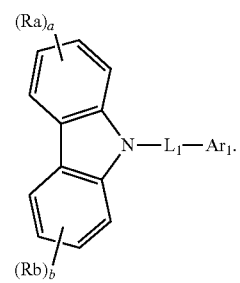

Formula H-1

In Formula H-1, $L_1$ may be a direct linkage, a substituted or unsubstituted arylene group having 6 to 30 carbon atoms for forming a ring, or a substituted or unsubstituted heteroarylene group having 2 to 30 carbon atoms for forming a ring, $Ar_1$ may be a substituted or unsubstituted aryl group having 6 to 30 carbon atoms for forming a ring, or a substituted or unsubstituted heteroaryl group having 2 to 30 carbon atoms for forming a ring. a and b may each independently be an integer of 0 to 4, and $R_a$ and $R_b$ may each independently be a substituted or unsubstituted aryl group having 6 to 30 carbon atoms for forming a ring, or a substituted or unsubstituted heteroaryl group having 2 to 30 carbon atoms for forming a ring.

The second host may be represented by the following Formula H-2:

Formula H-2

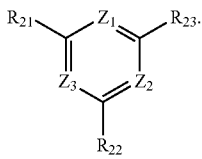

In Formula H-2, $Z_1$ to $Z_3$ may be each independently $CR_y$ or N, and $R_y$ and $R_{21}$ to $R_{23}$ may each independently be a hydrogen atom, a deuterium atom, a cyano group, a substituted or unsubstituted silyl group, a substituted or unsubstituted aryl group having 6 to 30 carbon atoms for forming a ring, or a substituted or unsubstituted heteroaryl group having 2 to 30 carbon atoms for forming a ring.

Formula H-2 may be represented by the following Formula H-2a:

Formula H-2a

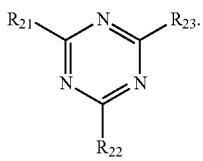

In Formula H-2a, $R_{21}$ to $R_{23}$ may be the same as those defined in Formula H-2.

Formula H-2 above may be represented by the following Formula H-2b:

Formula H-2b

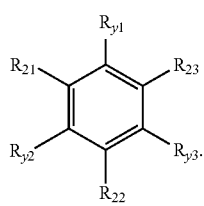

In Formula H-2b, $R_{21}$ to $R_{23}$ and $R_{y1}$ to $R_{y3}$ may each independently be a hydrogen atom, a deuterium atom, a cyano group, a substituted or unsubstituted silyl group, a substituted or unsubstituted aryl group having 6 to 30 carbon atoms for forming a ring, or a substituted or unsubstituted heteroaryl group having 2 to 30 carbon atoms for forming a ring, and at least one selected from $R_{21}$ to $R_{23}$ and $R_{y1}$ to $R_{y3}$ may be a cyano group, an aryl group having 6 to 30 carbon atoms for forming a ring and including at least one cyano group as a substituent, or a heteroaryl group having 2 to 30 carbon atoms for forming a ring and including at least one cyano group as a substituent.

The first dopant may be represented by the following Formula D-1a or Formula D-1b:

Formula D-1a

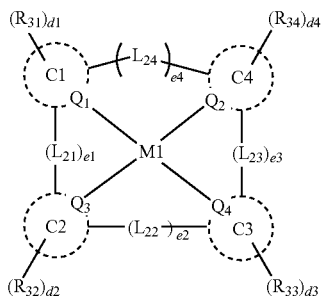

Formula D-1b

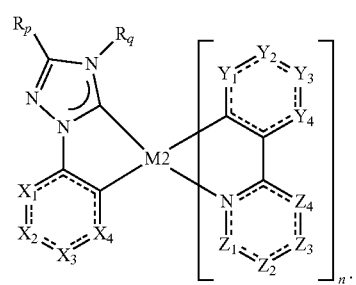

In Formula D-1a, M1 may be Pt, Pd, Cu, or Os, $Q_1$ to $Q_4$ may each independently be C or N, and C1 to C4 may each independently be a substituted or unsubstituted hydrocarbon ring having 5 to 30 carbon atoms for forming a ring, or a substituted or unsubstituted heterocyclic ring having 2 to 30 carbon atoms for forming a ring. $L_{21}$ to $L_{24}$ may each independently be a direct linkage, *—O—*, *—S—*,

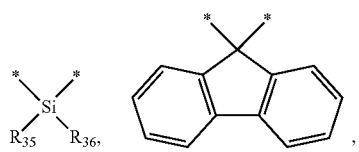

a substituted or unsubstituted divalent alkyl group having 1 to 20 carbon atoms, a substituted or unsubstituted arylene group having 6 to 30 carbon atoms for forming a ring, or a substituted or unsubstituted heteroarylene group having 2 to 30 carbon atoms for forming a ring. e1 to e4 may each independently be 0 or 1, and $R_{31}$ to $R_{36}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{31}$ to $R_{36}$ may be combined with an adjacent group to form a ring, and d1 to d4 may each independently be an integer of 0 to 4. In Formula D-1 b, M2 may be Ir, Ru, or Rh, n may be 1 or 2, and $X_1$ to $X_4$, $Y_1$ to $Y_4$, and $Z_1$ to $Z_4$ may each independently be $CR_n$ or N. $R_p$, $R_q$, and $R_n$ may each independently be a hydrogen atom, a deuterium atom, a halogen atom, a cyano group, a substituted or unsubstituted alkyl group having 1 to 20 carbon atoms, a substituted or unsubstituted hydrocarbon ring having 5 to 30 carbon atoms for forming a ring, a substituted or unsubstituted heterocyclic ring having 2 to 30 carbon atoms for forming a ring, or a substituted or unsubstituted amine group, and any of $R_p$, $R_q$, and $R_n$ may be combined with an adjacent group to form a ring.

Formula D-2 above may be represented by any one of the following Formula D-2a to D-2d below:

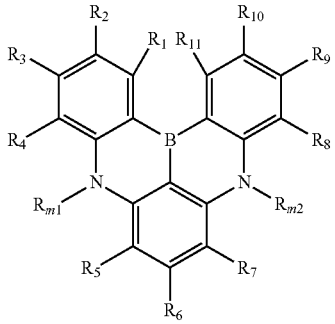

Formula D-2a

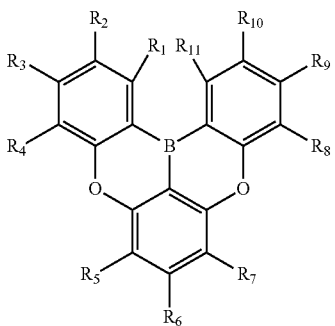

Formula D-2b

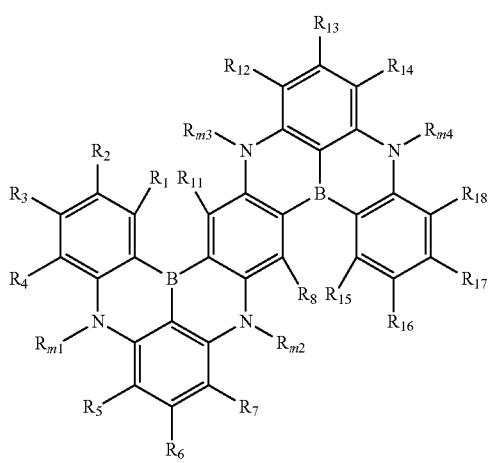

Formula D-2c

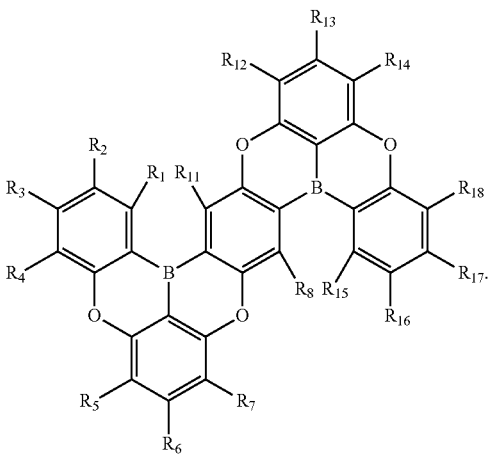

Formula D-2d

In Formula D-2a to Formula D-2d, $R_{m1}$ to $R_{m4}$ may each independently be a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. $R_1$ to $R_{18}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and any of $R_1$ to $R_{18}$ may be combined with an adjacent group to form a ring.

The weight ratio of the first host and the second host may be 7:3 to 3:7.

The content of the first dopant may be about 10 wt % to about 15 wt %, and the content of the second dopant may be about 1 wt % to about 5 wt %, with respect to the total compound weight of the first host, the second host, the first dopant, and the second dopant.

The emission layer may emit blue fluorescence.

The lowest triplet exciton energy level of the first dopant may be higher than the lowest triplet exciton energy level of the second dopant.

An embodiment of the present disclosure provides an organic electroluminescence device including: a first electrode; a second electrode on the first electrode; and an emission layer between the first electrode and the second electrode, wherein the emission layer includes a first host represented by the following Formula H-1; a second host represented by the following Formula H-2; a first dopant including an organic metal complex containing Ir, Ru, Rh, Pt, Pd, Cu, or Os as a central metal atom; and a second dopant as a delayed fluorescence emitter, wherein the lowest triplet exciton energy level of the first dopant is higher than the lowest triplet exciton energy level of the second dopant:

Formula H-1

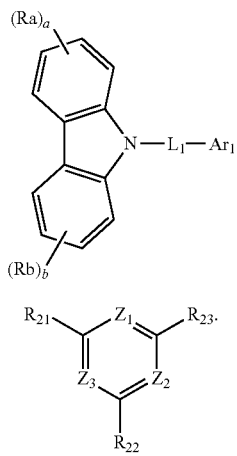

The first dopant may be represented by the following Formula D-1a or Formula D-1b:

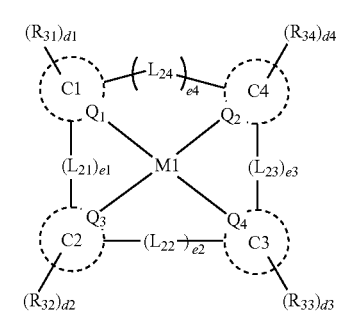

Formula D-1a

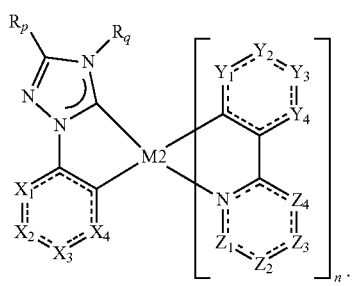

Formula D-1b

The second dopant may be represented by the following Formula D-2:

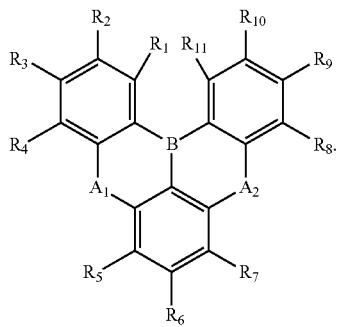

Formula D-2

The second host may be represented by Formula H-2a below, and the first dopant may be represented by the following Formula D-1a-1 or Formula D-1 b-1:

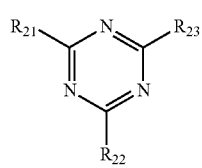

Formula H-2a

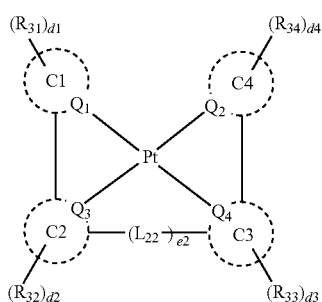

Formula D-1a-1

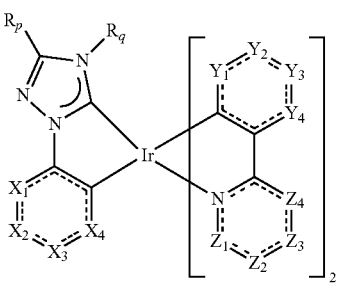

Formula D-1b-1

In Formula H-2a, $R_{21}$ to $R_{23}$ may be the same as those defined in Formula H-2. In Formula D-1a-1, C1 to C4, $Q_1$ to $Q_4$, $R_{31}$ to $R_{34}$, d1 to d4, $L_{22}$ and e2 may be the same as those defined in Formula D-1a above, and in Formula D-1 b-1, $X_1$ to $X_4$, $Y_1$ to $Y_4$, $Z_1$ to $Z_4$, $R_p$, and $R_q$ may be the same as those defined in Formula D-1b above.

The second host may be represented by the following Formula H-2b, and the first dopant may be represented by the following Formula D-1a-1 or Formula D-1 b-1:

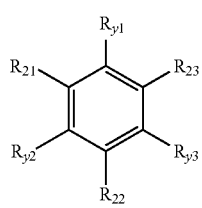

Formula H-2b

-continued

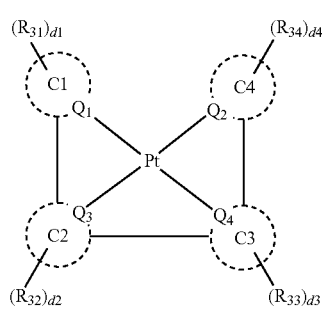

Formula D-1a-1

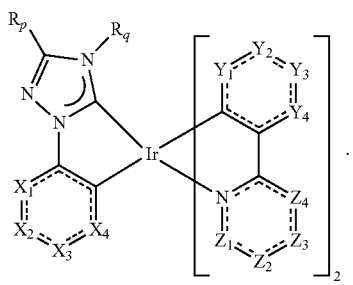

Formula D-1b-1

BRIEF DESCRIPTION OF THE FIGURES

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
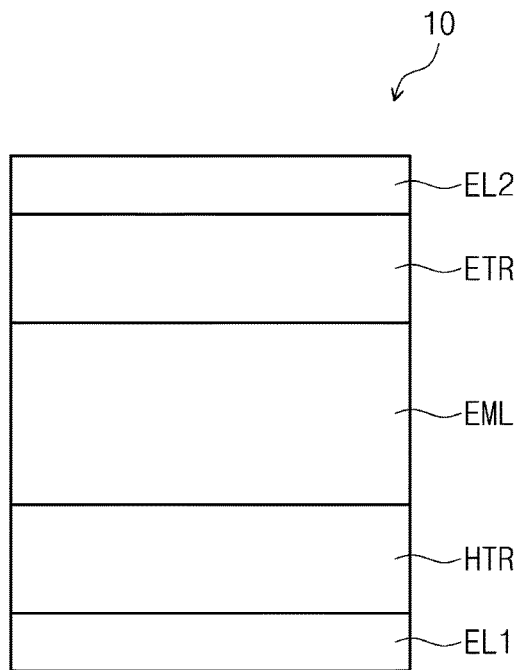
FIG. 1 is a cross-sectional view schematically illustrating an organic electroluminescence device according to an embodiment of the present disclosure.

Since embodiments of the present disclosure may have various modifications and diverse shapes, particular embodiments are illustrated in the drawings and are described in the detailed description. However, this does not intend to limit the present disclosure within particular embodiments, and it should be understood that the present disclosure covers all the modifications, equivalents, and replacements within the idea and technical scope of the present disclosure.

In this specification, it will also be understood that when a component (a region, a layer, a portion, and/or the like) is referred to as "being on", "being connected to", or "being coupled to" another component, it may be directly on/connected/coupled to the another component (without any intervening components therebetween), or one or more intervening components may be present therebetween.

Like reference symbols refer to like elements throughout. Also, in the drawings, the thicknesses, dimensions, and ratios of the components are exaggerated for effectively describing the technical features.

"And/or" include one or more combinations in which the associated components may define. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

Although the terms such as first and second are used herein to describe various components, these components should not be limited by these terms. The terms are only used to distinguish one component from other components. For example, a first component may be referred to as a second component, and similarly a second component may be referred to as a first component, without departing from the scope of the present disclosure. The expression of a singular form may include plural forms unless definitely indicating a particular case in terms of the context.

Also, terms of "below", "in lower side", "above", "in upper side", and the like may be used to describe the relationships of the components illustrated in the drawings. These terms are relative concepts, and are described on the basis of the directions illustrated in the drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that the meaning of "comprise," "include," or "have" specifies the presence of a feature, a fixed number, a step, a process, an element, a component, or a combination thereof disclosed in the specification, but does not exclude the possibility of presence or addition of one or more other features, fixed numbers, steps, processes, elements, components, or combination thereof.

Hereinafter, an organic electroluminescence device according to an embodiment of the present disclosure and a compound included in the same according to an embodiment will be explained referring to drawings.

FIGS. 1 to 4 are a cross-sectional view schematically illustrating an organic electroluminescence device according to an embodiment of the present disclosure. Referring to FIGS. 1 to 4, in an organic electroluminescence device 10 according to an embodiment of the present disclosure, a first electrode EL1 and a second electrode EL2 are positioned oppositely to each other, and an emission layer EML may be provided between the first electrode EL1 and the second electrode EL2.

Furthermore, the organic electroluminescence device 10 of an embodiment further includes a plurality of functional layers between the first electrode EL1 and the second electrode EL2, in addition to the emission layer EML. The plurality of functional layers may include a hole transport region HTR, and an electron transport region ETR. For example, the organic electroluminescence device 10 according to an embodiment of the present disclosure may include a first electrode EU, a hole transport region HTR, an emission layer EML, an electron transport region ETR, and a second electrode EL2 which are laminated sequentially. In some embodiments, the organic electroluminescence device 10 of an embodiment may include a capping layer on the second electrode EL2.

The organic electroluminescence device 10 of an embodiment may include a compound according to an embodiment described below in the emission layer EML between the first electrode EL1 and the second electrode EL2. However, embodiments are not limited thereto, and the organic electroluminescence device 10 of an embodiment may include the compound in the hole transport region HTR or the electron transport region ETR, which are among the plurality of functional layers between the first electrode EL1 and the second electrode EL2, or may include the compound in the capping layer on the second electrode EL2, as well as in the emission layer EML.

Figure 2:
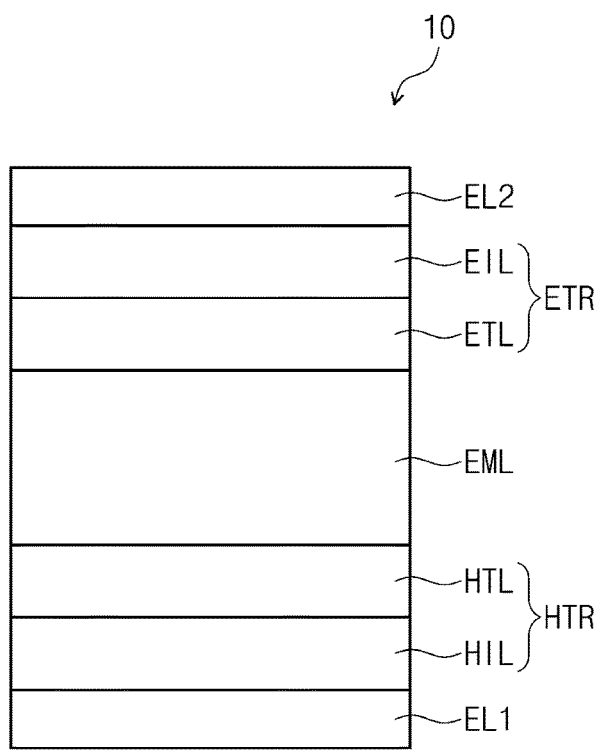
FIG. 2 is a cross-sectional view schematically illustrating an organic electroluminescence device according to an embodiment of the present disclosure.
Figure 3:
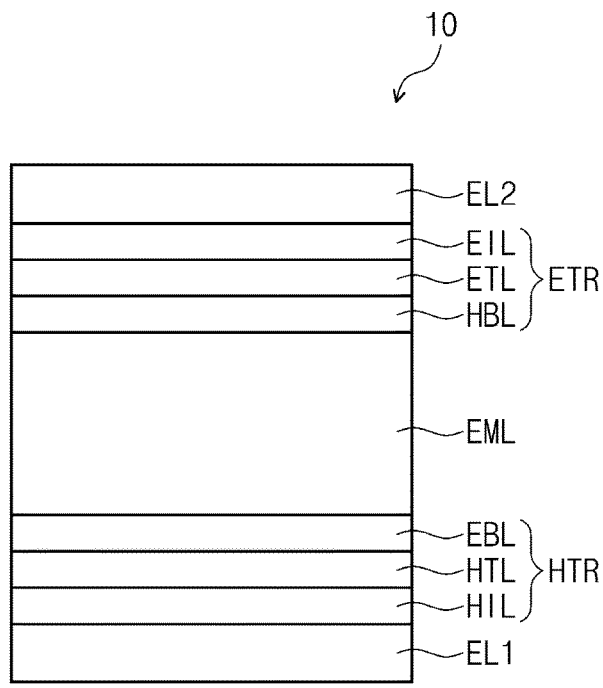
FIG. 3 is a cross-sectional view schematically illustrating an organic electroluminescence device according to an embodiment of the present disclosure.
Figure 4:
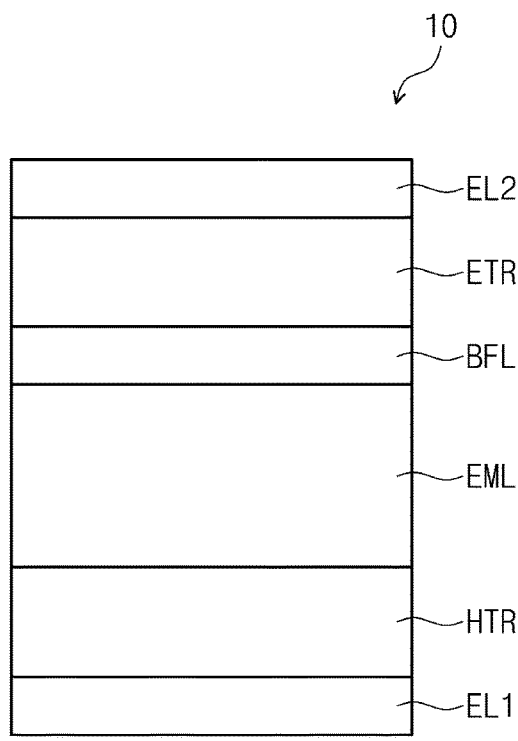
FIG. 4 is a cross-sectional view schematically illustrating an organic electroluminescence device according to an embodiment of the present disclosure.

When compared with FIG. 1, FIG. 2 shows a cross-sectional view of an organic electroluminescence device 10 of an embodiment, wherein the hole transport region HTR includes a hole injection layer HIL and a hole transport layer HTL, and the electron transport region ETR includes an electron injection layer EIL and an electron transport layer ETL. Furthermore, when compared with FIG. 1, FIG. 3 shows a cross-sectional view of an organic electroluminescence device 10 of an embodiment, wherein the hole transport region HTR includes a hole injection layer HIL, a hole transport layer HTL, and an electron blocking layer EBL, the electron transport region ETR includes an electron injection layer EIL, an electron transport layer ETL, and a hole blocking layer HBL. When compared with FIG. 1, FIG. 4 shows a cross-sectional view of an organic electroluminescence device 10 of an embodiment including the buffer layer BFL between the emission layer and the electron transport region.

The first electrode EL1 has conductivity. The first electrode EL1 may be formed of a metal alloy or any suitable conductive compound. The first electrode EL1 may be an anode. In some embodiments, the first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide, for example, indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg Cu, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. In some embodiments, the first electrode EL1 may have a multi-layered structure including a reflective layer or transflective layer, and a transparent conductive layer formed of indium tin oxide (ITO), indium zinc oxide (IZO), zinc oxide (ZnO), and/or indium tin zinc oxide (ITZO). For example, the first electrode EL1 may have, but is not limited to, a three-layer structure of ITO/Ag/ITO. The first electrode EL1 may have a thickness from about 1,000 Å to about 10,000 Å, for example, from about 1,000 Å to about 3,000 Å.

The hole transport region HTR is provided on the first electrode EL1. The hole transport region HTR may include at least one selected from a hole injection layer HIL, a hole transport layer HTL, a hole buffer layer, and an electron blocking layer. The hole transport region HTR may have a thickness, for example, from about 50 Å to about 1,500 Å.

The hole transport region HTR may have a multilayer structure having a single layer formed of a single material, a single layer formed of materials different from each other, or a plurality of layers formed of materials different from each other.

For example, the hole transport region HTR may have a single layer structure of a hole injection layer HIL or a hole transport layer HTL, or a single layer structure formed of a hole injection material and/or a hole transport material. In some embodiments, the hole transport region HTR has a single layer structure formed of materials different from each other, or a structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, which are sequentially laminated from the first electrode EL1, but embodiments are not limited thereto.

The hole transport region HTR may be formed by using one or more suitable methods such as a vacuum deposition method, a spin coating method, a casting method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylam ino]triphenylamine] (m-MTDATA), 4,4',4"-tris(N,N-diphenylamino)triphenylamine (TDATA), 4,4',4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include, for example, carbazole derivatives (such as N-phenyl carbazole and/or polyvinyl carbazole), fluorene derivatives, N,N'-bis(3-methylphenyl)-N,N'-diphenyl-[1,1-biphenyl]-4,4'-diamine (TPD), triphenylamine derivatives (such as 4,4',4"-tris(N-carbazolyl)triphenylamine (TCTA)), N,N'-di(naphthalenyl)-N,N'-diphenyl-benzidine (NPB), 4,4'-cyclohexylidene bis [N,N-bis(4-methylphenyl]benzenamine] (TAPC), 4,4'-bis [N,N'-(3-tolyl)amino]-3,3'-dimethylbiphenyl (HMTPD), 1,3-bis(N-carbazolyl)benzene (mCP), etc.

The hole transport region HTR may have a thickness from about 50 Å to about 10,000 Å, for example, from about 100 Å to about 5,000 Å. The hole injection layer HIL may have a thickness, for example, from about 30 Å to about 1,000 Å, and the hole transport layer HTL may have a thickness from about 30 Å to about 1,000 Å. For example, the electron blocking layer EBL may have a thickness from about 10 Å to about 1,000 Å. When the thicknesses of the hole transport region HTR, the hole injection layer HIL, the hole transport layer HTL, and the electron blocking layer EBL each independently satisfy the above-described ranges, satisfactory (or suitable) hole transport characteristics may be achieved without a substantial increase in driving voltage.

The hole transport region HTR may further include a charge generating material, in addition to the above-described materials, to improve conductivity. The charge generating material may be uniformly or non-uniformly dispersed into the hole transport region HTR. The charge generating material may be, for example, a p-dopant. The p-dopant may be one of quinone derivatives, metal oxides, or cyano group-containing compounds, but is not limited thereto. Non-limiting examples of the p-dopant may include, but are not limited to, quinone derivatives (such as tetra-cyanoquinodimethane (TCNQ) and/or 2,3,5,6-tetrafluoro-tetracyanoquinodimethane (F4-TCNQ)), and metal oxides (such as tungsten oxides and/or molybdenum oxides).

As described above, the hole transport region HTR may further include at least one of the hole buffer layer or the electron blocking layer EBL, in addition to the hole injection layer HIL and the hole transport layer HTL. The hole buffer layer may compensate a resonance distance according to the wavelength of light emitted from the emission layer EML to increase luminous efficiency. A material that may be contained in the hole transport layer may be used as a material to be contained in the hole buffer layer. The electron blocking layer EBL is a layer playing the role of blocking or reducing the electron injection from the electron transport region ETR to the hole transport region HTR.

The emission layer EML is on the hole transport region HTR. The emission layer EML may have a thickness, for example, from about 100 Å to about 1,000 Å, or from about 100 Å to about 300 Å. The emission layer EML may have a multilayer structure having a single layer formed of a single material, a single layer formed of materials different from each other, or a plurality of layers formed of materials different from each other.

The emission layer EML in the organic electroluminescence device 10 of an embodiment may include a plurality of luminescence materials different from each other. In some embodiments, the organic electroluminescence device 10 of an embodiment includes a first host and a second host, which are different from each other, and a first dopant and a second dopant, which are different from each other.

Meanwhile, in the description, the term "substituted or unsubstituted" may refer to a group that is unsubstituted or that is substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In some embodiments, each of the substituents may be substituted or unsubstituted. For example, a biphenyl group may be interpreted as an aryl group or a phenyl group substituted with a phenyl group.

In the description, the expression "being bonded to an adjacent group to form a ring" may mean being bonded to an adjacent group to form a substituted or unsubstituted hydrocarbon ring, or a substituted or unsubstituted heterocyclic ring. The hydrocarbon ring includes an aliphatic hydrocarbon ring and an aromatic hydrocarbon ring. The heterocyclic ring includes an aliphatic heterocyclic ring and an aromatic heterocyclic ring. A ring formed by bonding adjacent groups to each other may be a single ring or a multi-ring structure. In some embodiments, a ring formed by being bonded to an adjacent group may be linked to another ring to form a spiro structure.

In the description, the term "adjacent group" may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, two methyl groups in 1,2-dimethylbenzene may be interpreted as "adjacent groups" to each other, and two ethyl groups in 1,1-diethylcyclopentane may be interpreted as "adjacent groups" to each other.

In the description, examples of the halogen atom may include a fluorine atom, a chlorine atom, a bromine atom, and an iodine atom.

In the description, the alkyl group may be a linear, branched or cyclic alkyl group. The number of carbons (e.g., ring-forming carbon atoms) in the alkyl group may be 1 to 50, 1 to 30, 1 to 20, 1 to 10, or 1 to 6. Examples of the alkyl group may include, but are not limited to, methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldocecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-henicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc.

In the description, the alkenyl group refers to a hydrocarbon group including at least one carbon double bond at the middle and/or end of the alkyl group having two or more carbon atoms. The alkenyl group may be a linear or branched chain alkenyl group. The number of carbons may be 2 to 30, 2 to 20 or 2 to 10, but is not limited thereto. Examples of the alkenyl group include, but are not limited to, a vinyl, 1-butenyl, 1-pentenyl, 1,3-butadienyl aryl, styrenyl, styryl vinyl, etc.

In the description, the alkynyl group refers to a hydrocarbon group including at least one carbon triple bond at the middle and/or end of the alkyl group having two or more carbon atoms. The alkynyl group may be a linear or branched chain alkynyl group. The number of carbons may be 2 to 30, 2 to 20 or 2 to 10, but is not limited thereto. Specific examples of the alkynyl group may include, but are not limited to, ethynyl, propynyl, etc.

In the description, the hydrocarbon ring group may be any functional group or substituent derived from an aliphatic hydrocarbon ring, or any functional group or substituent derived from an aromatic hydrocarbon ring. The number of carbons for forming a ring of the hydrocarbon ring group may be 5 to 60, 5 to 30, or 5 to 20.

In the description, the aryl group refers to any functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15.

Examples of the aryl group may include, but are not limited to, a phenyl group, a naphthyl group, a fluorenyl group, an anthracenyl group, a phenanthryl group, a biphenyl group, a terphenyl group, a quaterphenyl group, a quinquephenyl group, a sexaphenyl group, a triphenylenyl group, a pyrenyl group, a benzofluoranthenyl group, a chrysenyl group, etc.

In the description, the heterocyclic group refers to any functional group or substituent derived from a ring including one or more selected from B, O, N, P, Si, and S as a heteroatom (e.g., a ring-forming heteroatom). The heterocyclic group includes an aliphatic heterocyclic group and an aromatic heterocyclic group. The aromatic heterocyclic group may be a heteroaryl group. The aliphatic heterocyclic ring (group) and the aromatic heterocyclic ring (group) may each independently be monocyclic or polycyclic.

In the description, the heterocyclic group may include one or more selected from B, O, N, P, Si, and S as a heteroatom. In the case where the heterocyclic group includes two or more heteroatoms, two or more heteroatoms may be the same as or different from each other. The heterocyclic group may be a monocyclic heterocyclic group or a polycyclic heterocyclic group, and may include a heteroaryl group. The number of carbons for forming a ring of the heterocyclic group may be 2 to 30, 2 to 20, or 2 to 10.

In the description, the aliphatic heterocyclic group may include one or more selected from B, O, N, P, Si, and S as a heteroatom. The number of carbons for forming a ring of the aliphatic heterocyclic group may be 2 to 30, 2 to 20, or 2 to 10. Examples of the aliphatic heterocyclic group may include, but are not limited to, oxirane group, thiirane group, pyrrolidine group, piperidine group, tetrahydrofuran group, tetrahydrothiophene group, thiane group, tetrahydropyran group, 1,4-dioxane group, etc.

In the description, the heteroaryl group may include one or more selected from B, O, N, P, Si, and S as a heteroatom. In the case where the heteroaryl group includes two or more heteroatoms, two or more heteroatoms may be the same as or different from each other. The heteroaryl group may be a monocyclic heteroaryl group or a polycyclic heteroaryl group. The number of carbons for forming a ring of the heteroaryl group may be 2 to 30, 2 to 20, or 2 to 10. Examples of the heteroaryl group may include, but are not limited to, thiophenyl, furanyl, pyrrolyl, imidazolyl, thiazolyl, oxazolyl, oxadiazolyl, triazolyl, pyridinyl, bipyridinyl, pyrimidinyl, triazinyl, acridyl, pyridazinyl, pyrazinyl, quinolinyl, quinazolinyl, quinoxalinyl, phenoxazinyl, phthalazinyl, pyrido pyrimidinyl, pyrido pyrazinyl, pyrazino pyrazinyl, isoquinolinyl, indolyl, carbazolyl, N-arylcarbazolyl, N-heteroarylcarbazolyl, N-alkylcarbazolyl, benzoxazolyl, benzoimidazolyl, benzothiazolyl, benzocarbazolyl, benzothiophenyl, dibenzothiophenyl, thienothiophenyl, benzofuranyl, phenanthrolinyl, isooxazolyl, thiadiazolyl, phenothiazinyl, dibenzosilolyl, dibenzofuranyl, etc.

In the present disclosure, the above description with respect to the aryl group may be applied to an arylene group except that the arylene group is a divalent group. The above description with respect to the heteroaryl group may be applied to a heteroarylene group except that the heteroarylene group is a divalent group.

In the description, the silyl group includes an alkyl silyl group and an aryl silyl group. Examples of the silyl group may include, but are not limited to, trimethylsilyl group, triethylsilyl group, t-butyldimethylsilyl group, vinyldimethylsilyl group, propyldimethylsilyl group, triphenylsilyl group, diphenylsilyl group, phenylsilyl group, etc.

In the description, the boryl group includes an alkyl boryl group and an aryl boryl group. Examples of the boryl group may include, but are not limited to, trimethylboryl group, triethylboryl group, t-butyldimethylboryl group, triphenylboryl group, diphenylboryl group, phenylboryl group, etc.

In the description, the carbon number of the amine group may be 1 to 30, but is not particularly limited thereto. The amine group may include an alkyl amine group, an aryl amine group, or a heteroaryl amine group. Examples of the amine group may include, but are not limited to, methylamine group, dimethylamine group, phenylamine group, diphenylamine group, naphthylamine group, 9-methyl-anthracenylamine group, triphenylamine group, etc.

In the description, the oxy group may include an alkoxy group and an aryl oxy group. The alkoxy group may be a linear, branched or cyclic chain alkoxy group. The number of carbons in the alkoxy group may be, for example, 1 to 20, or 1 to 10, but is not particularly limited thereto. Examples of the oxy group may include, but are not limited to, methoxy group, ethoxy group, n-propoxy group, isopropoxy group, butoxy group, pentyloxy group, hexyloxy group, octyloxy group, nonyloxy group, decyloxy group, benzyloxy group, etc.

In the description, the alkyl group in alkyl thio group, alkyl sulfoxy group, alkyl aryl group, alkyl amino group, alkyl boryl group, and alkyl silyl group is the same as examples of the alkyl group described above.

In the description, the aryl group in aryl oxy group, aryl thio group, aryl sulfoxy group, aryl amino group, aryl boron group, and aryl silyl group is the same as examples of the aryl group described above.

In the description, the direct linkage may mean a single bond.

Meanwhile, in the description

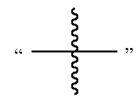

or "—*" means the position to be linked (e.g., a binding site).

In the description, "atoms for forming a ring" may refer to ring-forming atoms.

The emission layer EML of the organic electroluminescence device 10 of an embodiment may include a first host containing a carbazole group derivative, a second host containing at least one cyano group or a triazine derivative, a first dopant containing an organic metal complex including Ir, Ru, Rh, Pt, Pd, Cu, or Os as a central metal atom, and a second dopant represented by Formula D-2 below:

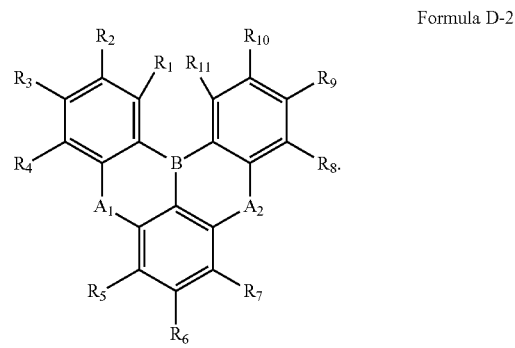

Formula D-2

In Formula D-2 above, $A_1$ and $A_2$ may each independently be $NR_m$ or O, and $R_m$ may be a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group of 2 to 30 carbon atoms for forming a ring. In Formula D-2, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and any of $R_1$ to $R_{11}$ may be combined with an adjacent group to form a ring.

For example, in Formula D-2, $R_1$ to $R_{11}$ may each independently be a hydrogen atom, a substituted or unsubstituted phenyl group, a substituted or unsubstituted carbazole group, a substituted or unsubstituted aryloxy group, a substituted or unsubstituted alkoxy group, a substituted or unsubstituted alkyl boryl group, or a substituted or unsubstituted aryl boryl group.

In Formula D-2, $R_9$ and $R_{10}$ may be combined with each other to form a heterocyclic ring. A fused heterocyclic ring which is formed by $R_9$ and $R_{10}$ being combined with each other may include B, O, N, and/or the like as a heteroatom. Furthermore, the fused heterocyclic ring may be substituted or unsubstituted with a substituted or unsubstituted aryl group or a substituted or unsubstituted heteroaryl group.

The second dopant represented by Formula D-2 may be a fluorescence dopant. The second dopant may be a blue luminescence material.

The emission layer EML in the organic electroluminescence device 10 of an embodiment may include a compound represented by Formula H-1 below as a first host.

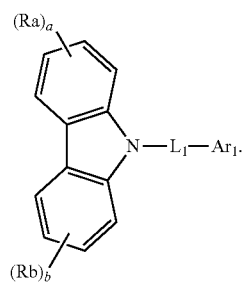

Formula H-1

In Formula H-1, $L_1$ may be a direct linkage, a substituted or unsubstituted arylene group having 6 to 30 carbon atoms for forming a ring, or a substituted or unsubstituted heteroarylene group having 2 to 30 carbon atoms for forming a ring. In some embodiments, $Ar_1$ may be a substituted or unsubstituted aryl group having 6 to 30 carbon atoms for forming a ring, or a substituted or unsubstituted heteroaryl group having 2 to 30 carbon atoms for forming a ring.

In Formula H-1, a and b may be each independently an integer of 0 to 4, and $R_a$ and $R_b$ may be a substituted or unsubstituted aryl group having 6 to 30 carbon atoms for forming a ring, or a substituted or unsubstituted heteroaryl group having 2 to 30 carbon atoms for forming a ring. Meanwhile, when a and b are each independently an integer of 2 or more, a plurality of $R_a$'s and a plurality of $R_b$'s may be the same or at least one thereof may be different. For example, in Formula H-1, a and b may be 0. In this case, the carbazole group corresponds to an unsubstituted one.

In Formula H-1, $L_1$ may be a direct linkage, a divalent biphenyl group, a divalent carbazole group, etc., but embodiments are not limited thereto. Furthermore, $Ar_1$ may be a substituted or unsubstituted carbazole group, a substituted or unsubstituted dibenzofuran group, a substituted or unsubstituted dibenzothiophene group, a substituted or unsubstituted biphenyl group, etc., but embodiments are not limited thereto.

The emission layer in the organic electroluminescence device 10 of an embodiment may include a compound represented by Formula H-2 below as a second host.

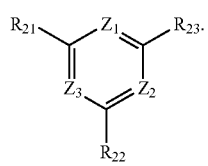

Formula H-2

In Formula H-2, $Z_1$ to $Z_3$ may each independently be $CR_y$ or N, and $R_y$ and $R_{21}$ to $R_{23}$ may be a hydrogen atom, a deuterium atom, a cyano group, a substituted or unsubstituted silyl group, a substituted or unsubstituted aryl group having 6 to 30 carbon atoms for forming a ring, or a substituted or unsubstituted heteroaryl group having 2 to 30 carbon atoms for forming a ring.

For example, Formula H-2 may be represented by Formula H-2a or Formula H-2b below.

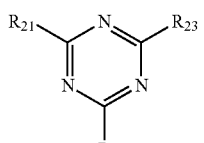

Formula H-2a

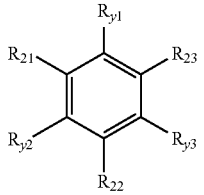

Formula H-2b

In Formula H-2a and Formula H-2b, $R_{21}$ to $R_{23}$ may each independently be a hydrogen atom, a deuterium atom, a cyano group, a substituted or unsubstituted silyl group, a substituted or unsubstituted aryl group having 6 to 30 carbon atoms for forming a ring, or a substituted or unsubstituted heteroaryl group having 2 to 30 carbon atoms for forming a ring.

Further, in Formula H-2b, $R_{y1}$ to $R_{y3}$ may each independently be a hydrogen atom, a deuterium atom, a cyano group, a substituted or unsubstituted silyl group, a substituted or unsubstituted aryl group having 6 to 30 carbon atoms for forming a ring, or a substituted or unsubstituted heteroaryl group having 2 to 30 carbon atoms for forming a ring. In some embodiments, in Formula H-2b, at least one selected from $R_{21}$ to $R_{23}$ and $R_{y1}$ to $R_{y3}$ may be a cyano group, an aryl group which has 6 to 30 carbon atoms for forming a ring and which includes at least one cyano group as a substituent, or a heteroaryl group which has 2 to 30 carbon atoms for forming a ring and which includes at least one cyano group as a substituent.

For example, the second host represented by Formula H-2a may include a triazine moiety, and the second host represented by Formula H-2b may include at least one cyano group.

In Formula H-2a, $R_{21}$ to $R_{23}$ may each independently be a substituted or unsubstituted phenyl group, a substituted or unsubstituted carbazole group, and/or the like, but embodiments are not limited thereto.

In Formula H-2b, any one selected from $R_{21}$ to $R_{23}$ and $R_{y1}$ to $R_{y3}$ may be substituted with a cyano group, or with a heteroaryl group that has 2 to 30 carbon atoms for forming a ring and in which at least one selected from $R_{21}$ to $R_{23}$ and $R_{y1}$ to $R_{y3}$ has a cyano group substituent. A heteroaryl group which has 2 to 30 carbon atoms for forming a ring and which is substituted with at least one cyano group may further include a substituent in addition to the cyano group, and the substituent may be a substituted or unsubstituted silyl group, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring.

The organic electroluminescence device 10 of an embodiment may include both of the first host represented by Formula H-1 and the second host represented by Formula H-2 in the emission layer EML, and may include a first dopant and a second dopant described below in the emission layer EML, to exhibit excellent (or suitable) luminous efficiency and long service life characteristics.

The first host from among the two host materials both included in the emission layer EML may be a hole transporting host, and the second host may be an electron transporting host. The organic electroluminescence device 10 of an embodiment may include the first host, which has hole transport characteristics, and the second host, which has electron transport characteristics, to efficiently (or suitably) deliver energy to dopant compounds described below.

The emission layer EML may include, as a first dopant, an organic metal complex containing Ir, Ru, Rh, Pt, Pd, Cu, or Os as a central metal atom, and ligands linked to the central metal atom.

The first dopant may be represented by Formula D-1a or Formula D-1b below:

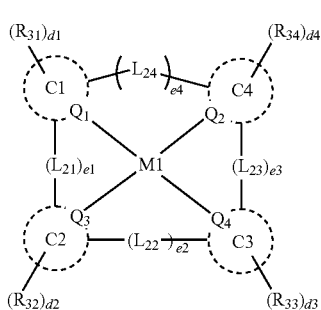

Formula D-1a

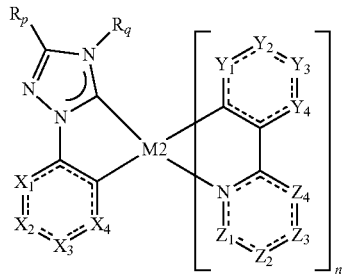

Formula D-1b

In Formula D-1a, M1, a central metal atom, may be Pt, Pd, Cu, or Os. $Q_1$ to $Q_4$ may each independently be C or N, and C1 to C4 may each independently be a substituted or unsubstituted hydrocarbon ring having 5 to 30 carbon atoms for forming a ring, or a substituted or unsubstituted heterocyclic ring having 2 to 30 carbon atoms for forming a ring.

Further, in Formula D-1a, $L_{21}$ to $L_{24}$ may each independently be a direct linkage, *—O—*, *—S—*,

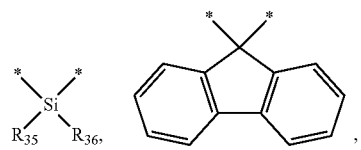

a substituted or unsubstituted divalent alkyl group having 1 to 20 carbon atoms, a substituted or unsubstituted arylene group having 6 to 30 carbon atoms for forming a ring, or a substituted or unsubstituted heteroarylene group having 2 to 30 carbon atoms for forming a ring, and e1 to e4 may be each independently 0 or 1.

$R_{31}$ to $R_{36}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{31}$ to $R_{36}$ may be combined with an adjacent group to form a ring, and d1 to d4 may be each independently an integer of 0 to 4.

In Formula D-1a, C1 to C4 may each independently be a substituted or unsubstituted hydrocarbon ring, or a substituted or unsubstituted heterocyclic ring represented by any one selected from C-1 to C-3 below:

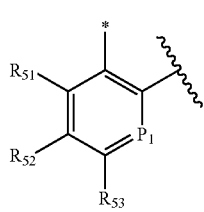

C-1

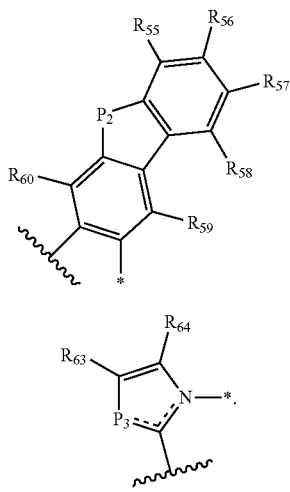

In C-1 to C-3, $P_1$ may be C—* or $CR_{54}$, $P_2$ may be N—* or $NR_{61}$, and $P_3$ may be N—* or $NR_{62}$. $R_{51}$ to $R_{64}$ may each independently be a substituted or unsubstituted alkyl group having 1 to 20 carbon atoms, a substituted or unsubstituted aryl group having 6 to 30 carbon atoms for forming a ring, or a substituted or unsubstituted heteroaryl group having 6 to 30 carbon atoms for forming a ring, and any of $R_{51}$ to $R_{64}$ may be combined with an adjacent group to form a ring.

In some embodiments, in C-1 to C-3,

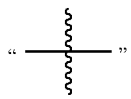

corresponds to a part linked with M1 that is a central metal atom in Formula D-1a, and "—*" corresponds to a part linked with a neighboring cyclic group (C1 to C4) or linker ($L_{21}$ to $L_{24}$).

For example, Formula D-1a may be represented by Formula D-1a-1 below:

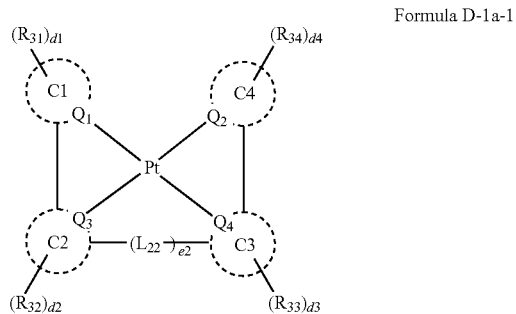

Formula D-1a-1

In Formula D-1a-1, the same descriptions as those in Formula D-1a above may be applied with regard to C1 to C4, $Q_1$ to $Q_4$, $R_{31}$ to $R_{34}$, d1 to d4, $L_{22}$, and e2.

In Formula D-1b above, M2 may be Ir, Ru, or Rh, n may be 1 or 2, and $X_1$ to $X_4$, $Y_1$ to $Y_4$, and $Z_1$ to $Z_4$ may be each independently $CR_n$ or N. In some embodiments, $R_p$, $R_q$, and $R_n$ may each independently be a hydrogen atom, a deuterium atom, a halogen atom, a cyano group, a substituted or unsubstituted alkyl group having 1 to 20 carbon atoms, a substituted or unsubstituted hydrocarbon ring having 5 to 30 carbon atoms for forming a ring, a substituted or unsubstituted heterocyclic ring having 2 to 30 carbon atoms for forming a ring, or a substituted or unsubstituted amine group, and any of $R_p$, $R_q$, and $R_n$ may be combined with an adjacent group to form a ring.

For example, in Formula D-1b, a hexagon ring including $X_1$ to $X_4$, $Y_1$ to $Y_4$, or $Z_1$ to $Z_4$ as atoms for forming a ring may each independently be a substituted or unsubstituted benzene ring, a substituted or unsubstituted pyridine ring, a substituted or unsubstituted pyrimidine ring, or a substituted or unsubstituted triazine ring.

Formula D-1b may be represented by Formula D-1b-1 below:

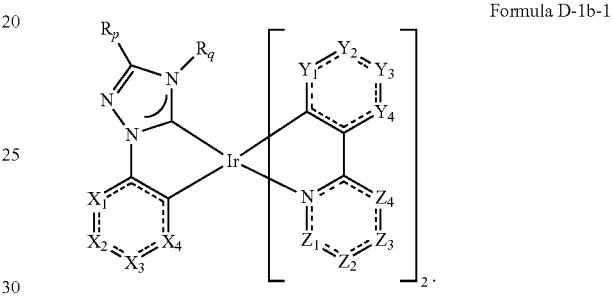

Formula D-1b-1

In Formula D-1b-1, the same descriptions those in Formula D-1b above may be applied with regard to $X_1$ to $X_4$, $Y_1$ to $Y_4$, $Z_1$ to $Z_4$, $R_p$, and $R_q$.

The first dopant represented by Formula D-1a or Formula D-1b described above may be a phosphorescence dopant.

The organic electroluminescence device 10 of an embodiment may include, in the emission layer EML, the second dopant represented by Formula D-2, as well as the first dopant represented by Formula D-1a or Formula D-1 b described above. For example, the organic electroluminescence device 10 of an embodiment may include the first dopant and the second dopant simultaneously (or concurrently) to exhibit excellent (or suitable) luminous efficiency and improved device service life characteristics.

The second dopant represented by Formula D-2 may be represented by any one selected from Formula D-2a to Formula D-2d below:

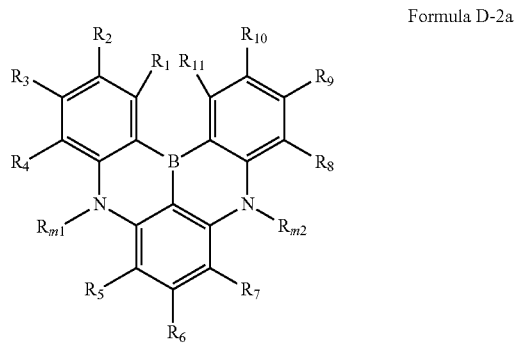

Formula D-2a

Formula D-2b

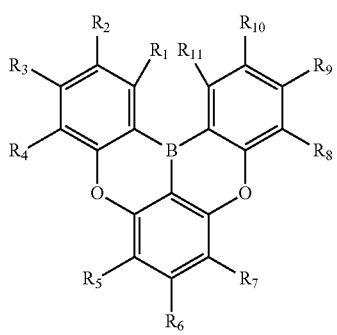

Formula D-2c

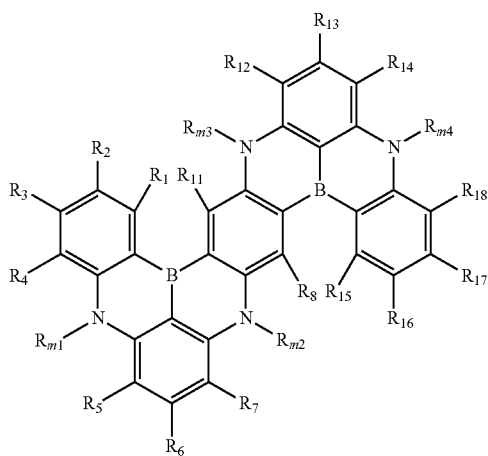

Formula D-2d

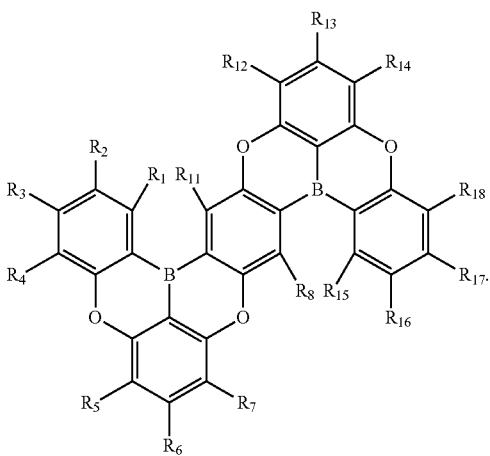

In Formula D-2a to Formula D-2d, $R_{m1}$ to $R_{m4}$ may each independently be a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. In some embodiments, $R_1$ to $R_{18}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and any of $R_1$ to $R_{18}$ may be combined with an adjacent group to form a ring.

For example, $R_{m1}$ to $R_{m4}$ may each independently be a hydrogen atom or a substituted or unsubstituted phenyl group. In some embodiments, $R_1$ to $R_{18}$ may each independently be a hydrogen atom, an alkyl group having 1 to 10 carbon atoms, a substituted or unsubstituted phenyl group, a substituted or unsubstituted carbazole group, or a substituted or unsubstituted arylamine group having 6 to 20 carbon atoms for forming a ring. However, embodiments are not limited thereto.

The lowest triplet exciton energy level (T1 level) of the first dopant may be higher than the lowest triplet exciton energy level (T1 level) of the second dopant. In an embodiment, the first dopant may serve as an assistant dopant, which delivers energy of the first host and the second host to the second dopant. Further, the second dopant may be a luminescence dopant, which emits light by being excited with energy delivered from the first host, the second host, and the first dopant.

In an embodiment, the second dopant may be a thermally activated delayed fluorescence (TADF) dopant. For example, in an embodiment, because the second dopant has $k_{RISC}$ (reverse intersystem crossing) of $10^3 S^{-1}$ or more, or f (oscillation strength) of 0.1 or more, the thermally activated delayed fluorescence may occur relatively easily.

In an embodiment, the second dopant may be a luminescence dopant which emits blue light, and the emission layer EML may emit a fluorescence. In some embodiments, more particularly, the emission layer EML may emit blue light through the thermally activated delayed fluorescence.

In an embodiment, the first dopant serving as the assistant dopant may accelerate a delayed fluorescence of the second dopant. Therefore, the emission layer of an embodiment may improve luminous efficiency. In some embodiments, when the delayed fluorescence is accelerated, an exciton formed in the emission layer is not accumulated inside the emission layer and emits light rapidly, and thus deterioration of the device may be reduced. Therefore, service life of the organic electroluminescence device 10 of an embodiment may be increased.

The emission layer EML in the organic electroluminescence device 10 of an embodiment may include all of the first host, the second host, the first dopant, and the second dopant described above, and, with respect to the total weight of the first host, the second host, the first dopant, and the second dopant, the content of the first dopant may be about 10 wt % to about 15 wt %, and the content of the second dopant may be about 1 wt % to about 5 wt %.

When the contents of the first dopant and the second dopant satisfy the above-described proportion ranges, the first dopant may efficiently (or suitably) deliver energy to the second dopant, and therefore luminous efficiency and device service life may be increased.

The contents of the first host and the second host in the emission layer EML may be contents not including the weights of the first dopant and the second dopant described above. For example, the contents of the first host and the second host in the emission layer EML may be about 80 wt % to about 89 wt % with respect to the total weight of the first host, the second host, the first dopant, and the second dopant. In the total weight of the first host and the second host, the weight ratio of the first host and the second host may be about 3:7 to about 7:3.

When the contents of the first dopant and the second dopant satisfy the above-described ratios, charge balance characteristics in the emission layer EML are improved, and thus luminous efficiency and device service life may be increased. When the contents of the first dopant and the second dopant deviate from the above-described ratio range, a charge balance in the emission layer EML may be broken, and thus luminous efficiency may be reduced and the device may be easily deteriorated.

When the contents of the first host, the second host, the first dopant, and the second dopant included in the emission layer EML satisfy the above-described ratio range, excellent (or suitable) luminous efficiency and long service life may be achieved.

In the organic electroluminescence device 10 of an embodiment, the emission onset energy relationship between the first host, the second host, the first dopant, and the second dopant may satisfy Equation 1 below. Further, the absorption onset energy of the second dopant may be higher than the emission onset energy of each of the first host and the second host.

The emission onset energy of each of the first host and the second host≥The emission onset energy of the first dopant≥The emission onset energy of the second dopant  Equation 1

The emission onset wavelengths of the first host and the second host may be 380 nm to 430 nm, and the emission onset wavelength of the first dopant may be 400 nm to 450 nm. In some embodiments, the absorption onset wavelength of the second dopant may be 420 nm to 470 nm, and the emission onset wavelength thereof may be 410 nm to 460 nm.

The organic electroluminescence device 10 of an embodiment may include all of the first host, the second host, the first dopant, and the second dopant, and the emission layer EML may include the combination of two host materials and two dopant materials.

For example, the organic electroluminescence device 10 of an embodiment may include the first host represented by Formula H-1, the second host represented by Formula H-2a, and Pt as a central metal atom, and may include the first dopant represented by Formula D-1a and the second dopant represented by Formula D-2 in the emission layer EML. The organic electroluminescence device 10 of an embodiment may include the first host represented by Formula H-1, the second host represented by Formula H-2a, and Ir as a central metal atom in the emission layer EML, and may include the first dopant represented by Formula D-1b and the second dopant represented by Formula D-2.

Further, the organic electroluminescence device 10 of an embodiment may include the first host represented by Formula H-1, the second host represented by Formula H-2b, and Pt as a central metal atom, and may include the first dopant represented by Formula D-1a and the second dopant represented by Formula D-2 in the emission layer EML. The organic electroluminescence device 10 of an embodiment may include the first host represented by Formula H-1, the second host represented by Formula H-2b, and Ir as a central metal atom in the emission layer EML, and may include the first dopant represented by Formula D-1b and the second dopant represented by Formula D-2.

That is, in view of the above, the first dopant represented by formula D-1a may contain "Pt" as the central metal atom, and the first dopant represented by formula D-1b may contain "Ir" as the central metal atom.

In an embodiment, the first host represented by Formula H-1 may be represented by any one selected from the compounds represented by Compound Group 1 below. The emission layer EML may include at least one selected from the compounds represented by Compound Group 1 as the first host material.

Compound Group 1

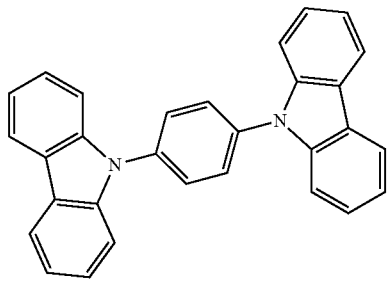

HT-01

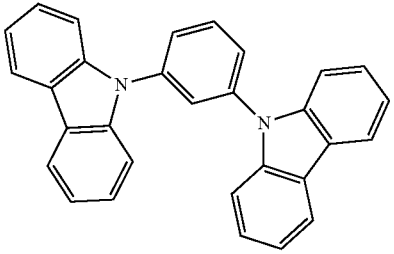

HT-02

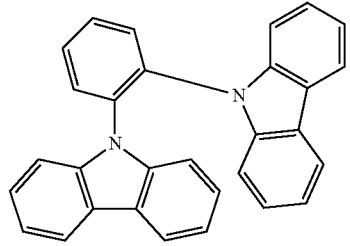

HT-03

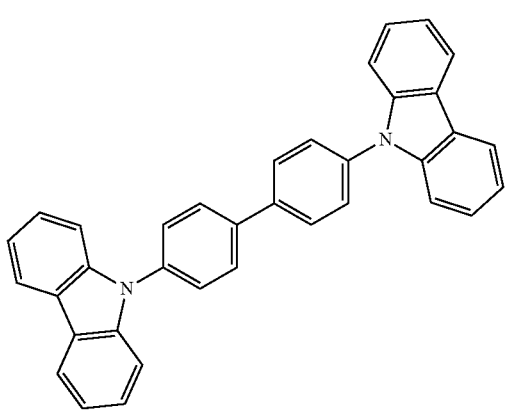

HT-04

HT-05
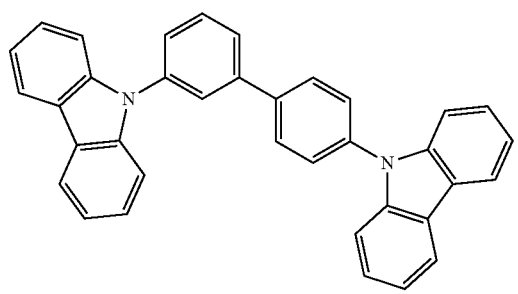
HT-06
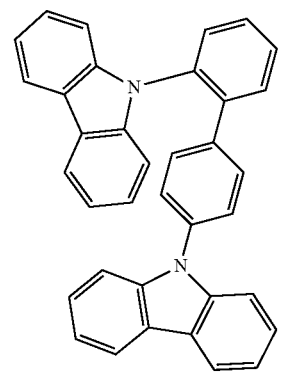
HT-07
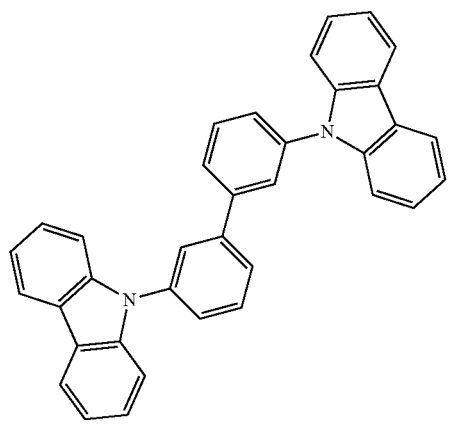
HT-08
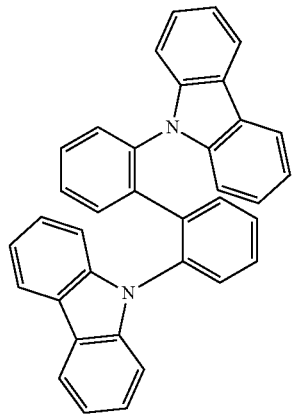
HT-09
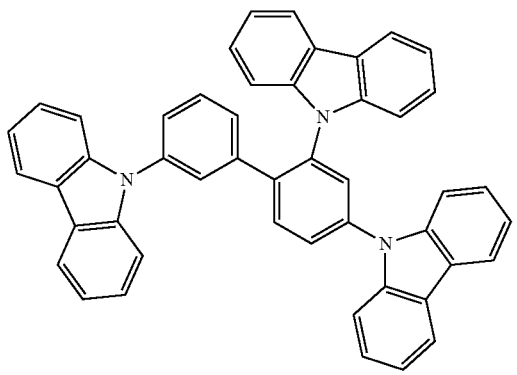
HT-10
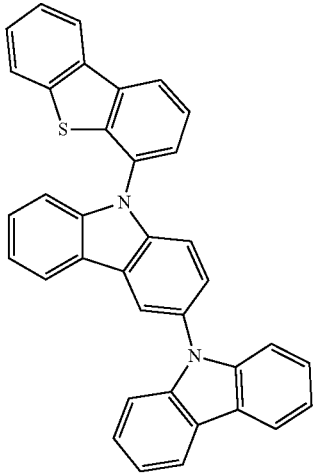
HT-11
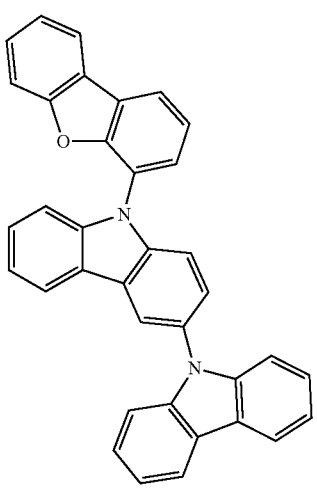

HT-12
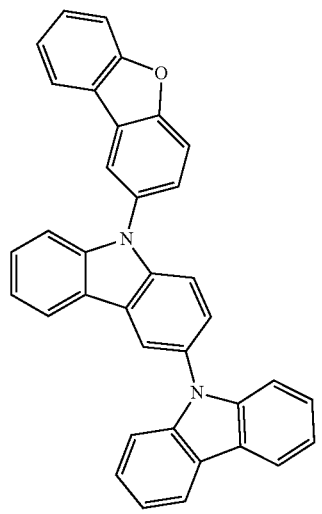
HT-13
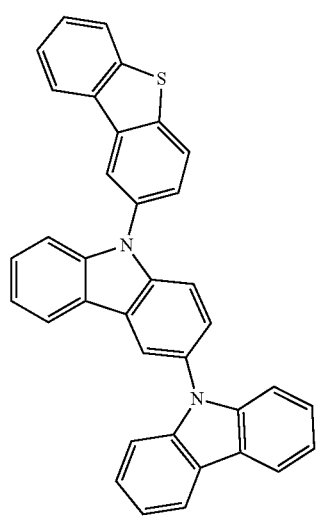
HT-14
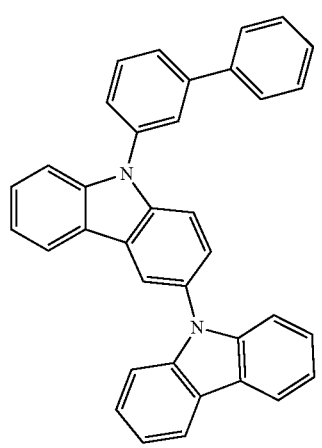
HT-15
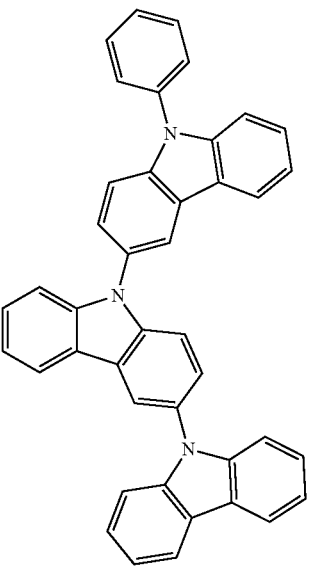
HT-16
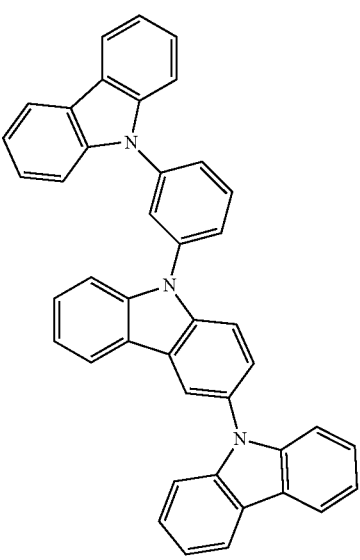
HT-17
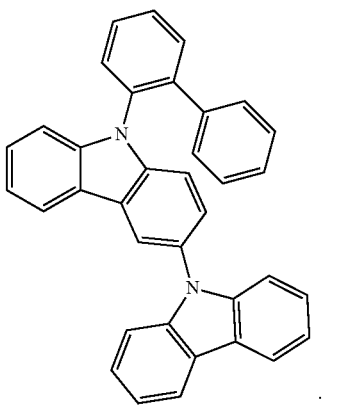
In an embodiment, the second host represented by Formula H-2 may be represented by any one selected from the compounds represented by Compound Group 2-1 and Compound Group 2-2 below. The emission layer may include at least one selected from the compounds represented by Compound Group 2-1 and Compound Group 2-2 below. Compound Group 2-1 may be for the second host material represented by Formula H-2a, and Compound Group 2-2 may be for the second host material represented by Formula H-2b.
Compound Group 2-1
ET1-1
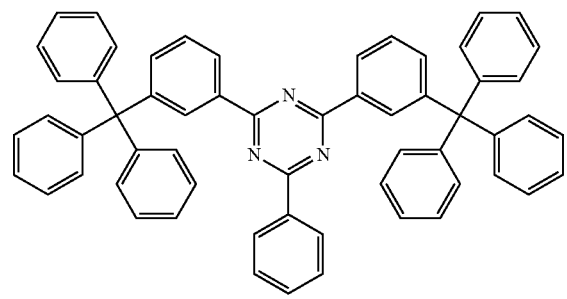
ET1-2
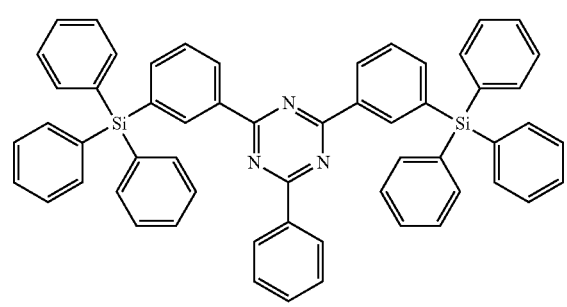
ET1-3
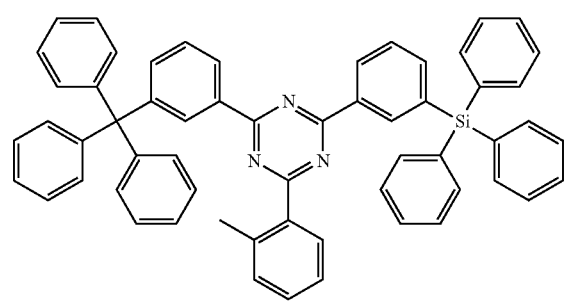
ET1-4
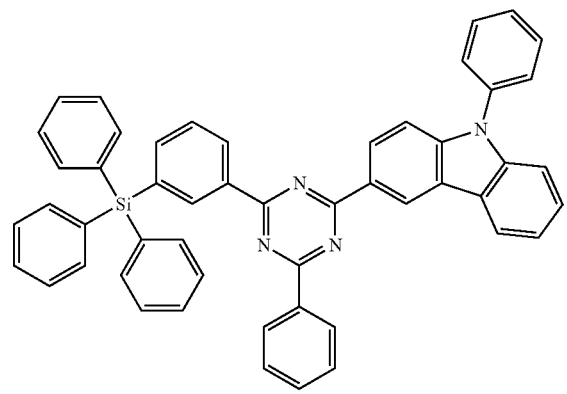
-continued
ET1-5
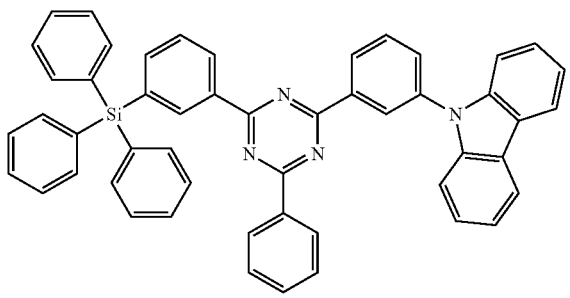
ET1-6
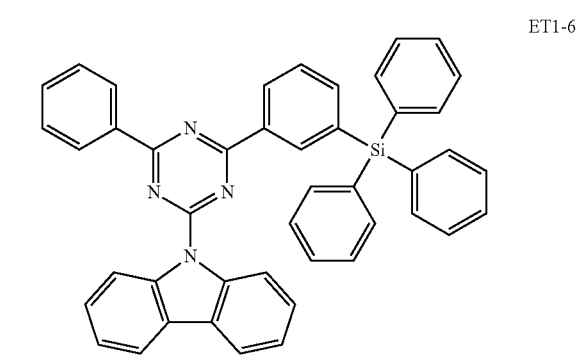
ET1-7
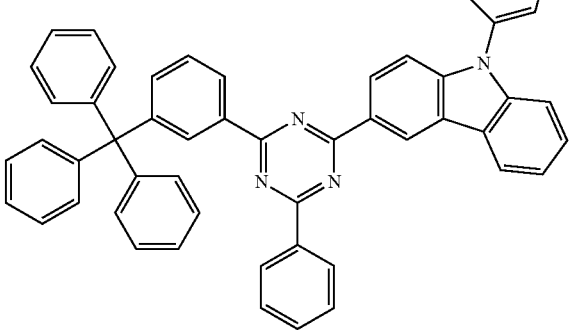
ET1-8
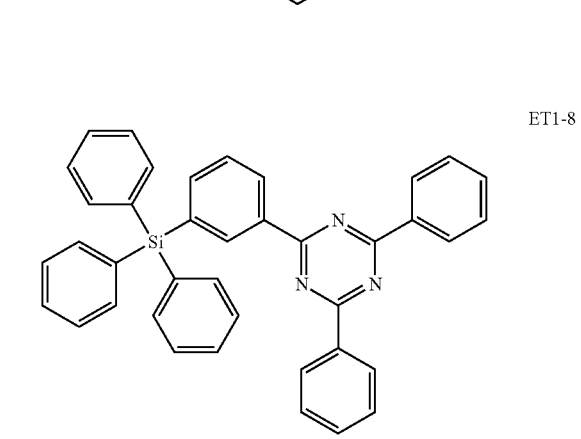

-continued
ET1-9
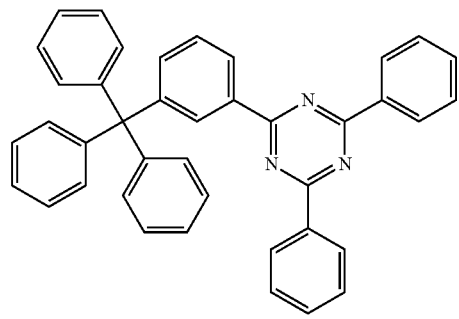
ET1-10
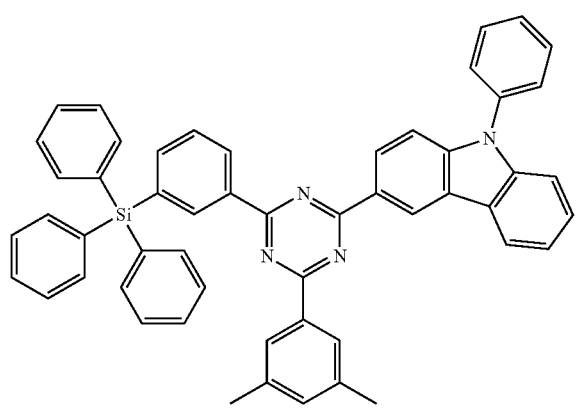
ET1-11
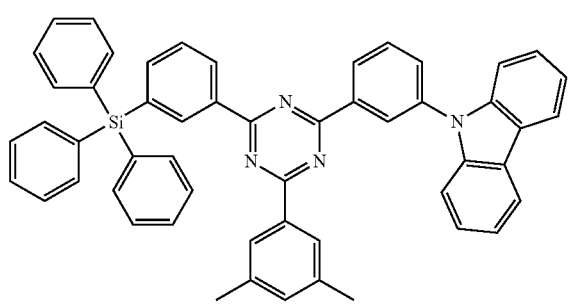
ET1-12
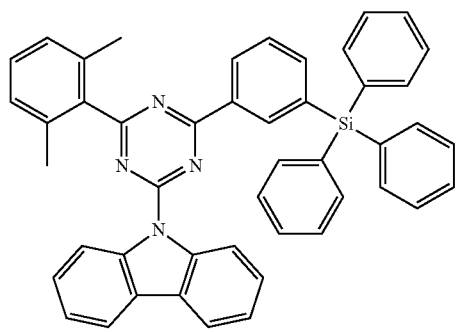
-continued
ET1-13
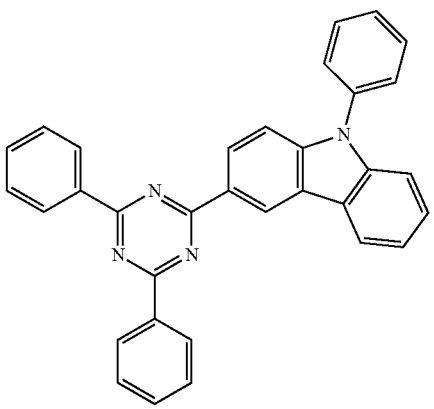
ET1-14
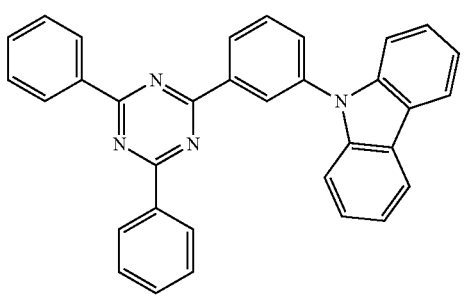
ET1-15
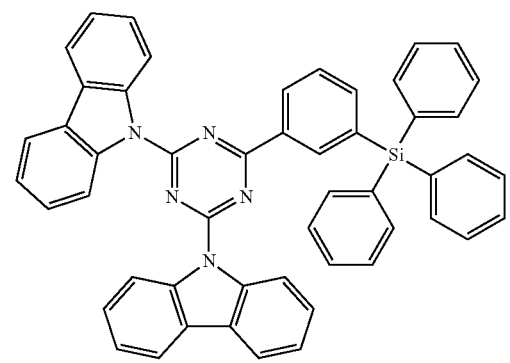

Compound Group 2-2
ET2-1
ET2-2
ET2-3
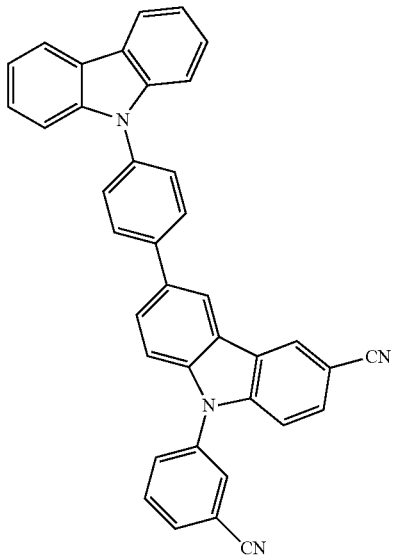
ET2-4
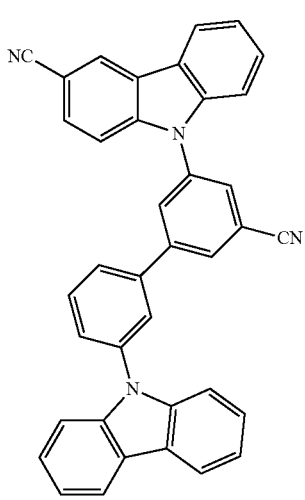
ET2-5
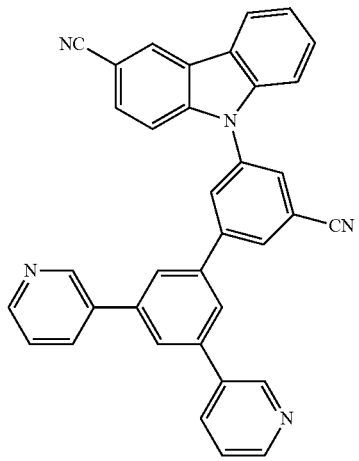

ET2-6
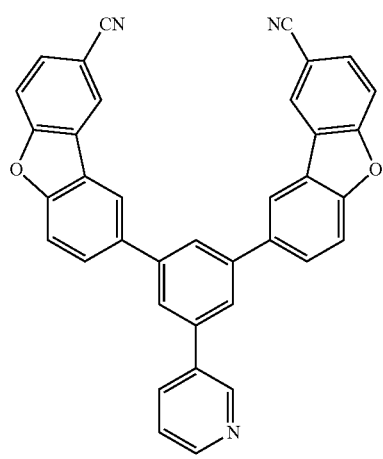
ET2-7
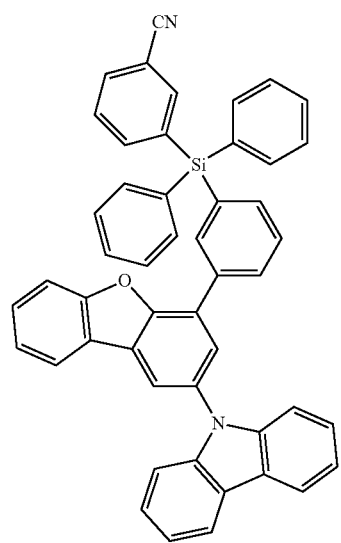
ET2-8
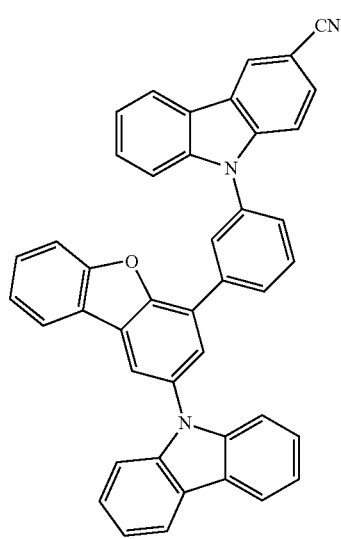
ET2-9
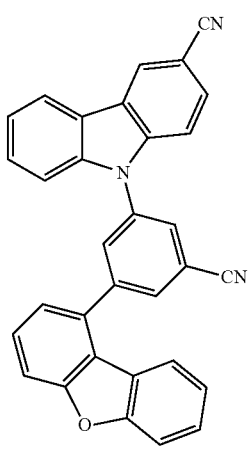
ET2-10
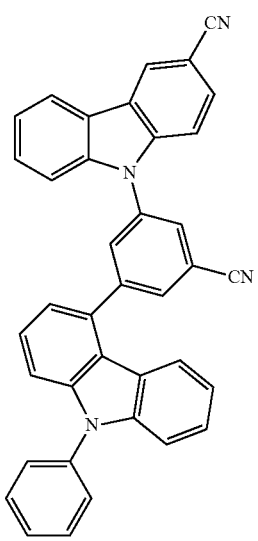
ET2-11
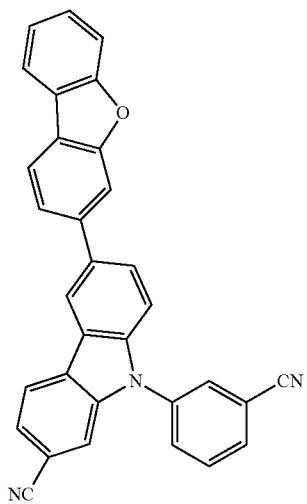

-continued

ET2-12

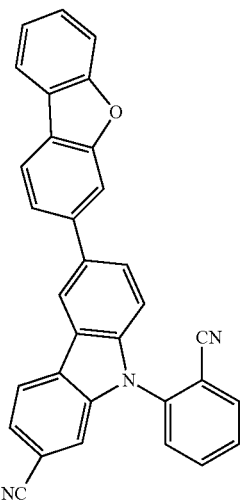

In an embodiment, the emission layer EML may include, as a first dopant material, at least one selected from the compounds represented by Compound Group 3-1 and Compound Group 3-2 below. Compound Group 3-1 may be for the first dopant material represented by Formula D-1a, and Compound Group 3-2 may be for first dopant material represented by Formula D-1 b.

Compound Group 3-1

AD1-1

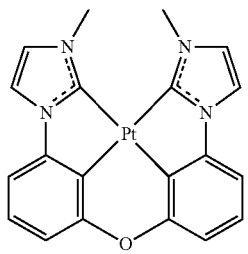

AD1-2

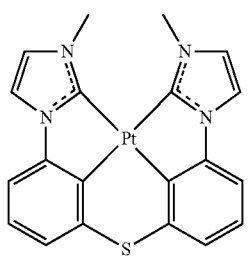

AD1-3

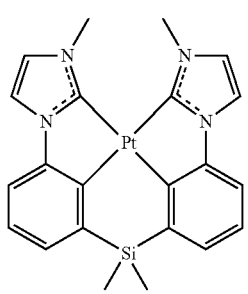

-continued

AD1-4

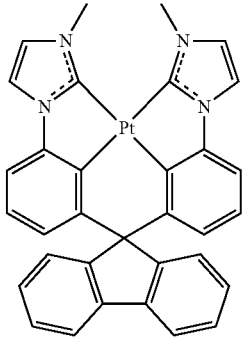

AD1-5

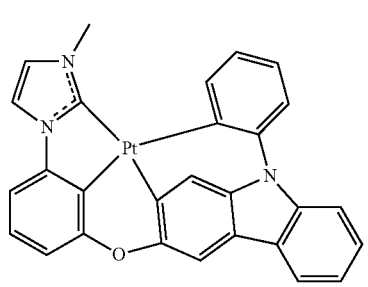

AD1-6

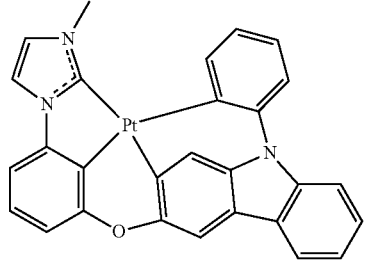

AD1-7

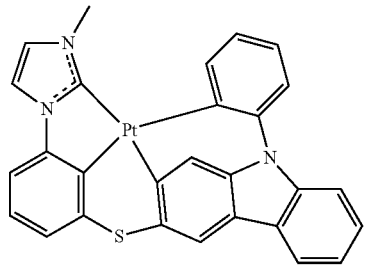

AD1-8

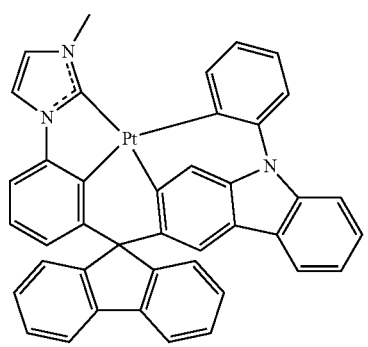

AD1-9
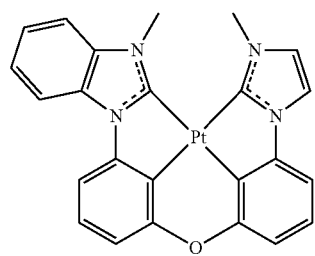
AD1-10
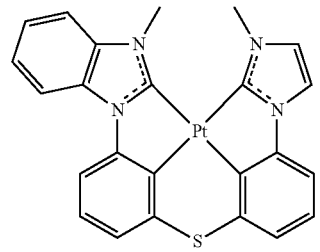
AD1-11
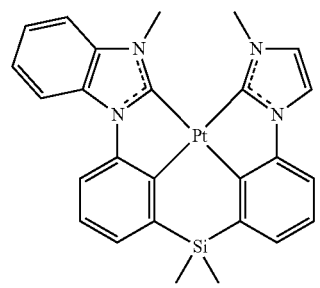
AD1-12
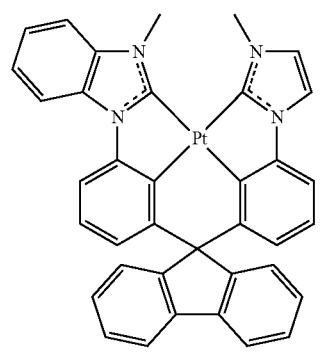
AD1-13
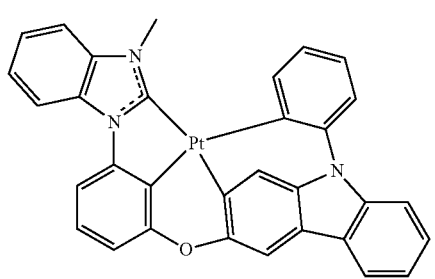
AD1-14
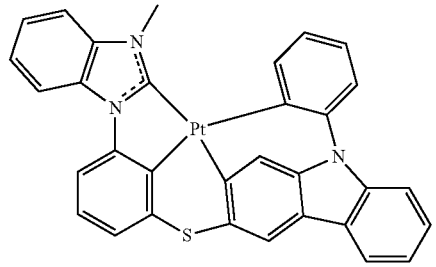
AD1-15
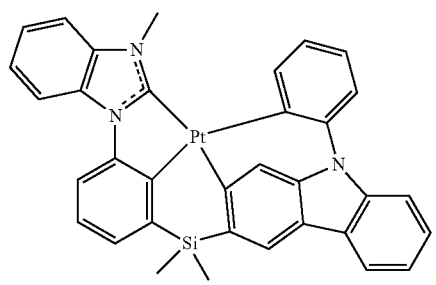
AD1-16
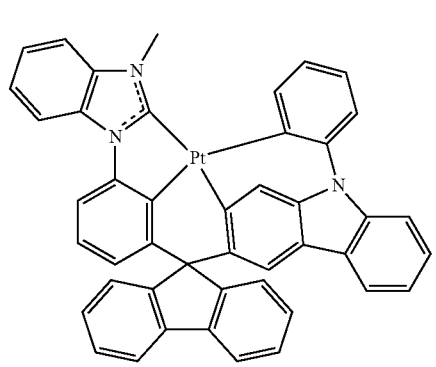
AD1-17
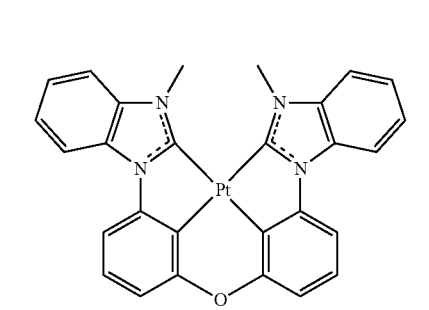
AD1-18
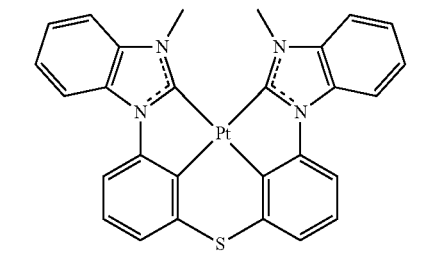

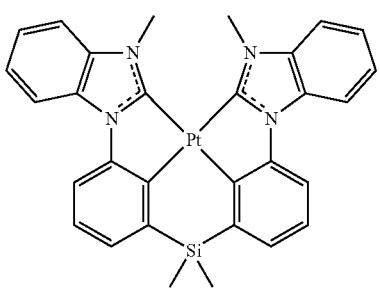
AD1-19
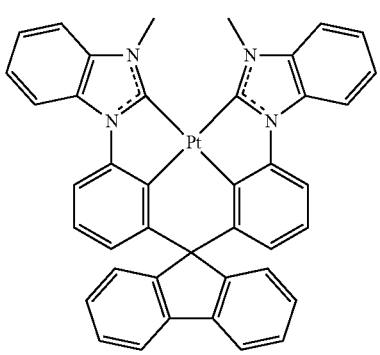
AD1-20
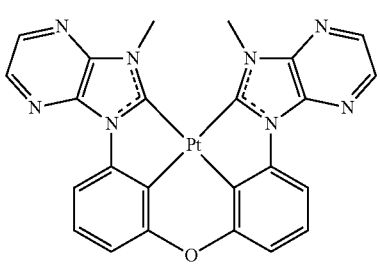
AD1-21
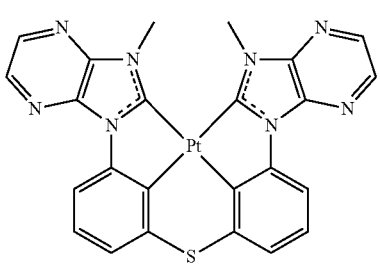
AD1-22
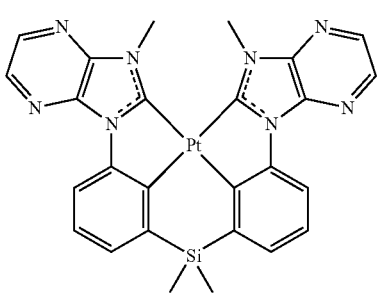
AD1-23
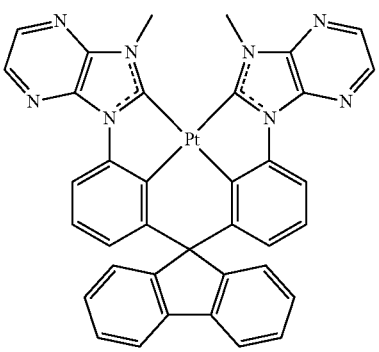
AD1-24
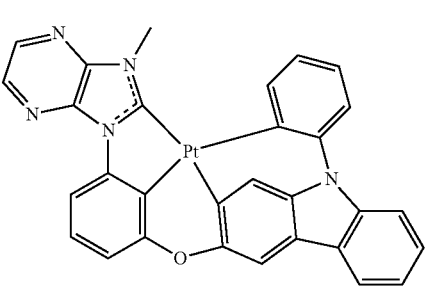
AD1-25
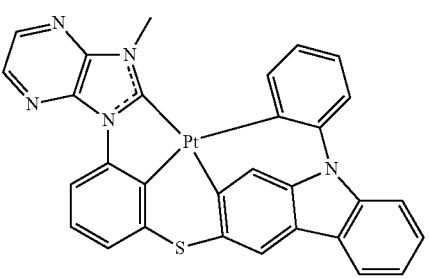
AD1-26
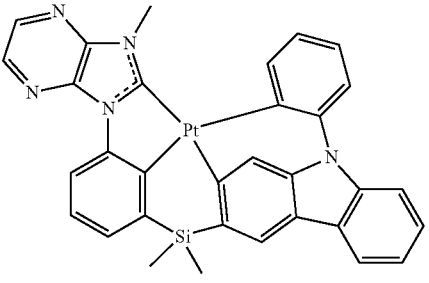
AD1-27
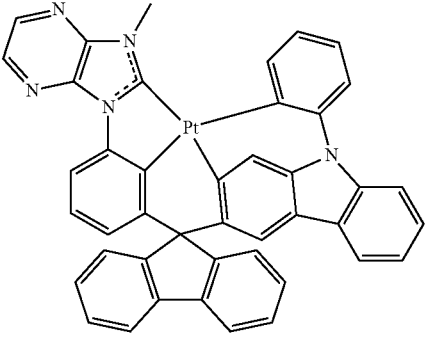
AD1-28

-continued
AD1-29
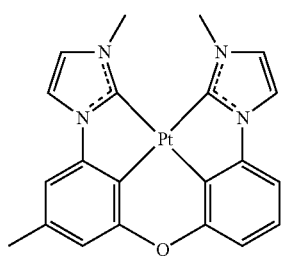
AD1-30
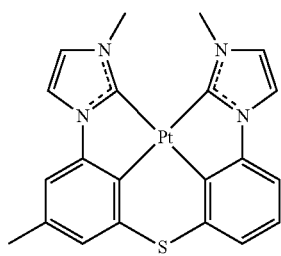
AD1-31
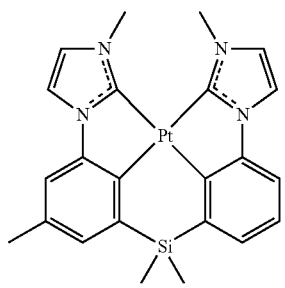
AD1-32
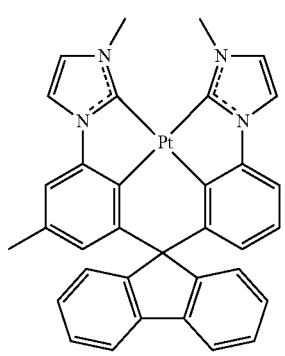
AD1-33
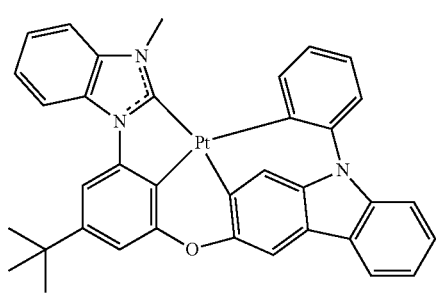
-continued
AD1-34
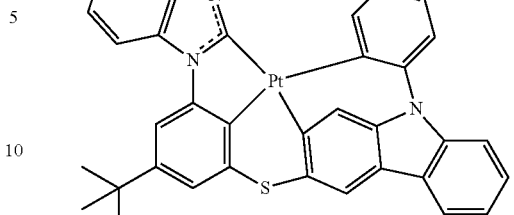
AD1-35
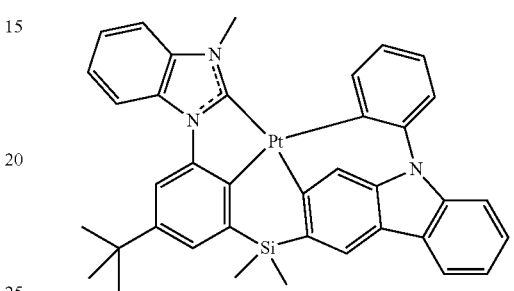
AD1-36
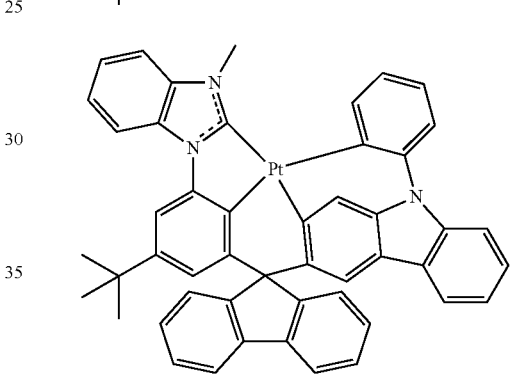
Compound Group 3-2
AD2-1
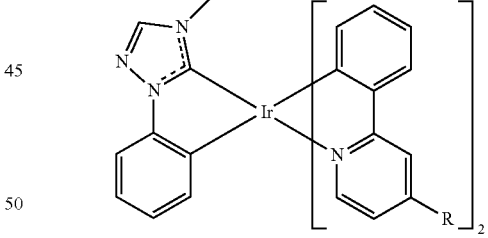
AD2-2
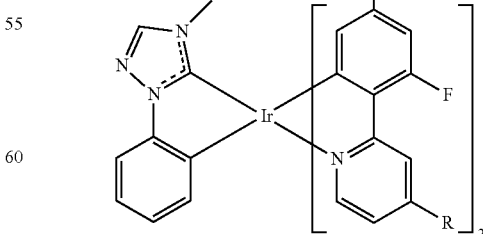

AD2-3
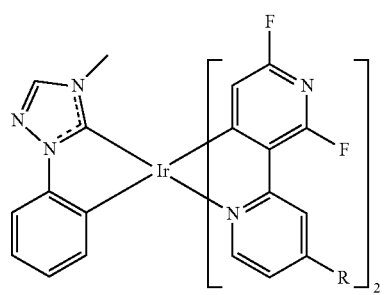
AD2-4
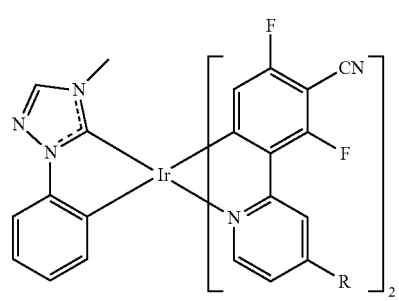
AD2-5
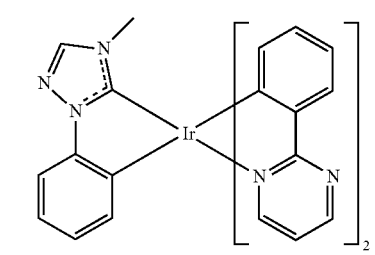
AD2-6
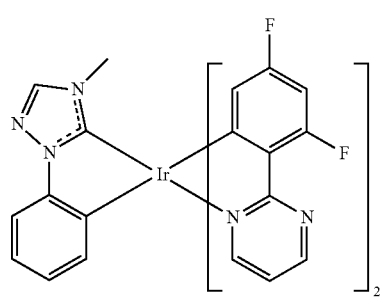
AD2-7
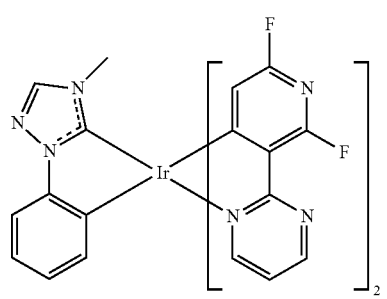
AD2-8
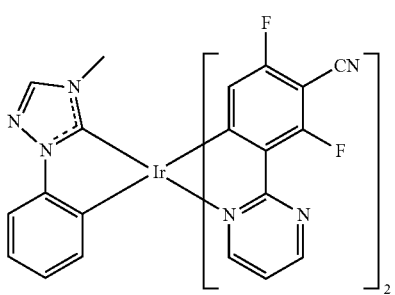
AD2-9
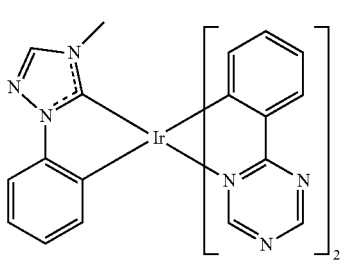
AD2-10
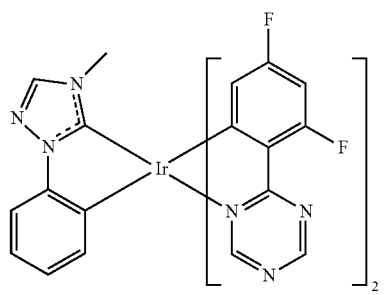
AD2-11
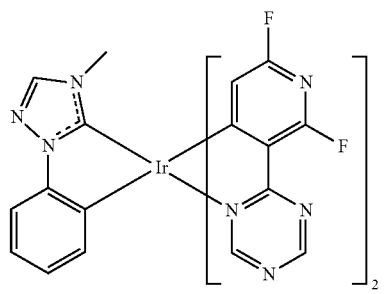
AD2-12
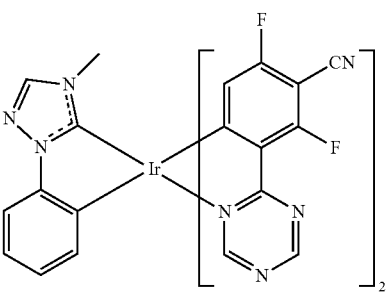

AD2-13
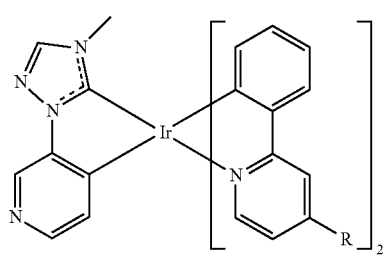
AD2-14
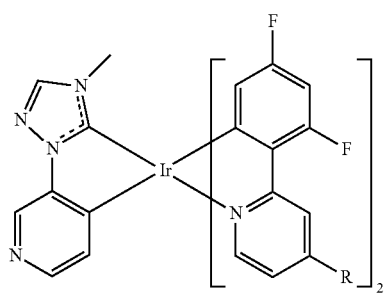
AD2-15
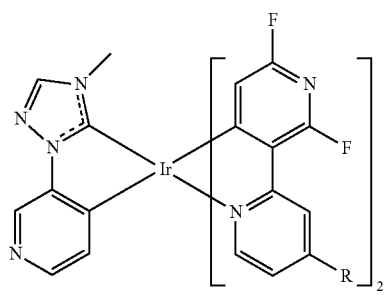
AD2-16
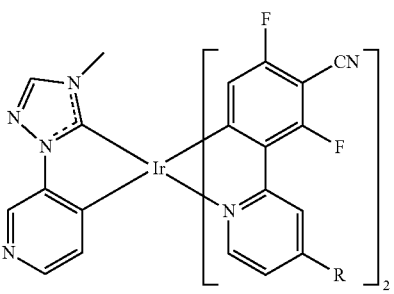
AD2-17
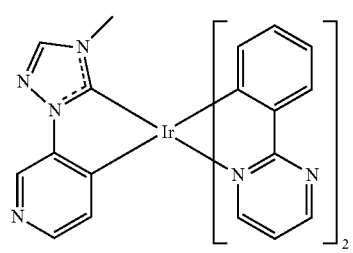
AD2-18
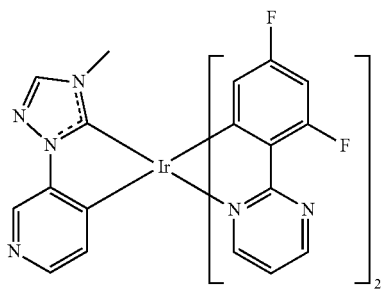
AD2-19
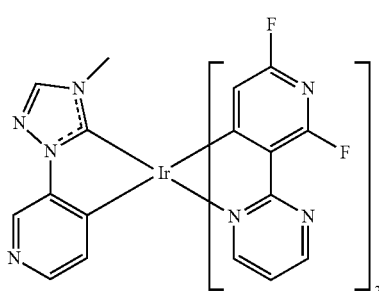
AD2-20
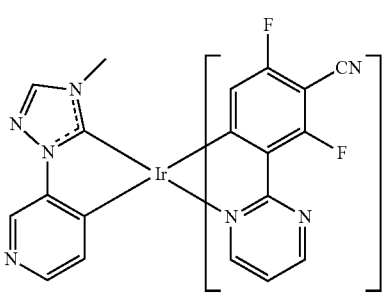
AD2-21
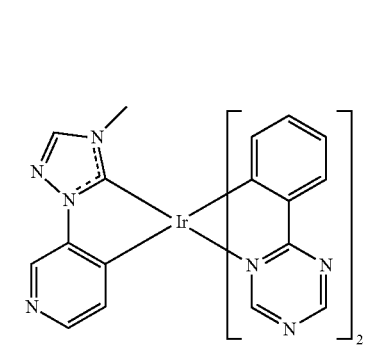
AD2-22
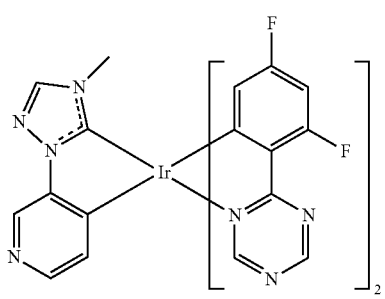

AD2-23
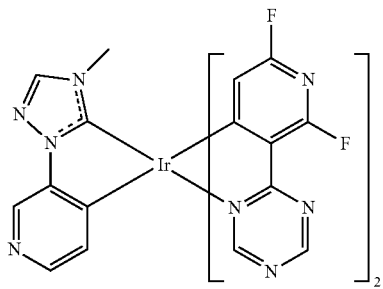
AD2-24
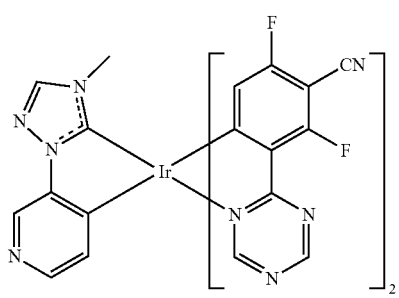
AD2-25
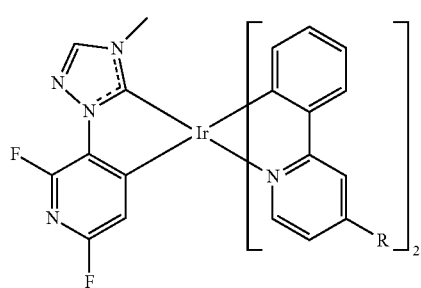
AD2-26
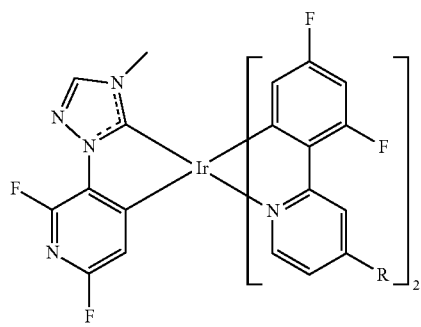
AD2-27
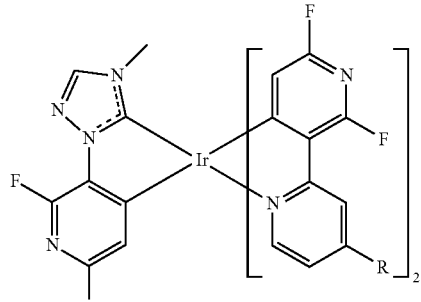
AD2-28
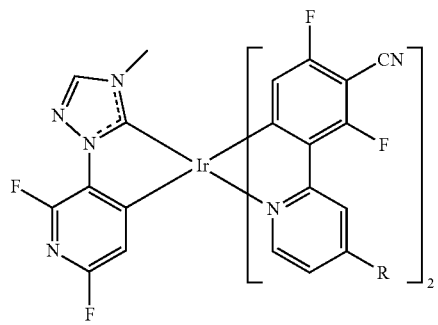
AD2-29
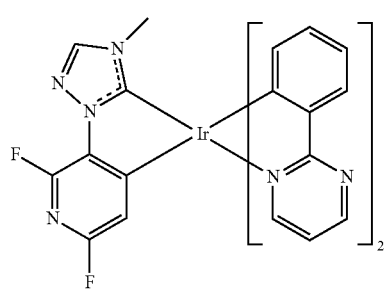
AD2-30
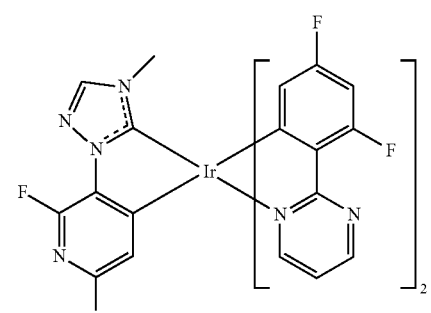
AD2-31
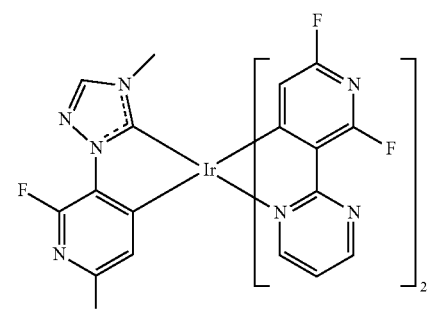
AD2-32
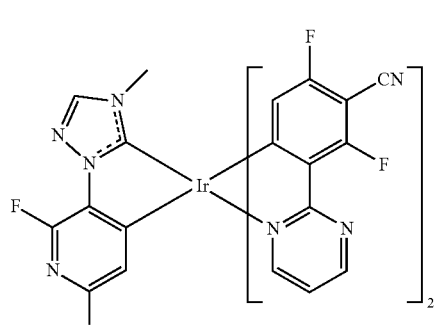

-continued

AD2-33
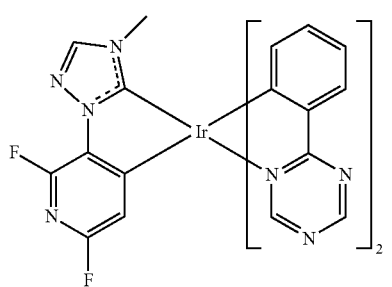

AD2-34
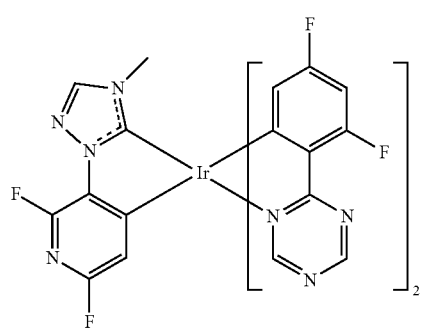

AD2-35
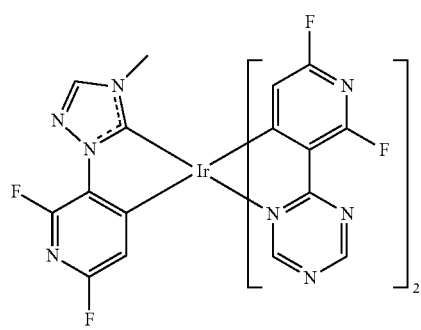

AD2-36
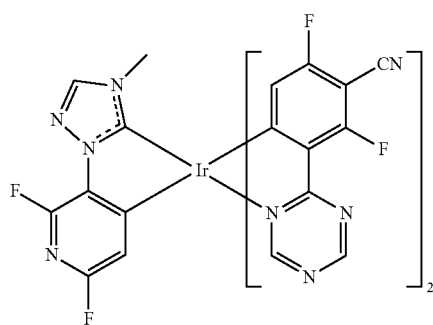

Compound Group 4

TD-01
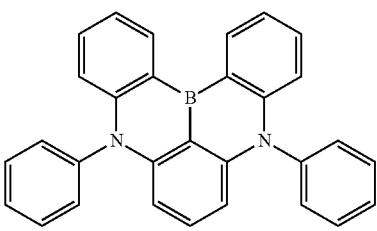

TD-02
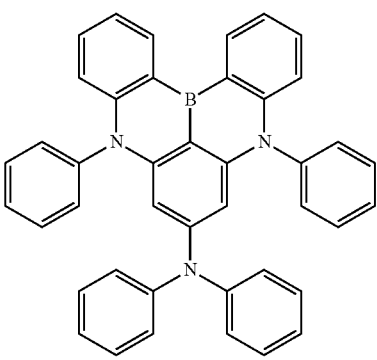

TD-03
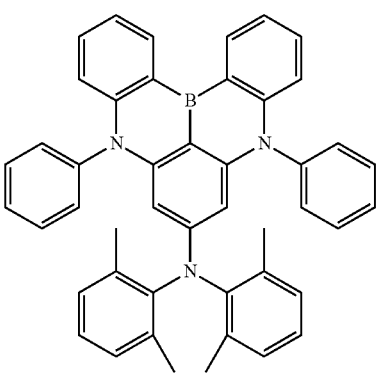

TD-04
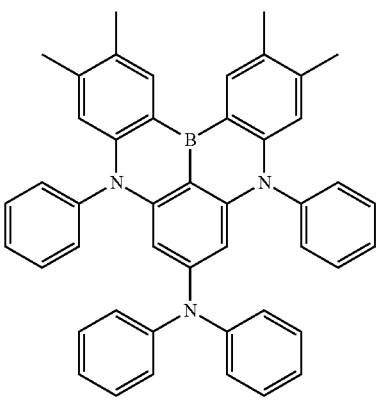

In Compound Group 3-2 above, in AD2-1 to AD2-4, AD2-13 to AD2-16, and AD2-25 to AD2-28, Rs are each independently a hydrogen atom, a methyl group, an isopropyl group, a tert-butyl group, or a dimethylamine group.

In an embodiment, the second dopant represented by Formula D-2 may be represented by any one selected from the compounds represented by Compound Group 4 below. The emission layer EML may include at least one selected from the compounds represented by Compound Group 4 as a second dopant material.

-continued
TD-05
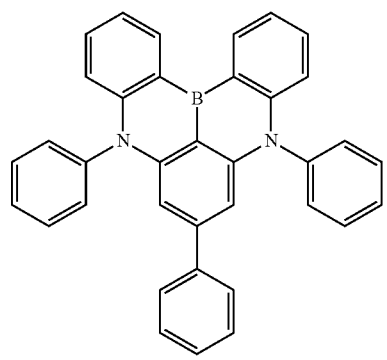
TD-06
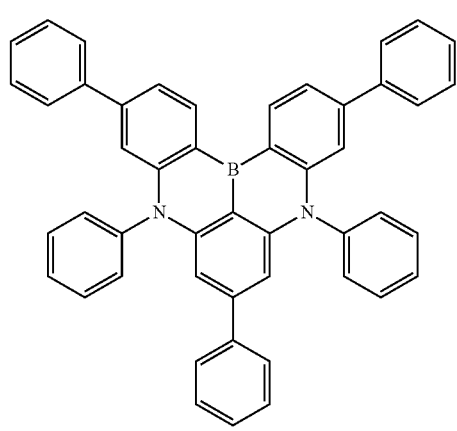
TD-07
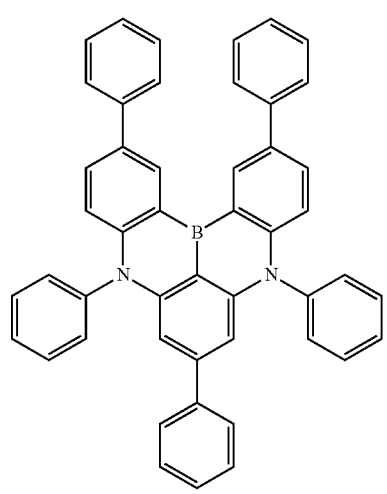
-continued
TD-08
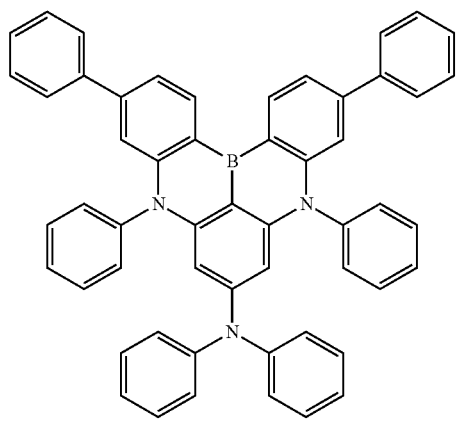
TD-09
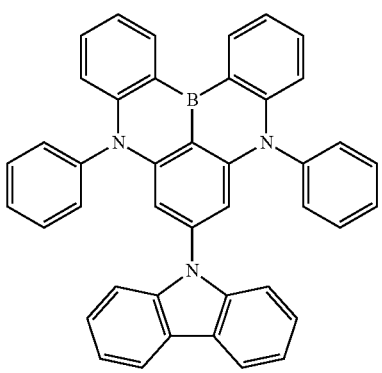
TD-10
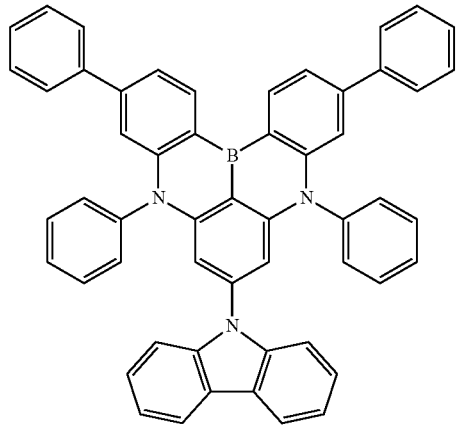

-continued
TD-11
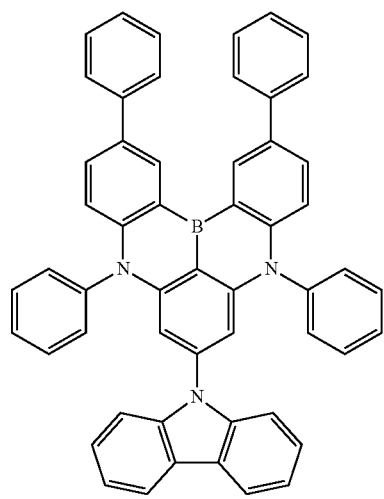
TD-12
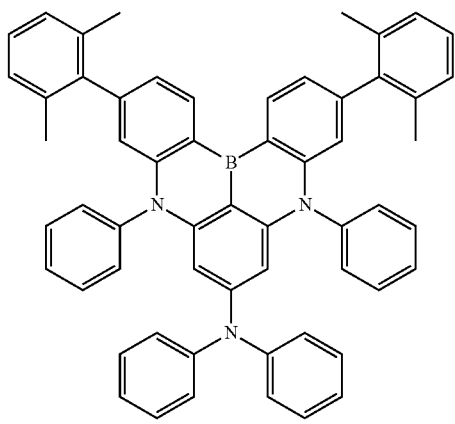
TD-13
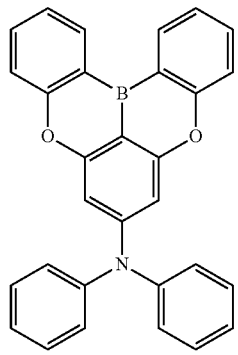
TD-14
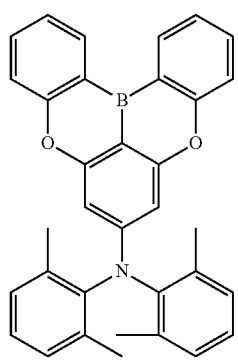
-continued
TD-15
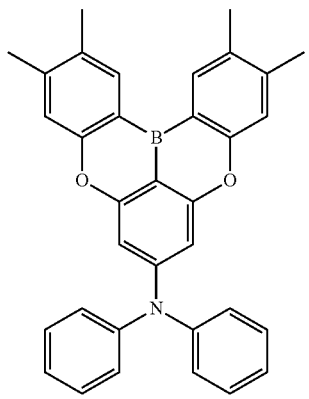
TD-16
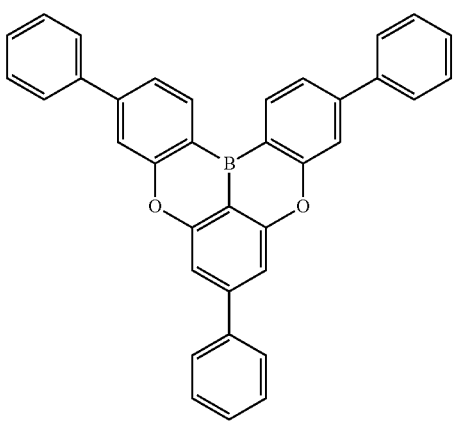
TD-17
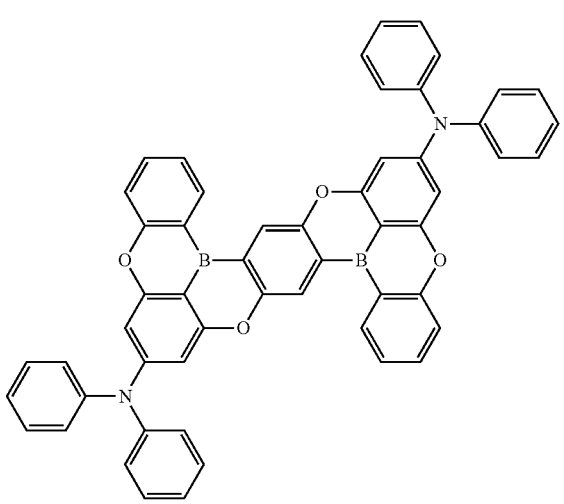

-continued

TD-18
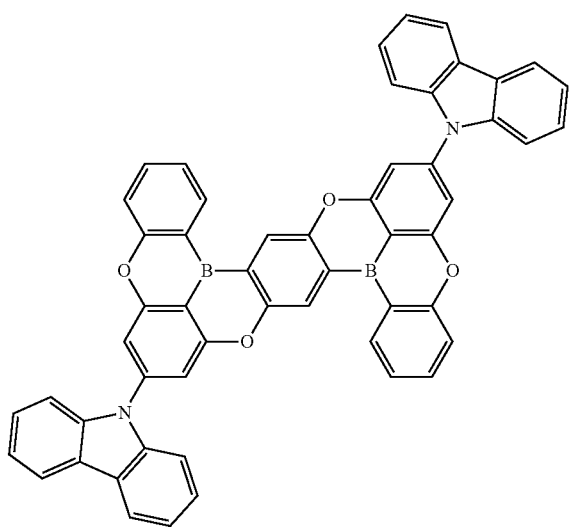

TD-21
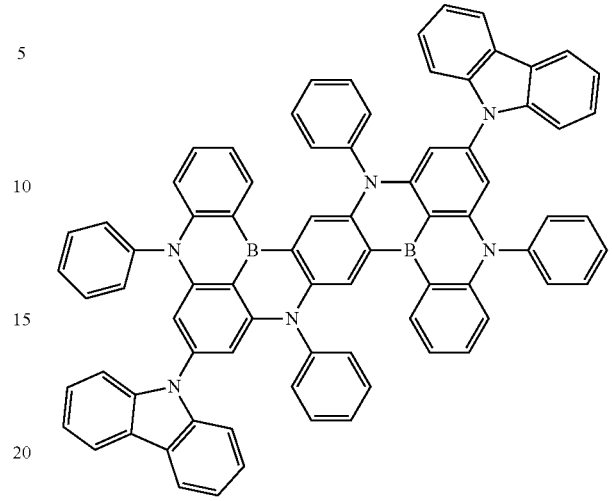

TD-19
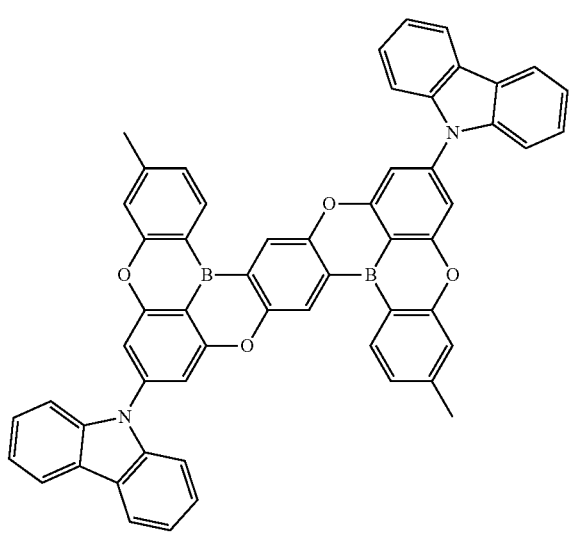

TD-22
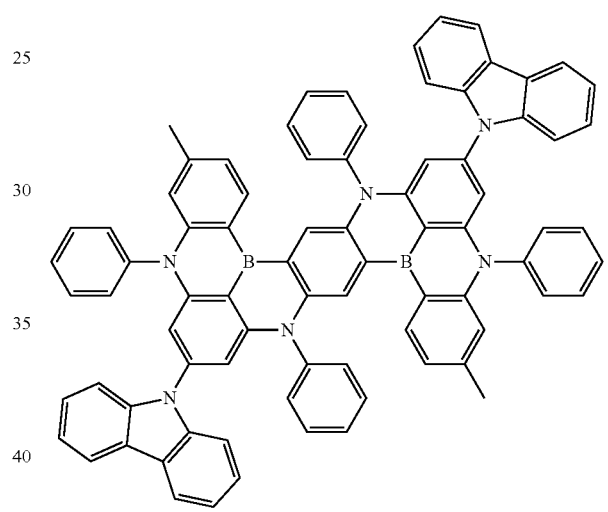

TD-20
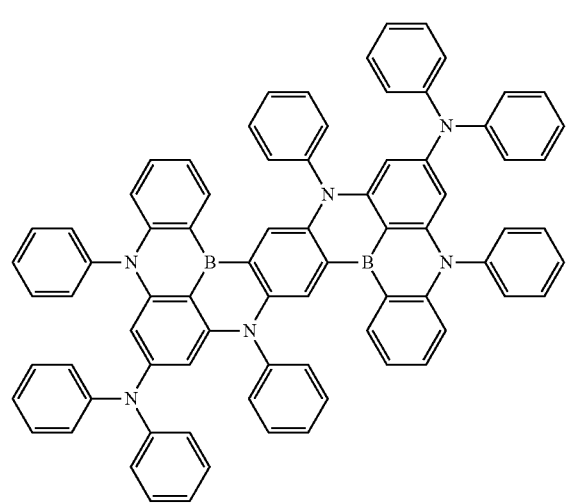

In the organic electroluminescence device 10 of an embodiment, the emission layer EML may include two hosts which are different from each other, e.g., both of the first dopant including an organic metal complex, and the second dopant which emits delayed fluorescence, thereby exhibiting excellent (or suitable) luminous efficiency and service life characteristics.

In some embodiments, the organic electroluminescence device 10 of an embodiment may include a plurality of emission layers. The plurality of emission layers may be sequentially laminated and provided, and for example, the organic electroluminescence device 10 including the plurality of emission layers may emit white light. The organic electroluminescence device including the plurality of emission layers may be an organic electroluminescence device having a tandem structure. When the organic electroluminescence device 10 includes a plurality of emission layers, at least one emission layer EML may include all of the first host, the second host, the first dopant, and the second dopant as described above.

In the organic electroluminescence device 10 of an embodiment shown in FIGS. 1 to 4, the electron transport region ETR is provided on the emission layer EML. The electron transport region ETR may include at least one of the hole blocking layer HBL, the electron transport layer ETL, or the electron injection layer EIL, but embodiments are not limited thereto.

The electron transport region ETR may have a structure having a single layer formed of a single material, a single layer formed of materials different from each other, or a plurality of layers formed of materials different from each other.

For example, the electron transport region ETR may have a single layer structure of an electron injection layer EIL or an electron transport layer ETL, or a single layer structure formed of electron injection material(s) and/or electron transport material(s). In some embodiments, the electron transport region ETR may have a single layer structure formed of materials different from each other, or a structure of electron transport layer ETL/electron injection layer EIL, hole blocking layer HBL/electron transport layer ETL/electron injection layer (EIL), which are sequentially laminated from the emission layer EML, but embodiments are not limited thereto. The electron transport region ETR may have a thickness, for example, from about 1,000 Å to about 1,500 Å.

The electron transport region ETR may be formed by using one or more suitable methods such as a vacuum deposition method, a spin coating method, a casting method, a Langmuir-Blodgett (LB) method, an inkjet printing method, a laser printing method, and/or a laser induced thermal imaging (LITI) method.

If the electron transport region ETR includes the electron transport layer ETL, the electron transport region ETR may include an anthracene-based compound. However, embodiments are not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-Tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1-biphenyl-4-olato)aluminum (BAlq), berylliumbis(benzoquinolin-10-olate) ($Bebq_2$), 9,10-di(naphthalen-2-yl)anthracene (ADN), or a mixture thereof. The thickness of the electron transport layer ETL may be from about 100 Å to about 1,000 Å, for example, from about 150 Å to about 500 Å. When the thickness of the electron transport layer ETL satisfies the above-described range, satisfactory (or suitable) electron transport characteristics may be achieved without substantially increasing in driving voltage.

If the electron transport region ETR includes the electron injection layer EIL, the electron transport region ETR may be formed using one or more metal halides (such as LiF, NaCl, CsF, RbCl, and/or RbI), lanthanum metals (such as Yb), metal oxides (such as $Li_2O$ and/or BaO), and/or Lithium quinolate (LiQ), etc., but embodiments are not limited thereto. The electron injection layer EIL may be also formed of a mixture of an electron transport material and an organo metal salt. The organo metal salt may be a material having an energy band gap of about 4 eV or more. For example, the organo metal salt may include metal acetate, metal benzoate, metal acetoacetate, metal acetylacetonate, and/or metal stearate. The thickness of the electron injection layer EIL may be from about 1 Å to about 100 Å, for example, from about 3 Å to about 90 Å. When the thickness of the electron injection layer EIL satisfies the above-described range, satisfactory (or suitable) electron injection characteristics may be achieved without substantially increasing in driving voltage.

As described above, the electron transport region ETR may include the hole blocking layer HBL. The hole blocking layer HBL may include, for example, at least one of 2,9-dimethyl-4,7-diphenyl-1,10-phenanthroline (BCP), or 4,7-diphenyl-1,10-phenanthroline (Bphen), but is not limited thereto.

The second electrode EL2 is on the electron transport region ETR. The second electrode EL2 may be a common electrode and/or cathode. The second electrode EL2 may be a transmissive electrode, a transflective electrode, or a reflective electrode. When the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), and/or the like.

When the second electrode EL2 is the transflective electrode or the reflective electrode, the second electrode EL2 may include Ag, Mg Cu, Al, Pt, Pd, Au, Ni, Nd, Ir, Cr, Li, Ca, LiF/Ca, LiF/Al, Mo, Ti, or a compound or mixture (e.g., a mixture of Ag and Mg) including the same. In some embodiments, the first electrode EL1 may have a multi-layered structure including a reflective layer or transflective layer and a transparent conductive layer formed of indium tin oxide (ITO), indium zinc oxide (IZO), zinc oxide (ZnO), and/or indium tin zinc oxide (ITZO).

In some embodiments, the second electrode EL2 may be connected to an auxiliary electrode. When the second electrode EL2 is connected to the auxiliary electrode, resistance of the second electrode EL2 may be decreased.

Referring to FIG. 4, the organic electroluminescence device 10 of an embodiment may further include a buffer layer between the emission layer EML and the electron transport region ETR. The buffer layer BFL may control the concentration of the exciton which is generated in the emission layer EML. For example, the buffer layer BFL may include one or more of the emission layer EML materials. For example, the buffer layer BFL may include a host material selected from the emission layer EML materials. The lowest triplet exciton energy level of the buffer layer BFL material may be controlled to be higher than or equal to the lowest triplet exciton energy level of the second dopant, or to be lower than or equal to the lowest triplet exciton energy level of the second dopant according to a combination of host and dopant materials included in the emission layer EML.

In some embodiments, a capping layer may be further provided on the second electrode EL2 of the organic electroluminescence device 10 of an embodiment. The capping layer may include, for example, α-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-Tris (carbazo-9-yl) triphenylamine (TCTA), N, N'-bis (naphthalen-1-yl), etc.

The organic electroluminescence device 10 according to an embodiment of the present invention may optimize a combination of the host material and the dopant material of the emission layer as described above to exhibit excellent (or desirable) luminous efficiency and long service life characteristics. In addition, the organic electroluminescence device 10 of an embodiment may exhibit high efficiency and long service life characteristics in a blue wavelength region.

Hereinafter, the compound according to an embodiment of the present disclosure and the organic electroluminescence device of an embodiment of the present disclosure will be explained in particular referring to examples and comparative examples. However, the examples below are exemplified for assisting the understanding of the present disclosure, and the scope of the present disclosure is not limited thereto.

Examples

Manufacture of Organic Electroluminescence Device

Organic electroluminescence devices of Examples and Comparative Examples were manufactured as follows. First, an ITO glass substrate was cut to a size of about 50 mm×50 mm×0.5 mm, and the cut ITO glass substrates were washed by ultrasonic waves using isopropyl alcohol and distilled water for about 10 minutes, respectively, and then irradiated with ultraviolet rays for about 10 minutes and cleansed by exposing to ozone, and then installed on a vacuum deposition apparatus. Then, a hole injection layer HIL having a thickness of about 40 Å was formed of 2-MTDATA, and a hole transport layer HTL having a thickness of about 10 Å was formed of NPB. Then, a first host, a second host, a first dopant, and a second dopant according to an embodiment were co-deposited to form an emission layer EML having a thickness of about 200 Å, and an electron transport layer ETL having a thickness of about 300 Å was formed of a compound ETL1 shown below. A second electrode EL2 having a thickness of about 1,200 Å was then formed of Al. Each layer was formed by a vacuum deposition method.

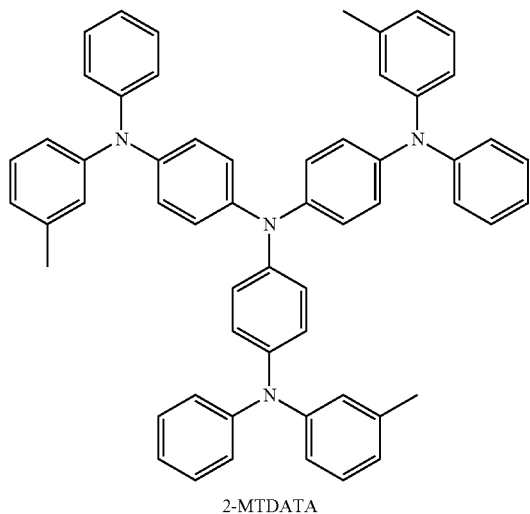

2-MTDATA

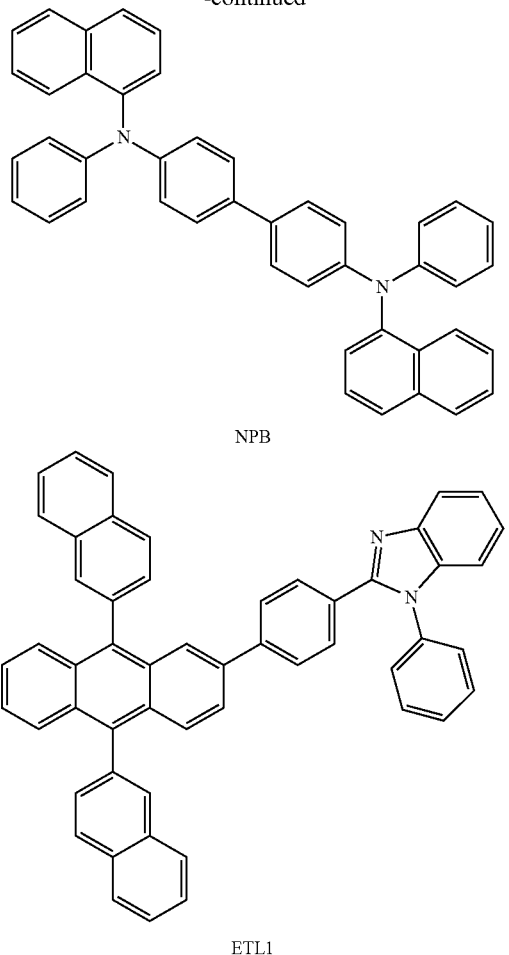

NPB

ETL1

The combination of emission layer materials used in Examples and Comparative Examples are shown in Tables 1-4 below.

Examples 1-1 to 1-5 listed in Table 1 are examples of the organic electroluminescence devices having combinations of the first host represented by Formula H-1, the second host represented by Formula H-2b, the first dopant represented by Formula D-1b and the second dopant represented by Formula D-2. Comparative Examples 1-1 to 1-5 are different from Examples 1-1 to 1-5 in that only one host from among the first host and the second host was used, as compared with Examples 1-1 to 1-5. Comparative Examples 1-6 and 1-7 are different from Examples 1-1 to 1-5 in that only one dopant from among the first dopant and the second dopant was used, as compared with Examples 1-1 to 1-5.

TABLE 1

| Examples of manufactured devices | First host | Second host | First dopant | Second dopant |
|---|---|---|---|---|
| Example 1-1 | HT-01 | ET2-1 | AD2-1 (R: hydrogen atom) | TD-01 |
| Example 1-2 | HT-04 | ET2-3 | AD2-1 (R: dimethylamine group) | TD-05 |
| Example 1-3 | HT-08 | ET2-4 | AD2-1 (R: dimethylamine group) | TD-20 |
| Example 1-4 | HT-08 | ET2-4 | AD2-2 (R: tert-butyl group) | TD-09 |

TABLE 1-continued

| Examples of manufactured devices | First host | Second host | First dopant | Second dopant |
|---|---|---|---|---|
| Example 1-5 | HT-12 | ET2-7 | AD2-5 | TD-20 |
| Comparative Example 1-1 | HT-01 | — | AD2-1 (R: hydrogen atom) | TD-04 |
| Comparative Example 1-2 | HT-05 | — | AD2-1 (R: isopropyl group) | TD-21 |
| Comparative Example 1-3 | — | ET2-1 | AD2-1 (R: dimethylamine group) | TD-04 |
| Comparative Example 1-4 | — | ET2-5 | AD2-2 (R: dimethylamine group) | TD-21 |
| Comparative Example 1-5 | HT-04 | — | AD2-2 (R: isopropyl group) | TD-08 |
| Comparative Example 1-6 | HT-05 | ET2-4 | AD2-2 (R: isopropyl group) | |
| Comparative Example 1-7 | HT-05 | ET2-4 | | TD-04 |

Examples 2-1 to 2-5 listed in Table 2 are examples of the organic electroluminescence devices having combinations of the first host represented by Formula H-1, the second host represented by Formula H-2b, the first dopant represented by Formula D-1a and the second dopant represented by Formula D-2. Comparative Examples 2-1 to 2-5 are different from Examples 2-1 to 2-5 in that only one host from among the first host and the second host was used, as compared with Examples 2-1 to 2-5. Comparative Examples 2-6 and 2-7 are different from Examples 2-1 to 2-5 in that only one dopant from among the first dopant and the second dopant was used, as compared with Examples 2-1 to 2-5.

TABLE 2

| Examples of manufactured devices | First host | Second host | First dopant | Second dopant |
|---|---|---|---|---|
| Example 2-1 | HT-01 | ET2-1 | AD1-1 | TD-01 |
| Example 2-2 | HT-04 | ET2-3 | AD1-5 | TD-05 |
| Example 2-3 | HT-08 | ET2-4 | AD1-5 | TD-20 |
| Example 2-4 | HT-08 | ET2-4 | AD1-9 | TD-09 |
| Example 2-5 | HT-12 | ET2-7 | AD1-21 | TD-20 |
| Comparative Example 2-1 | HT-01 | — | AD1-1 | TD-04 |
| Comparative Example 2-2 | HT-05 | — | AD1-3 | TD-21 |
| Comparative Example 2-3 | — | ET2-1 | AD1-5 | TD-04 |
| Comparative Example 2-4 | — | ET2-5 | AD1-10 | TD-21 |
| Comparative Example 2-5 | HT-04 | — | AD1-8 | TD-08 |
| Comparative Example 2-6 | HT-04 | ET2-5 | AD1-8 | |
| Comparative Example 2-7 | HT-04 | ET2-5 | | TD-08 |

Examples 3-1 to 3-10 listed in Table 3 are examples of the organic electroluminescence devices having combinations of the first host represented by Formula H-1, the second host represented by Formula H-2a, the first dopant represented by Formula D-1a and the second dopant represented by Formula D-2. Comparative Examples 3-1 to 3-11 are different from Examples 3-1 to 3-10 in that only one host from among the first host and the second host, and only one dopant from among the first dopant and the second dopant, or two hosts and one dopant were used, as compared with Examples 3-1 to 3-10.

TABLE 3

| Examples of manufactured devices | First host | Second host | First host:Second host | First dopant | Second dopant |
|---|---|---|---|---|---|
| Example 3-1 | HT-01 | ET1-2 | 5:5 | AD1-3 | TD-10 |
| Example 3-2 | HT-03 | ET1-4 | 7:3 | AD1-33 | TD-17 |
| Example 3-3 | HT-06 | ET1-5 | 5:5 | AD1-3 | TD-20 |
| Example 3-4 | HT-08 | ET1-8 | 5:5 | AD1-3 | TD-20 |
| Example 3-5 | HT-06 | ET1-15 | 7:3 | AD1-1 | TD-17 |
| Example 3-6 | HT-09 | ET1-8 | 7:3 | AD1-9 | TD-10 |
| Example 3-7 | HT-07 | ET1-15 | 5:5 | AD1-33 | TD-10 |
| Example 3-8 | HT-04 | ET1-5 | 3:7 | AD1-9 | TD-10 |
| Example 3-9 | HT-08 | ET1-15 | 7:3 | AD1-3 | TD-17 |
| Example 3-10 | HT-12 | ET1-15 | 7:3 | AD1-33 | TD-20 |
| Comparative Example 3-1 | HT-01 | | | AD1-33 | |
| Comparative Example 3-2 | | ET1-3 | | AD1-33 | |
| Comparative Example 3-3 | HT-05 | | | AD1-33 | |
| Comparative Example 3-4 | | ET1-6 | | AD1-33 | |
| Comparative Example 3-5 | HT-08 | | | AD1-33 | |
| Comparative Example 3-6 | | ET1-15 | | AD1-33 | |
| Comparative Example 3-7 | HT-07 | | | AD1-33 | |
| Comparative Example 3-8 | HT-08 | ET1-15 | 5:5 | | TD-17 |
| Comparative Example 3-9 | HT-12 | ET1-15 | 5:5 | | TD-20 |
| Comparative Example 3-10 | HT-04 | | | AD1-33 | |
| Comparative Example 3-11 | HT-04 | ET1-15 | 5:5 | AD1-33 | |

Examples 4-1 to 4-5 listed in Table 4 are examples of the organic electroluminescence devices having combinations of the first host represented by Formula H-1, the second host represented by Formula H-2a, the first dopant represented by Formula D-1b and the second dopant represented by Formula D-2. Comparative Examples 4-1 to 4-4 are different from Examples 4-1 to 4-5 in that only one host from among the first host and the second host, and only the first dopant were used, as compared with Examples 4-1 to 4-5. Comparative Example 4-5 is different from Examples 4-1 to 4-5 in that only the second dopant from among the first dopant and the second dopant was used, as compared with Examples 4-1 to 4-5.

TABLE 4

| Examples of manufactured devices | First host | Second host | First dopant | Second dopant |
|---|---|---|---|---|
| Example 4-1 | HT-03 | ET1-2 | AD2-4 (R: isopropyl group) | TD-02 |
| Example 4-2 | HT-06 | ET1-4 | AD2-11 | TD-04 |
| Example 4-3 | HT-08 | ET1-6 | AD2-24 | TD-20 |
| Example 4-4 | HT-11 | ET1-8 | AD2-23 | TD-21 |
| Example 4-5 | HT-13 | ET1-9 | AD2-35 | TD-22 |
| Comparative Example 4-1 | HT-03 | | AD2-4 (R: isopropyl group) | |
| Comparative Example 4-2 | | ET1-2 | AD2-4 (R: isopropyl group) | |
| Comparative Example 4-3 | HT-06 | | AD2-11 | |
| Comparative Example 4-4 | | ET1-4 | AD2-11 | |
| Comparative Example 4-5 | HT-11 | ET1-8 | | TD-21 |

Evaluation of Property of Organic Electroluminescence Device

Properties of the manufactured organic electroluminescence devices were evaluated using a brightness distribution characteristic measurement device. To evaluate properties of the organic electroluminescence device according to Examples and Comparative Examples, driving voltage, brightness, efficiency, luminous wavelength, and service life were measured. Table 5 shows a luminous efficiency at a current density of 10 mA/cm$^2$ and a brightness of 1,000 cd/m$^2$, with respect to the manufactured organic electroluminescence devices. Table 5 also shows a device service life ($T_{90}$) that is a time taken to reduce the brightness to 90% level with respect to a brightness of 1,000 cd/m$^2$. The device service life ($T_{90}$) was measured by continuously driving the device at a current density of 10 mA/cm$^2$, and a measurement unit is hour. In some embodiments, a brightness spectrum of Examples and Comparative Examples was measured with a spectroradiometer. A luminous peak, the maximum luminous wavelength, was measured from the measured brightness spectrum.

TABLE 5

| Examples of manufactured devices | Luminous efficiency (cd/A) | Maximum luminous wavelength (nm) | Device service life ($T_{90}$, h) |
|---|---|---|---|
| Example 1-1 | 230 | 457 | 10 |
| Example 1-2 | 245 | 457 | 9 |
| Example 1-3 | 250 | 457 | 50 |
| Example 1-4 | 226 | 457 | 32 |
| Example 1-5 | 264 | 457 | 48 |
| Comparative Example 1-1 | 20.54 | 458 | 0.1 |
| Comparative Example 1-2 | 10.56 | 456 | 0.1 |
| Comparative Example 1-3 | 14.56 | 485 | 0.5 |
| Comparative Example 1-4 | 29.00 | 485 | 0.5 |
| Comparative Example 1-5 | 42.17 | 465 | 2.0 |
| Comparative Example 1-6 | 35.05 | 465 | 3.0 |
| Comparative Example 1-7 | 41.15 | 458 | 2.5 |
| Example 2-1 | 213 | 457 | 10 |
| Example 2-2 | 216 | 457 | 9 |
| Example 2-3 | 250 | 457 | 50 |
| Example 2-4 | 226 | 457 | 32 |
| Example 2-5 | 264 | 457 | 48 |
| Comparative Example 2-1 | 20.54 | 458 | 0.1 |
| Comparative Example 2-2 | 10.56 | 456 | 0.1 |
| Comparative Example 2-3 | 14.56 | 485 | 0.5 |
| Comparative Example 2-4 | 29.00 | 485 | 0.5 |
| Comparative Example 2-5 | 42.17 | 465 | 2.0 |
| Comparative Example 2-6 | 38.1 | 485 | 2.0 |
| Comparative Example 2-7 | 45.3 | 465 | 2.3 |
| Example 3-1 | 250 | 458 | 21 |
| Example 3-2 | 242 | 458 | 28 |
| Example 3-3 | 248 | 460 | 24 |
| Example 3-4 | 260 | 460 | 21 |
| Example 3-5 | 265 | 460 | 19 |
| Example 3-6 | 262 | 459 | 20 |
| Example 3-7 | 295 | 457 | 18 |
| Example 3-8 | 278 | 457 | 27 |
| Example 3-9 | 282 | 459 | 34 |
| Example 3-10 | 296 | 459 | 29 |
| Comparative Example 3-1 | 16 | 478 | 1.1 |
| Comparative Example 3-2 | 20 | 480 | 0.8 |
| Comparative Example 3-3 | 18.7 | 481 | 1.5 |
| Comparative Example 3-4 | 21.4 | 483 | 7 |
| Comparative Example 3-5 | 15.5 | 482 | 11 |
| Comparative Example 3-6 | 21.4 | 479 | 10 |
| Comparative Example 3-7 | 21 | 480 | 14 |
| Comparative Example 3-8 | 20.5 | 465 | 15 |
| Comparative Example 3-9 | 19 | 459 | 2.2 |
| Comparative Example 3-10 | 55.6 | 480 | 12 |
| Comparative Example 3-11 | 65.2 | 459 | 5 |
| Example 4-1 | 252 | 456 | 20 |
| Example 4-2 | 248 | 459 | 22 |
| Example 4-3 | 265 | 460 | 35 |
| Example 4-4 | 271 | 458 | 21 |
| Example 4-5 | 261 | 459 | 24 |
| Comparative Example 4-1 | 25 | 481 | 0.5 |
| Comparative Example 4-2 | 65 | 479 | 1.4 |
| Comparative Example 4-3 | 48 | 478 | 1.2 |
| Comparative Example 4-4 | 50 | 476 | 2.4 |
| Comparative Example 4-5 | 78 | 483 | 3.2 |

Referring to the results of Table 5, it can be seen that in the cases of Examples including all of the first host, the second host, the first dopant, and the second dopant as in the emission layer according to an embodiment, efficiency and service life of the luminescence devices are improved compared to Comparative Examples.

Referring to the results of Examples 1-1 to 1-5 and Comparative Examples 1-1 to 1-7, it may be seen that Examples show excellent luminous efficiency and long service life. Thus, it is believed that the cases of including all of two host materials of Examples and two dopant materials of Examples exhibit excellent device characteristics compared to the cases of including only one host from among the first host and the second host, or only one dopant from among the first dopant and the second dopant. Further, it may be seen that Examples 1-1 to 1-5 show the maximum luminous wavelength at 460 nm or less, thereby emitting blue light.

Referring to the results of Examples 2-1 to 2-5 and Comparative Examples 2-1 to 2-7, it may be seen that Examples show high efficiency and long service life compared to Comparative Examples. Thus, it is believed that the cases of including all of two host materials of Examples and two dopant materials of Examples exhibit excellent device characteristics compared to the cases of including only one host from among the first host and the second host, or only one dopant from among the first dopant and the second dopant. Further, it may be seen that Example 2-1 to Example 2-5 show the maximum luminous wavelength at 460 nm or less, thereby emitting blue light.

Referring to the results of Examples 3-1 to 3-10 and Comparative Examples 3-1 to 3-11, it may be seen that Examples show excellent luminous efficiency and long service life compared to Comparative Examples. For example, when comparing Examples 3-1 to 3-10 with Comparative Examples 3-1 to 3-7 and Comparative Example 3-10, it may be seen that the case of including all of two host materials of Examples and two dopant materials of Examples exhibits excellent device characteristics compared to the cases of including only one host from among the first host and the second host, and only one dopant from among the first dopant and the second dopant. In addition, when comparing Examples 3-1 to Examples 3-10 with Comparative Examples 3-8, 3-9, and 3-11, it may be seen that the case of including all of two host materials of Examples and two dopant materials of Examples exhibits excellent device characteristics compared to the cases of using two host materials and including only one dopant from among the first dopant and the second dopant. Further, it may be seen that Example 3-1 to Example 3-10 show the maximum luminous wavelength at 460 nm or less, thereby emitting blue light.

Referring to the results of Examples 4-1 to 4-5 and Comparative Examples 4-1 to 4-5, it may be seen that Examples show high efficiency and long service life compared to Comparative Examples. Thus, it is believed that the case of including all of two host materials of Examples and two dopant materials of Examples exhibits excellent device characteristics compared to the cases of including one host from among the first host and the second host and only the first dopant, or two hosts and only the second dopant. Further, it may be seen that Example 4-1 to Example 4-5 show the maximum luminous wavelength at 460 nm or less, thereby emitting blue light.

The organic electroluminescence device of an embodiment may include all of the first host with a high hole-transport property, the second host with a high electron transport property, the first dopant, which is an organic metal complex, and the second dopant, which is a fluorescent dopant, in the emission layer to exhibit excellent luminous efficiency and improved service life characteristics. In addition, the organic electroluminescence device of an embodiment may include two different host materials, and include the first dopant having the lowest triplet exciton energy level higher than that of the second dopant, and the second dopant, which is a thermally activated delayed fluorescence dopant, in the emission layer to exhibit high luminous efficiency and long service life in a blue wavelength region.

The organic electroluminescence device of an embodiment may exhibit improved device characteristics of long service life and high efficiency.

The organic electroluminescence device of an embodiment may exhibit high efficiency and long service life characteristics, including all of two host materials and two dopant materials of the present embodiments.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the present disclosure has been described with reference to example embodiments of the present disclosure, it will be understood that various changes and modifications of the present disclosure may be made by one skilled in the art or one having ordinary knowledge in the art without departing from the spirit and technical field of the present disclosure as hereinafter claimed.

Hence, the technical scope of the present disclosure is not limited to the detailed descriptions in the specification, but it should be determined only by reference of the claims of their equivalents.

What is claimed is:

1. An organic electroluminescence device comprising:
a first electrode;
a second electrode on the first electrode; and
an emission layer between the first electrode and the second electrode,
wherein the emission layer comprises:
a first host;
a second host different from the first host;
a first dopant represented by Formula D-1a or Formula D-1b; and
a second dopant represented by Formula D-2:

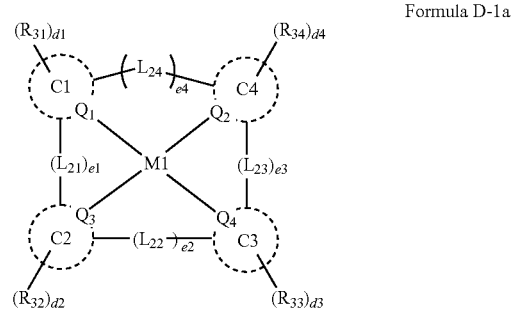

Formula D-1a

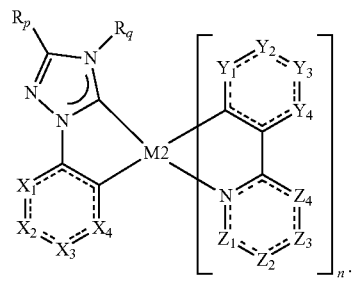

Formula D-1b wherein, in Formula D-1a,
M1 is Pt, Pd, Cu, or Os,
$Q_1$ to $Q_4$ are each independently C or N, C1 to C4 are each independently a substituted or unsubstituted hydrocarbon ring having 5 to 30 carbon atoms for forming a ring, or a substituted or unsubstituted heterocyclic ring having 2 to 30 carbon atoms for forming a ring, L$_{21}$ to L$_{24}$ are each independently a direct linkage, *—O—*, *—S—*,

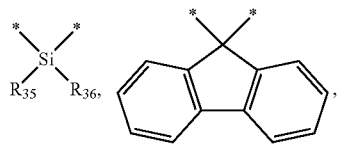

a substituted or unsubstituted divalent alkyl group having 1 to 20 carbon atoms, a substituted or unsubstituted arylene group having 6 to 30 carbon atoms for forming a ring, or a substituted or unsubstituted heteroarylene group having 2 to 30 carbon atoms for forming a ring, e1 to e4 are each independently 0 or 1, R$_{31}$ to R$_{36}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of R$_{31}$ to R$_{36}$ are optionally combined with an adjacent group to form a ring, and d1 to d4 are each independently an integer of 0 to 4, in Formula D-1b, M2 is Ir, Ru, or Rh, n is 1 or 2, X$_1$ to X$_4$, Y$_1$ to Y$_4$ and Z$_1$ to Z$_4$ are each independently CR$_n$ or N, and R$_p$, R$_q$, and R$_n$ are each independently a hydrogen atom, a deuterium atom, a halogen atom, a cyano group, a substituted or unsubstituted alkyl group having 1 to 20 carbon atoms, a substituted or unsubstituted hydrocarbon ring having 5 to 30 carbon atoms for forming a ring, a substituted or unsubstituted heterocyclic ring having 2 to 30 carbon atoms for forming a ring, or a substituted or unsubstituted amine group, and any of R$_p$, R$_q$, and R$_n$ are optionally combined with an adjacent group to form a ring,

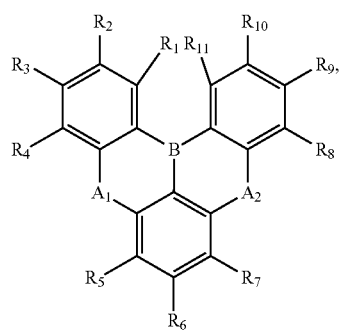

Formula D-2 and wherein in Formula D-2,

A$_1$ and A$_2$ are each independently NR$_m$ or O,

R$_m$ is a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group of 2 to 30 carbon atoms for forming a ring, and R$_1$ to R$_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and any of R$_1$ to R$_{11}$ are optionally combined with an adjacent group to form a ring.

2. The organic electroluminescence device of claim 1, wherein the first host is represented by Formula H-1:

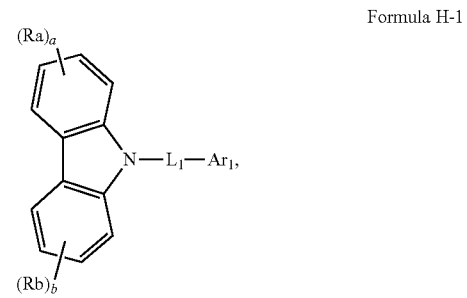

Formula H-1 and wherein in Formula H-1,

L$_1$ is a direct linkage, a substituted or unsubstituted arylene group having 6 to 30 carbon atoms for forming a ring, or a substituted or unsubstituted heteroarylene group having 2 to 30 carbon atoms for forming a ring, Ar$_1$ is a substituted or unsubstituted aryl group having 6 to 30 carbon atoms for forming a ring, or a substituted or unsubstituted heteroaryl group having 2 to 30 carbon atoms for forming a ring, a and b are each independently an integer of 0 to 4, and R$_a$ and R$_b$ are each independently a substituted or unsubstituted aryl group having 6 to 30 carbon atoms for forming a ring, or a substituted or unsubstituted heteroaryl group having 2 to 30 carbon atoms for forming a ring.

3. The organic electroluminescence device of claim 1, wherein the second host is represented by Formula H-2:

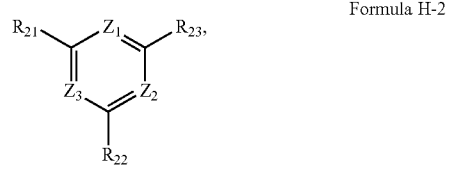

Formula H-2 and wherein in Formula H-2,

Z$_1$ to Z$_3$ are each independently CR$_y$ or N, and

R$_y$ and R$_{21}$ to R$_{23}$ are each independently a hydrogen atom, a deuterium atom, a cyano group, a substituted or unsubstituted silyl group, a substituted or unsubstituted aryl group having 6 to 30 carbon atoms for forming a ring, or a substituted or unsubstituted heteroaryl group having 2 to 30 carbon atoms for forming a ring.

4. The organic electroluminescence device of claim 3, wherein Formula H-2 is represented by Formula H-2a:

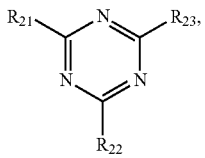

Formula H-2a and
wherein, in Formula H-2a, $R_{21}$ to $R_{23}$ are the same as those defined in Formula H-2.

5. The organic electroluminescence device of claim 3, wherein Formula H-2 is represented by Formula H-2b:

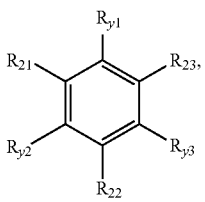

Formula H-2b and
wherein in Formula H-2b,
$R_{21}$ to $R_{23}$ and $R_{y1}$ to $R_{y3}$ are each independently a hydrogen atom, a deuterium atom, a cyano group, a substituted or unsubstituted silyl group, a substituted or unsubstituted aryl group having 6 to 30 carbon atoms for forming a ring, or a substituted or unsubstituted heteroaryl group having 2 to 30 carbon atoms for forming a ring, and
at least one selected from $R_{21}$ to $R_{23}$ and $R_{y1}$ to $R_{y3}$ is a cyano group, an aryl group having 6 to 30 carbon atoms for forming a ring and comprising at least one cyano group as a substituent, or a heteroaryl group having 2 to 30 carbon atoms for forming a ring and comprising at least one cyano group as a substituent.

6. The organic electroluminescence device of claim 1, wherein Formula D-2 is represented by any one of Formulae D-2a to D-2d:

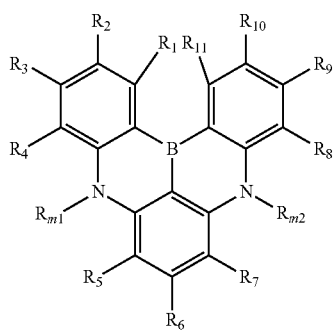

Formula D-2a

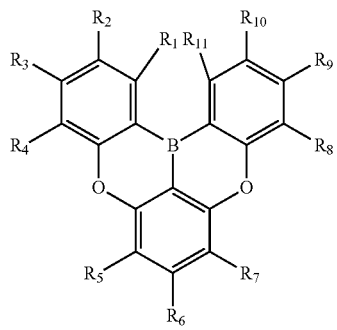

Formula D-2b

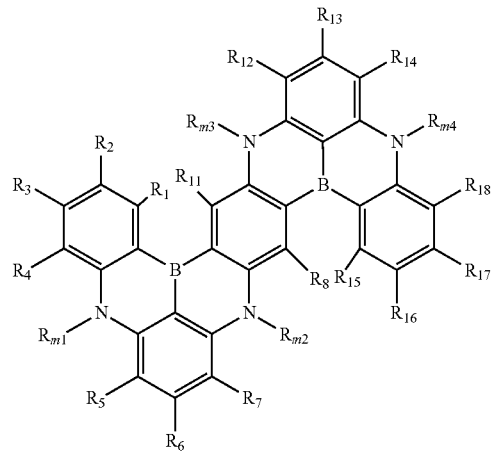

Formula D-2c

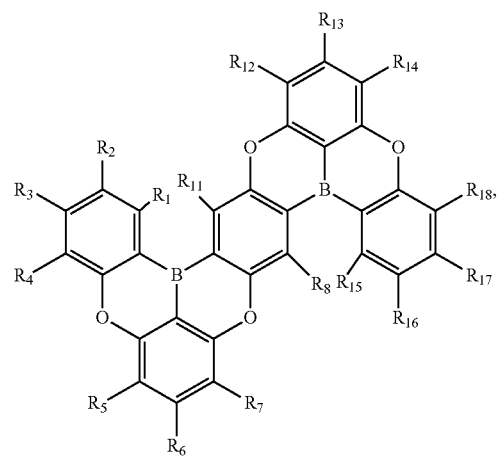

Formula D-2d and
wherein in Formula D-2a to Formula D-2d,
$R_{m1}$ to $R_{m4}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and
$R_1$ to $R_{18}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and any of $R_1$ to $R_{18}$ are optionally combined with an adjacent group to form a ring.

7. The organic electroluminescence device of claim 1, wherein the weight ratio of the first host and the second host is 7:3 to 3:7.

8. The organic electroluminescence device of claim 1, wherein the content of the first dopant is about 10 wt % to about 15 wt %, and the content of the second dopant is about 1 wt % to about 5 wt %, with respect to the total compound weight of the first host, the second host, the first dopant, and the second dopant.

9. The organic electroluminescence device of claim 1, wherein the first host comprises at least one compound selected from Compound Group 1:

Compound Group 1

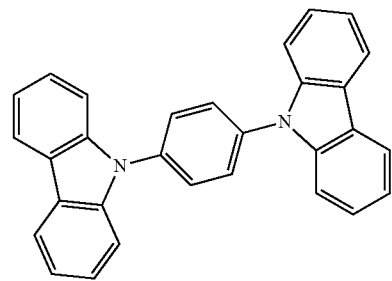

HT-01

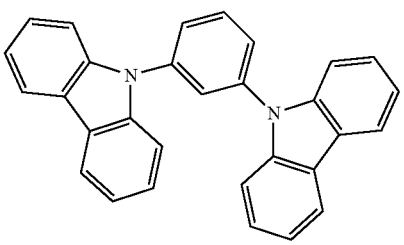

HT-02

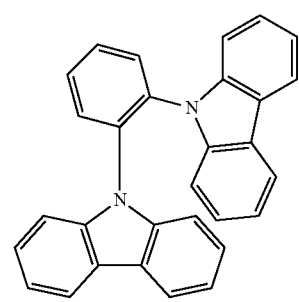

HT-03

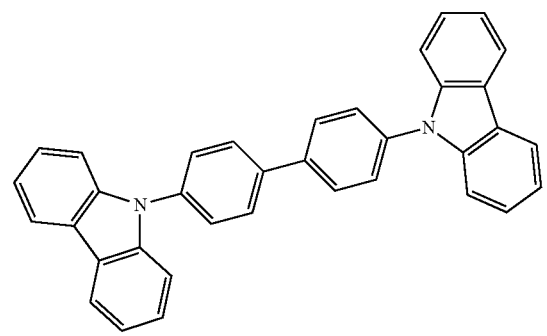

HT-04

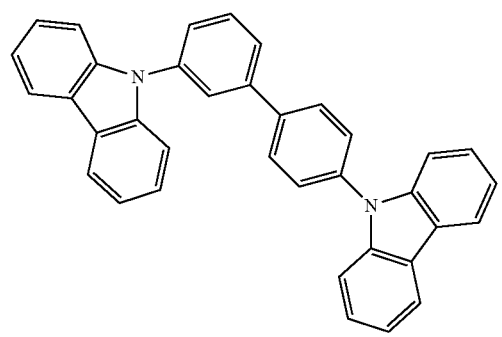

HT-05

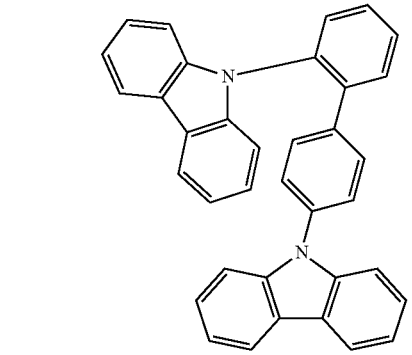

HT-06

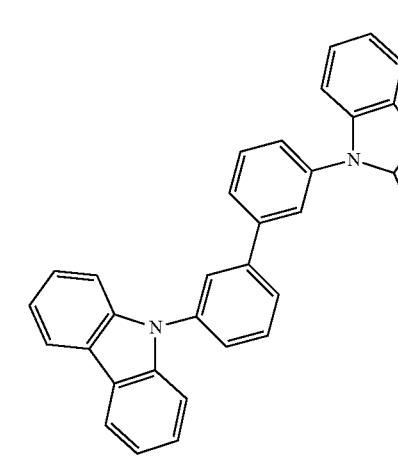

HT-07

HT-08
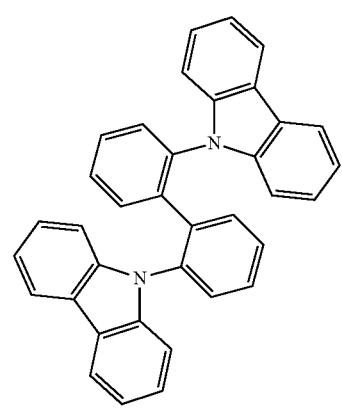
HT-09
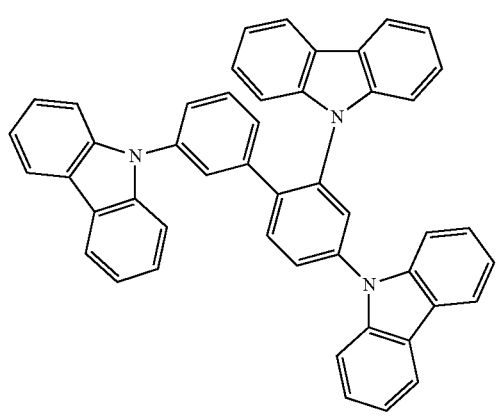
HT-10
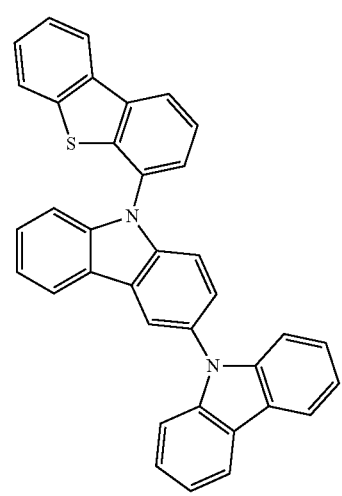
HT-11
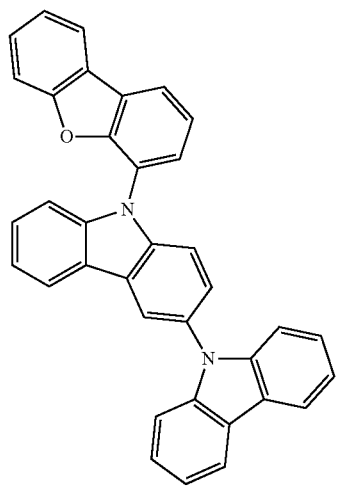
HT-12
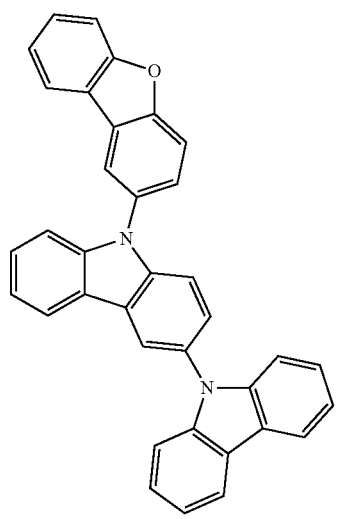
HT-13
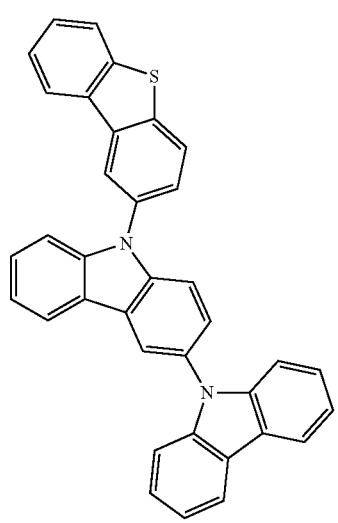

HT-14
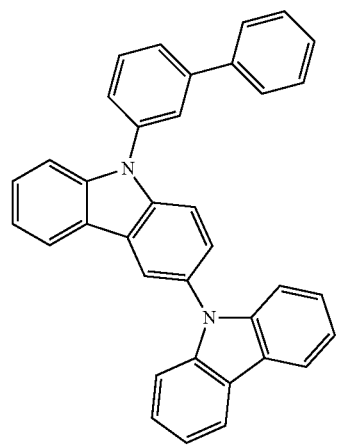
HT-15
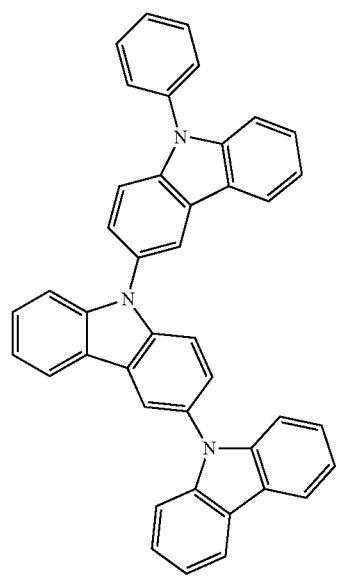
HT-16
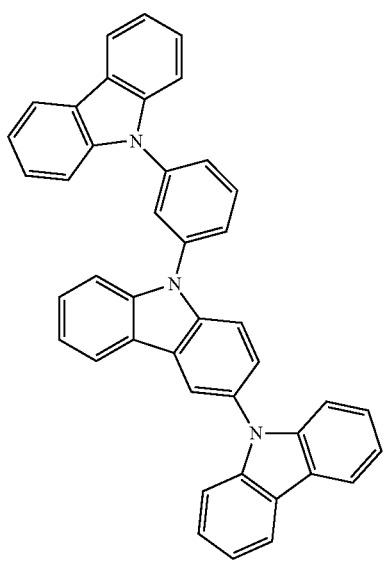
HT-17
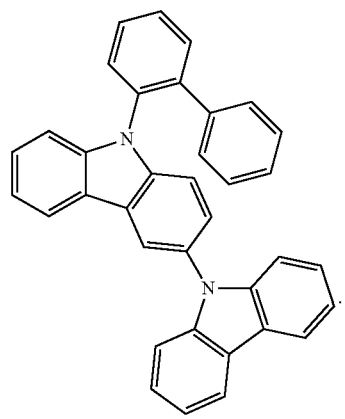
10. The organic electroluminescence device of claim 1, wherein the second host comprises at least one compound selected from Compound Group 2-1 and Compound Group 2-2:
Compound Group 2-1
ET1-1
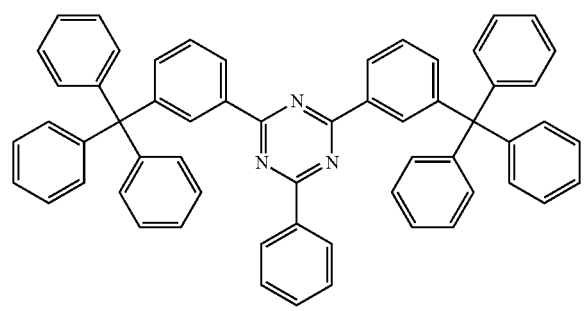
ET1-2
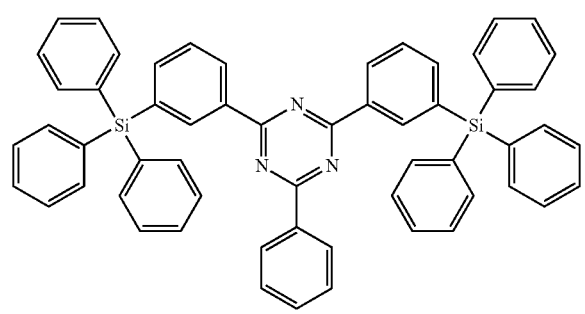
ET1-3
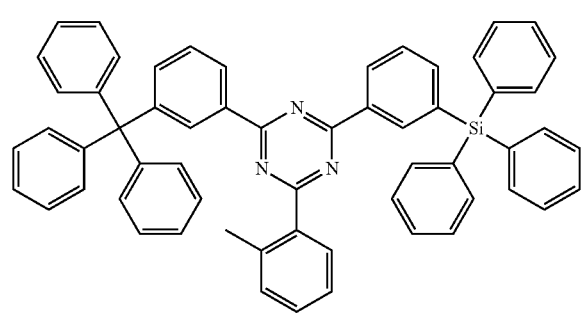

-continued
ET1-4
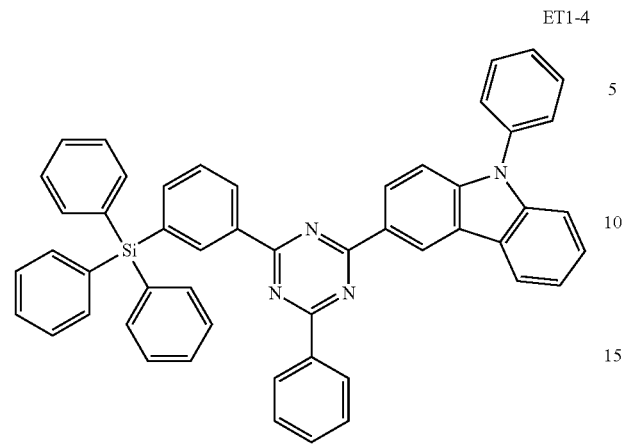
ET1-5
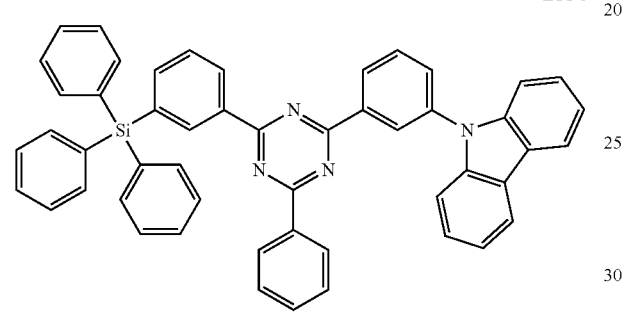
ET1-6
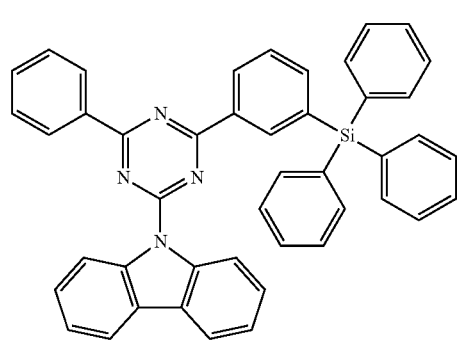
ET1-7
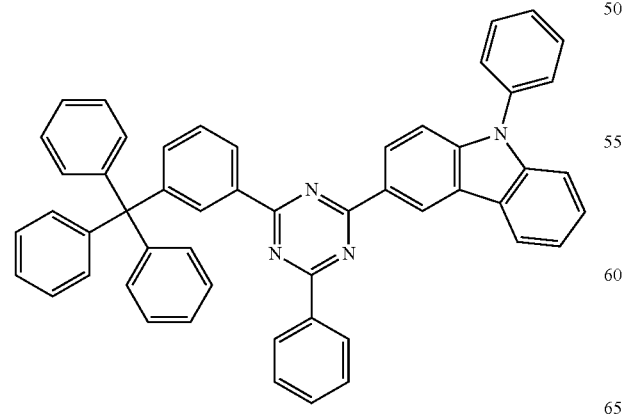
ET1-8
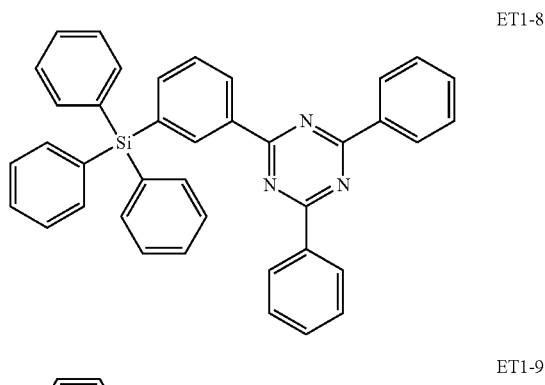
ET1-9
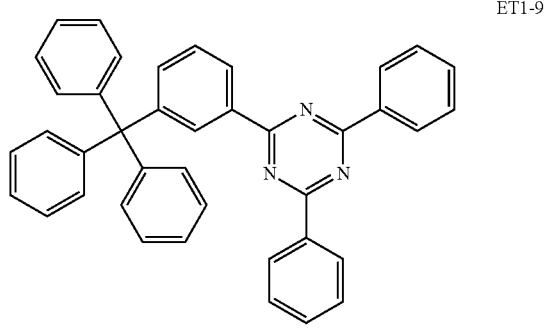
ET1-10
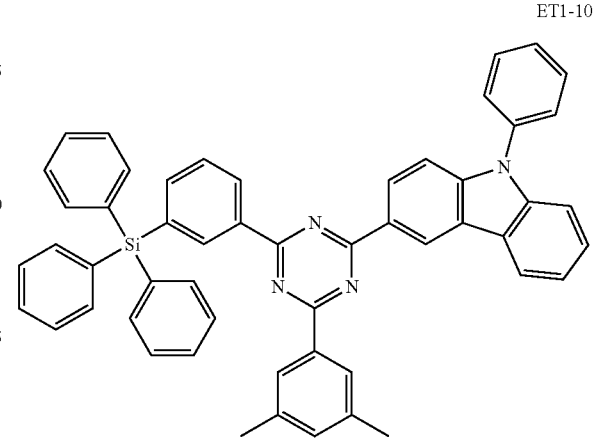
ET1-11
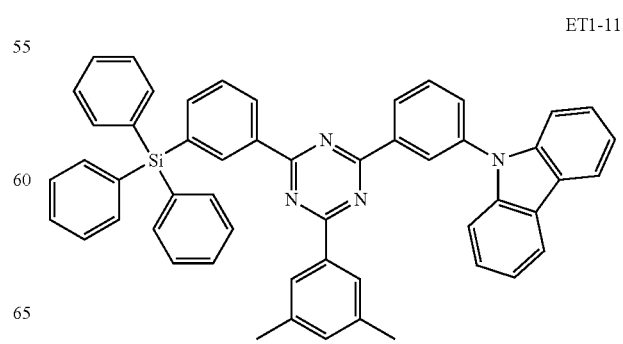

ET1-12
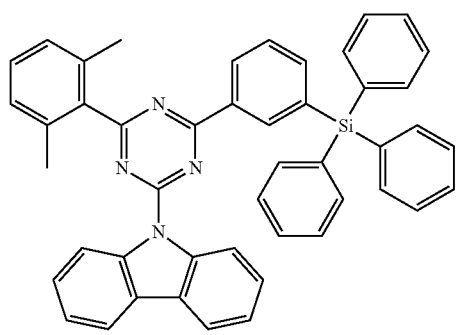
ET1-13
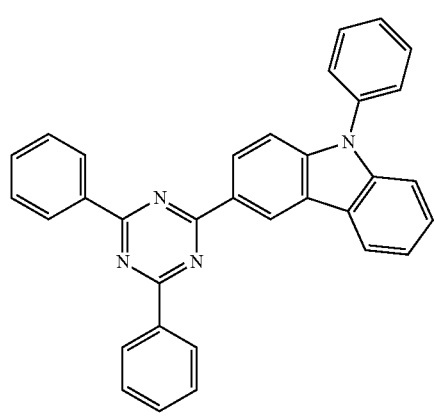
ET1-14
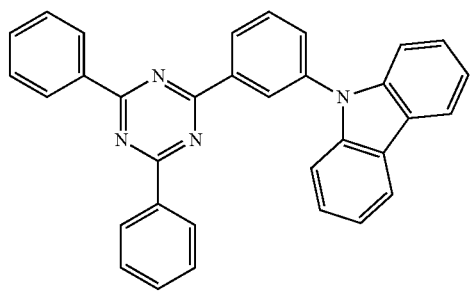
ET1-15
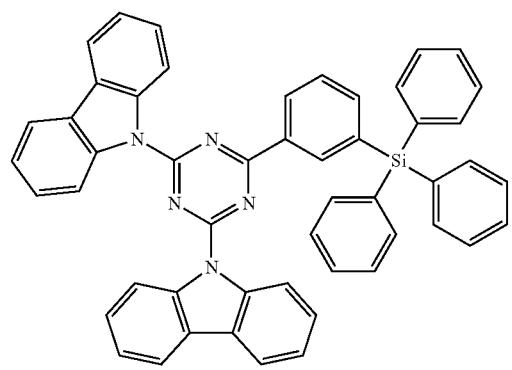
Compound Group 2-2
ET2-1
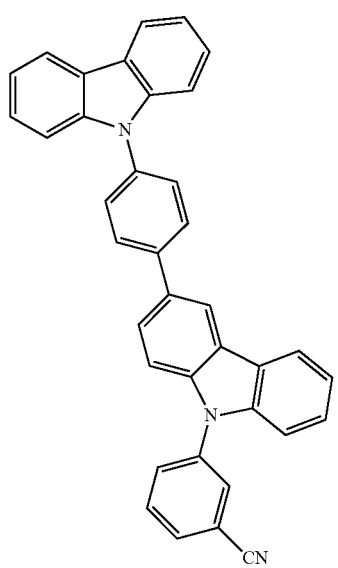
ET2-2
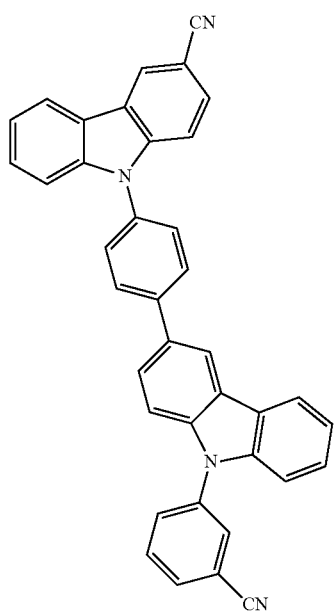

-continued
ET2-3
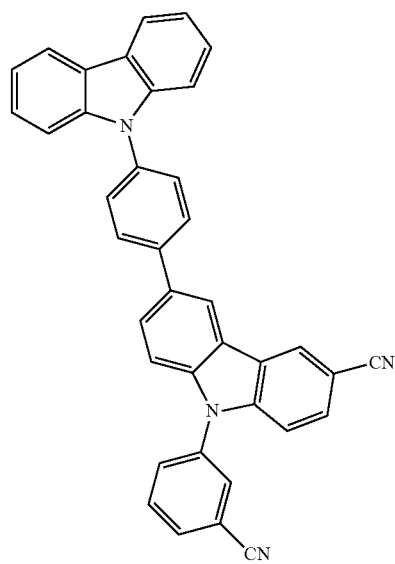
ET2-4
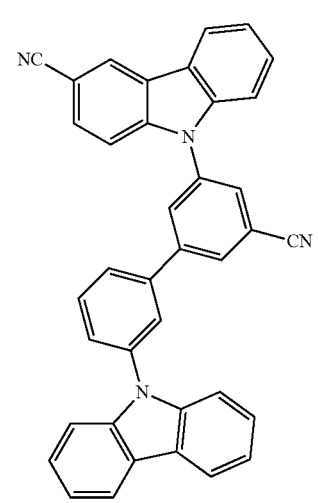
ET2-5
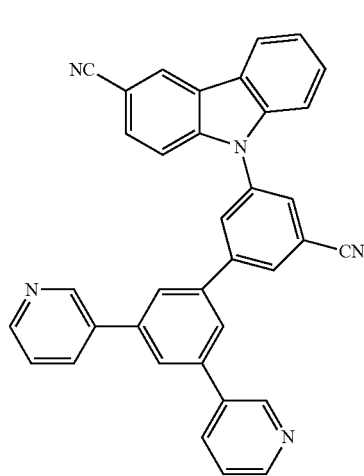
ET2-6
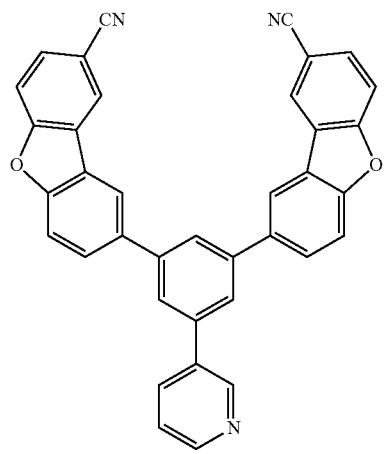
ET2-7
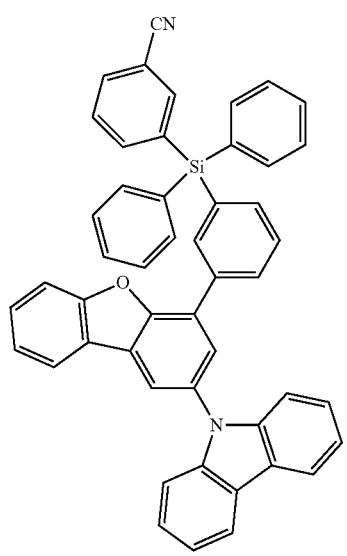
ET2-8
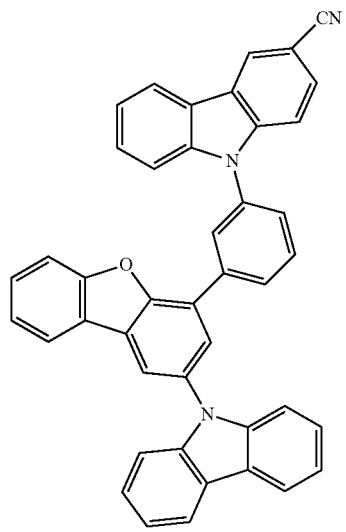

-continued
ET2-9
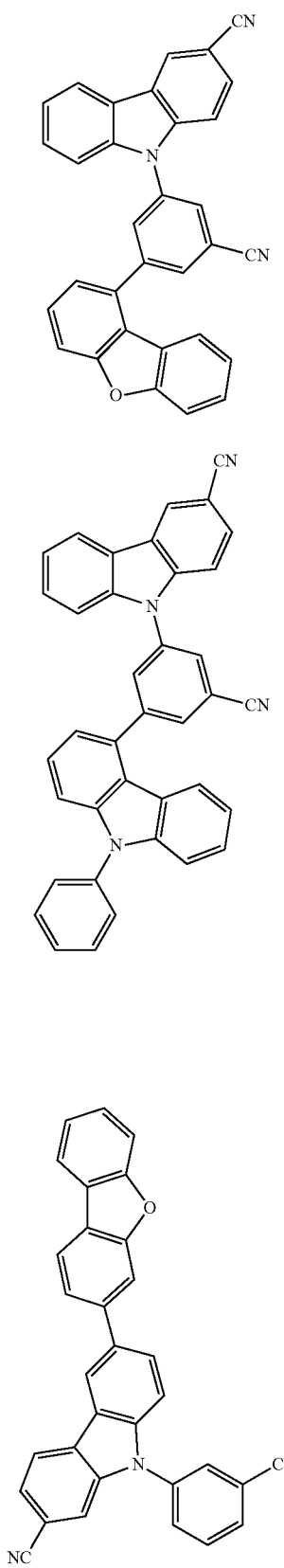
ET2-10
ET2-11
-continued
ET2-12
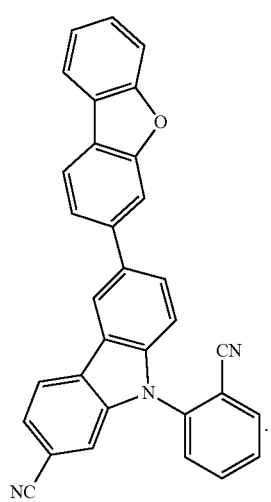
11. The organic electroluminescence device of claim 1, wherein the first dopant comprises at least one compound selected from Compound Group 3-1 and Compound Group 3-2:
Compound Group 3-1
AD1-1
AD1-2
AD1-3

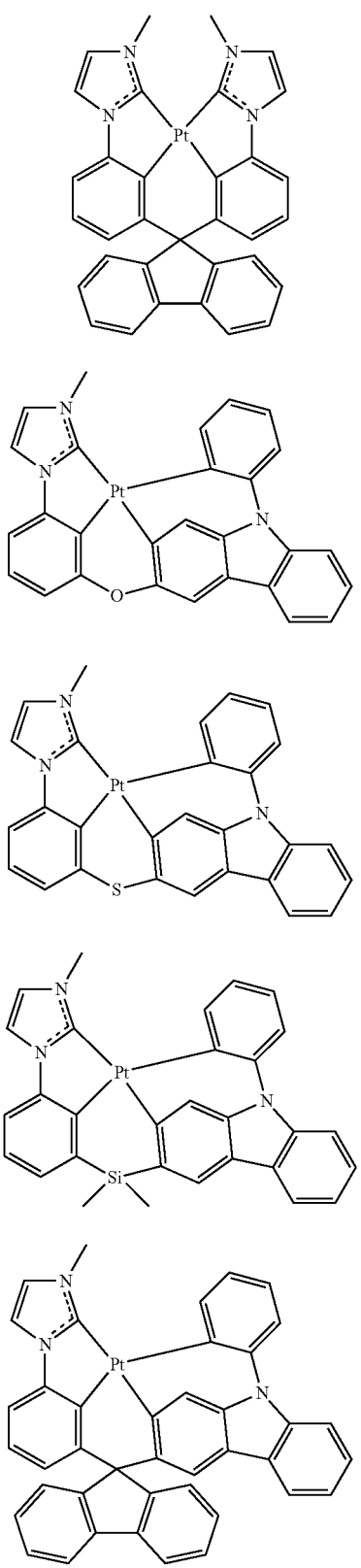
AD1-4
AD1-5
AD1-6
AD1-7
AD1-8
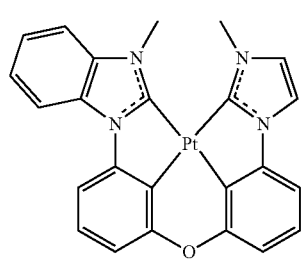
AD1-9
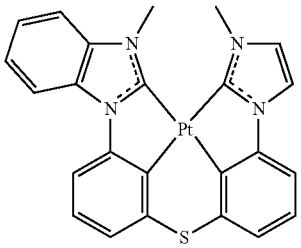
AD1-10
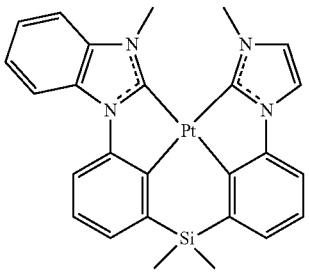
AD1-11
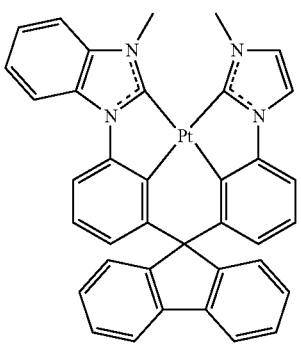
AD1-12
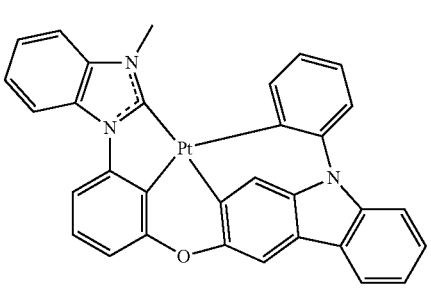
AD1-13

AD1-14
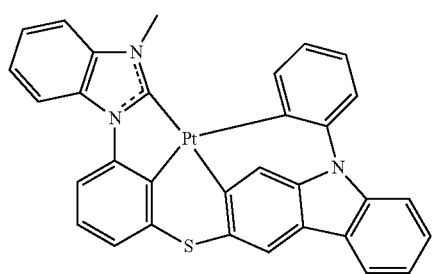
AD1-15
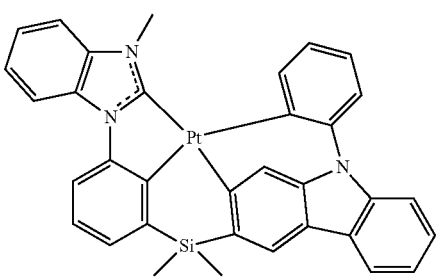
AD1-16
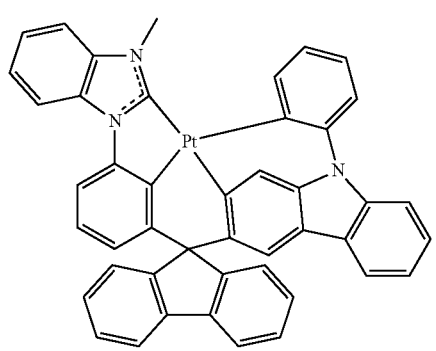
AD1-17
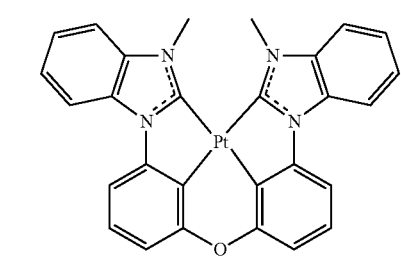
AD1-18
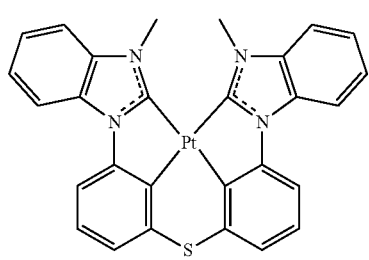
AD1-19
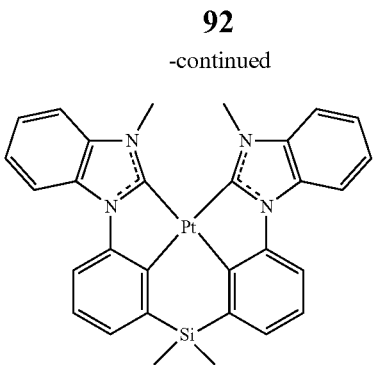
AD1-20
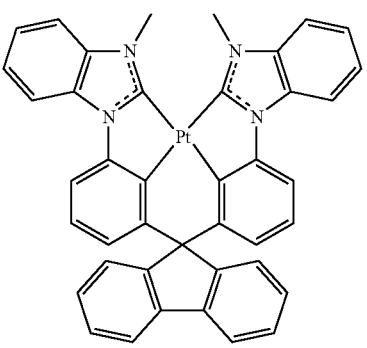
AD1-21
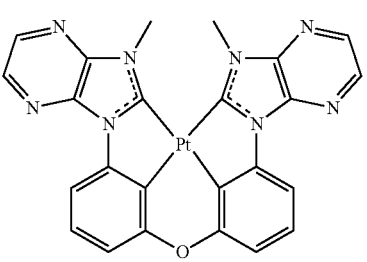
AD1-22
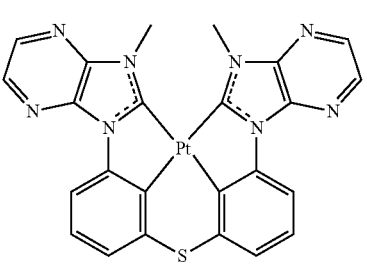
AD1-23
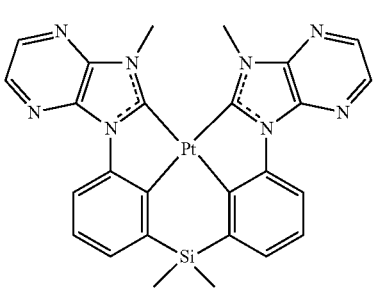

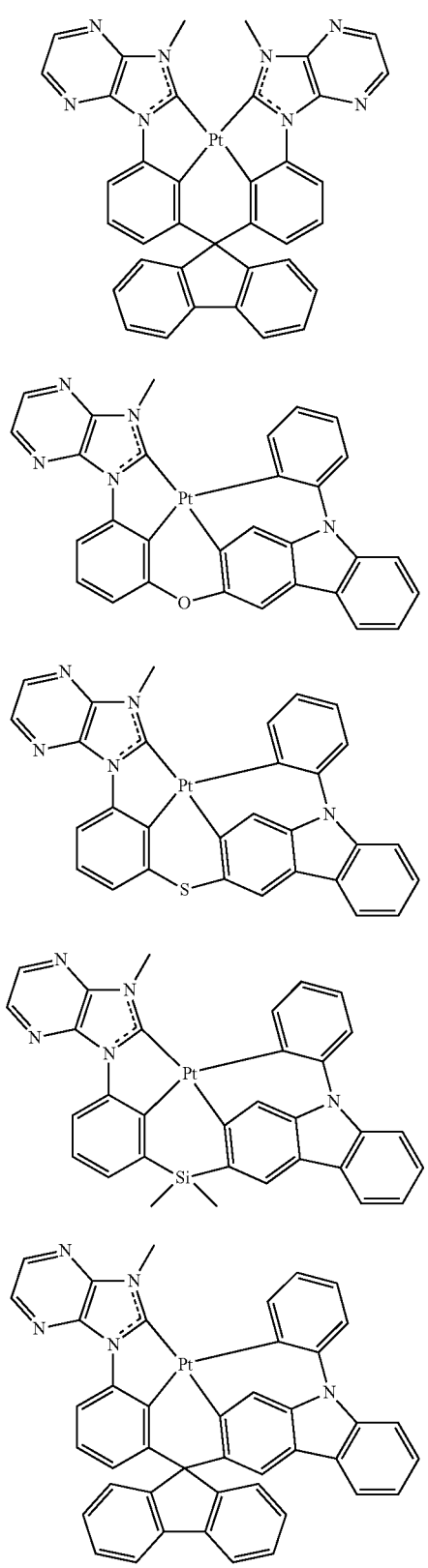
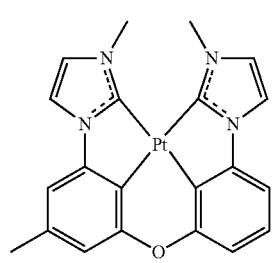
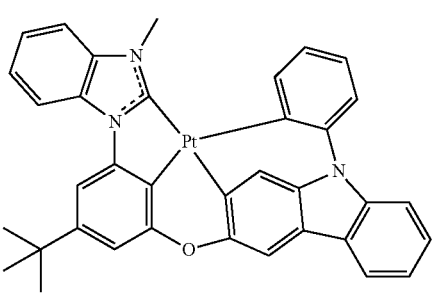

AD1-34
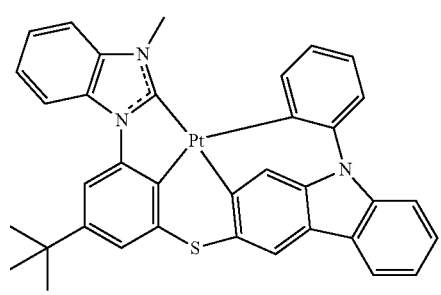
AD1-35
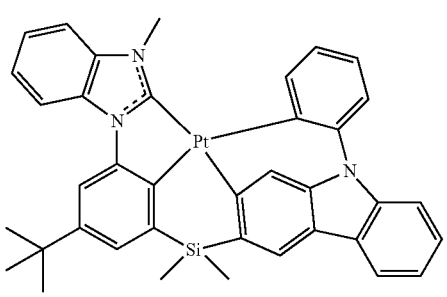
AD1-36
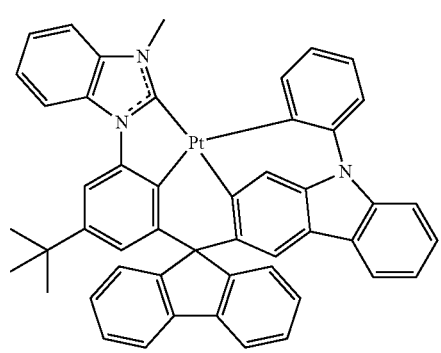
Compound Group 3-2
AD2-1
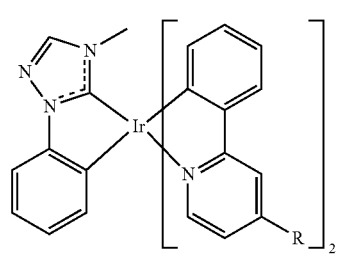
AD2-2
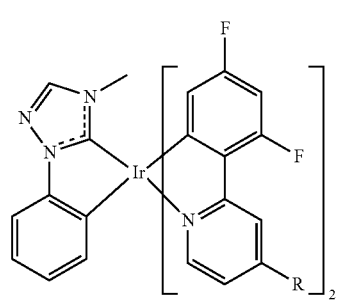
AD2-3
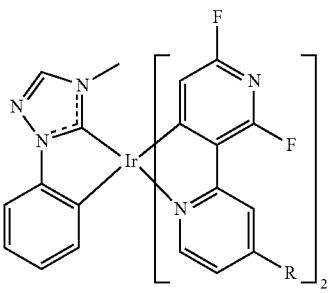
AD2-4
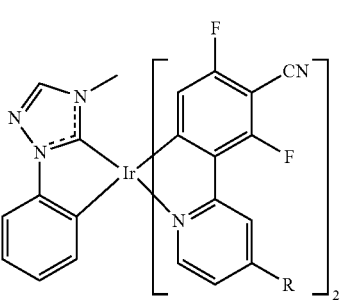
AD2-5
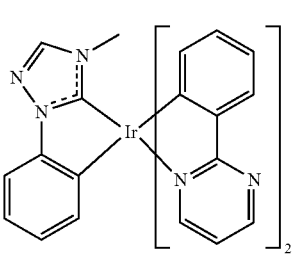
AD2-6
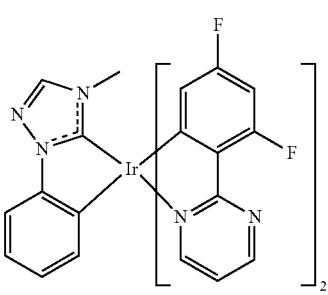
AD2-7
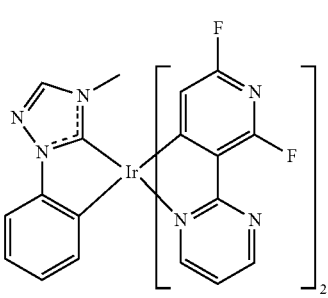

AD2-8
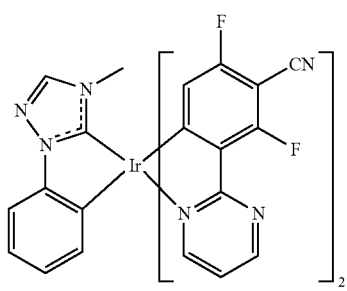
AD2-9
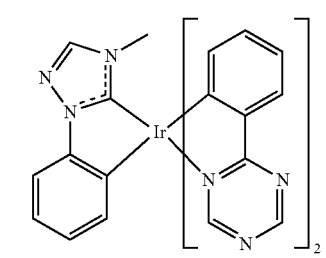
AD2-10
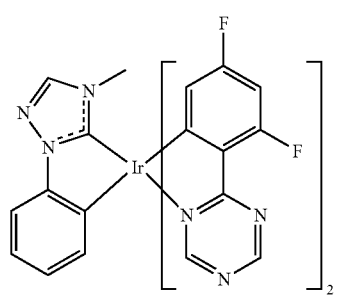
AD2-11
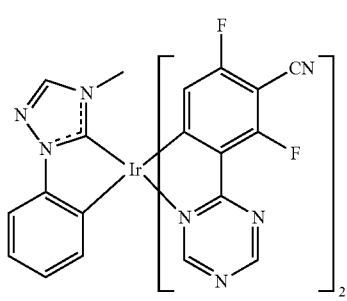
AD2-12
AD2-13
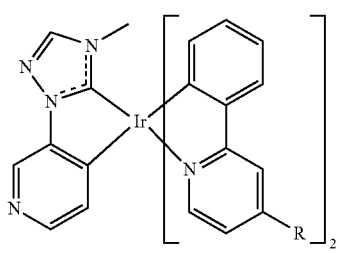
AD2-14
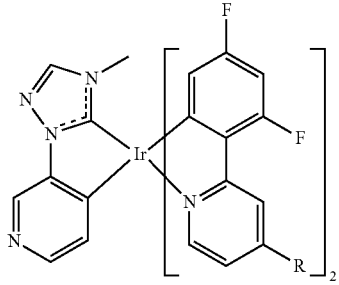
AD2-15
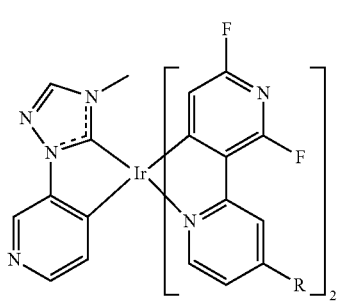
AD2-16
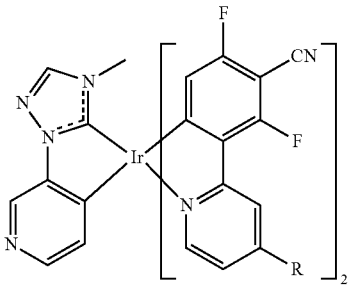
AD2-17
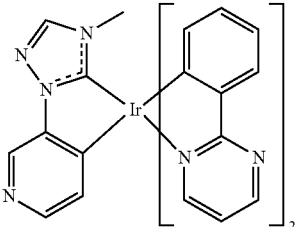

AD2-18
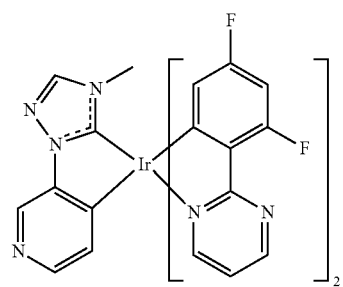
AD2-19
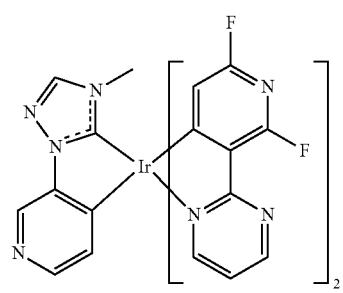
AD2-20
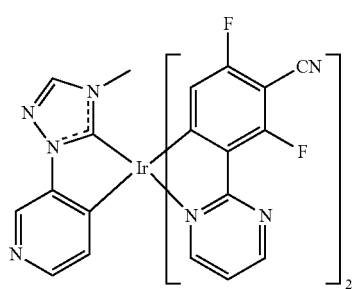
AD2-21
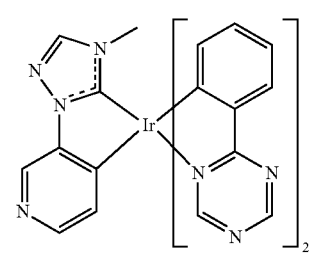
AD2-22
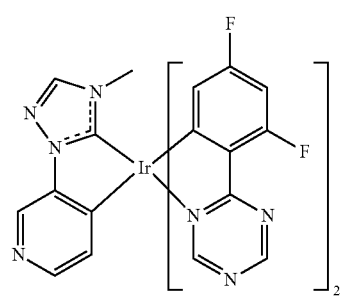
AD2-23
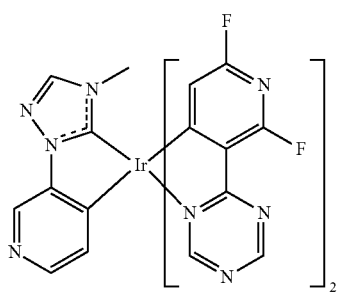
AD2-24
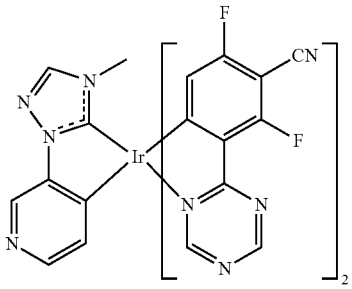
AD2-25
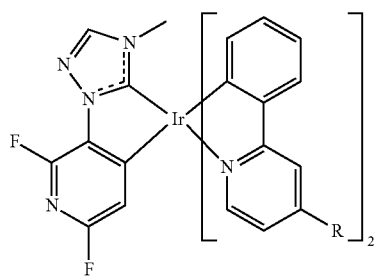
AD2-26
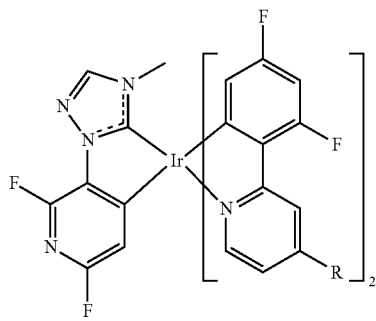
AD2-27
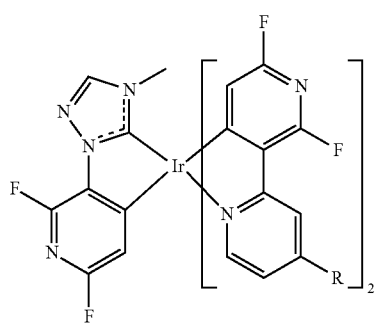

AD2-28
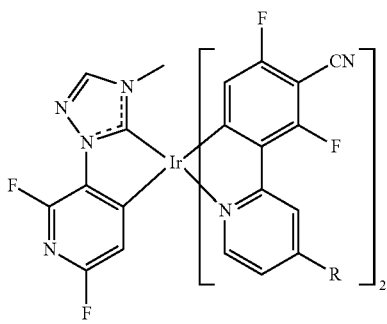
AD2-29
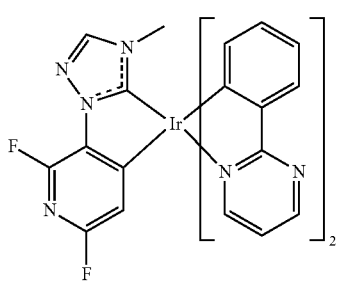
AD2-30
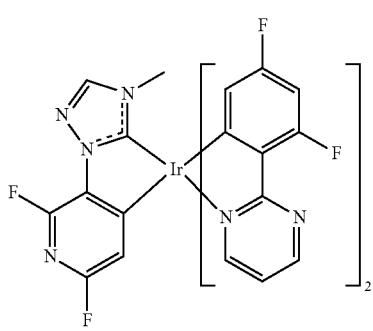
AD2-31
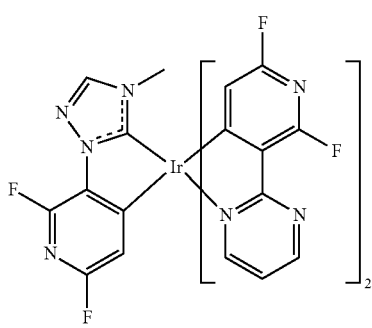
AD2-32
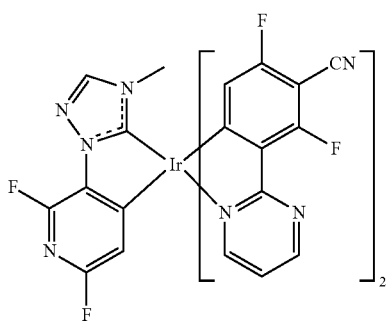
AD2-33
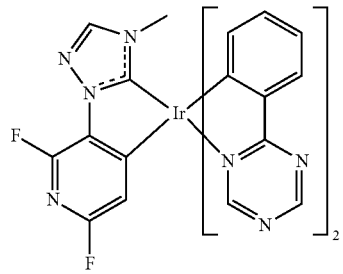
AD2-34
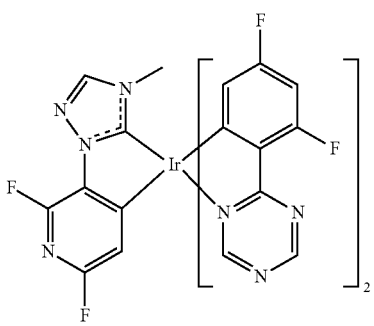
AD2-35
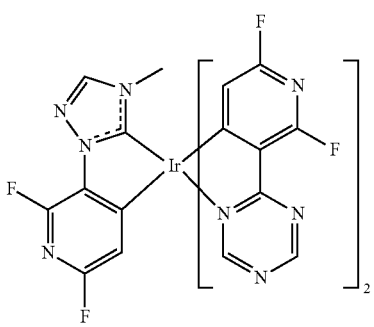
AD2-36
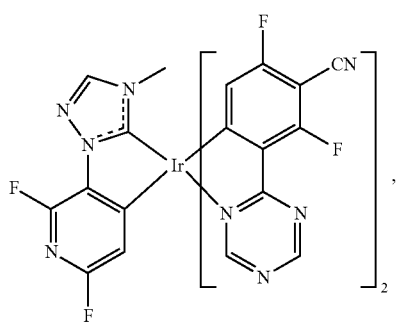
and
wherein in each of Compound Group 3-2, in AD2-1 to AD2-4, AD2-13 to AD2-16, and AD2-25 to AD2-28, R is independently a hydrogen atom, a methyl group, an isopropyl group, a tert-butyl group, or a dimethylamine group.
12. The organic electroluminescence device of claim 1, wherein the second dopant comprises at least one compound selected from Compound Group 4:

Compound Group 4
TD-01
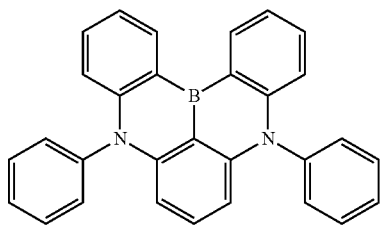
TD-02
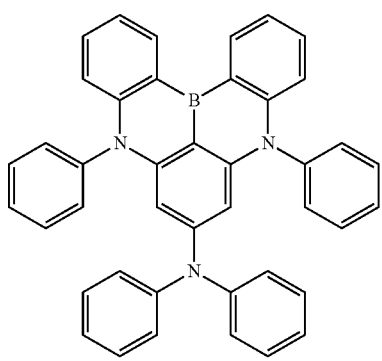
TD-03
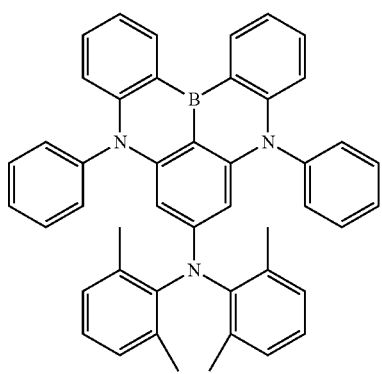
TD-04
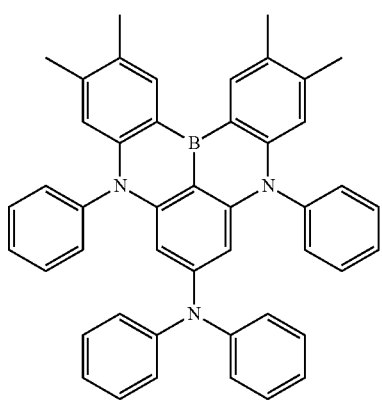
TD-05
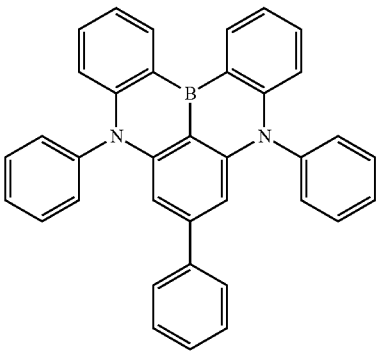
TD-06
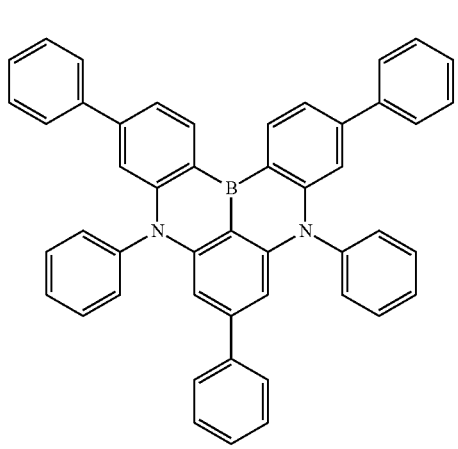
TD-07
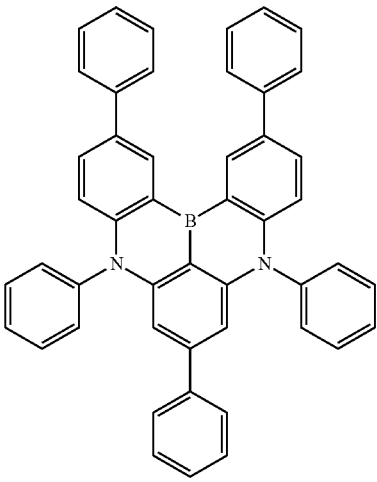

TD-08
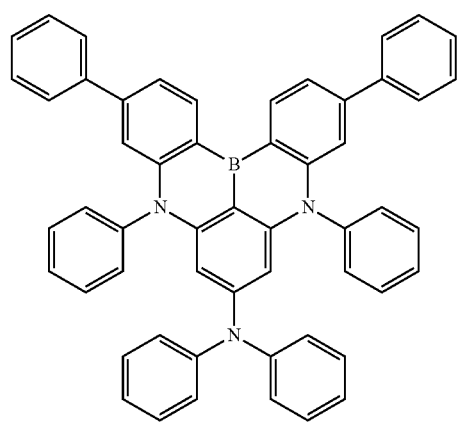
TD-09
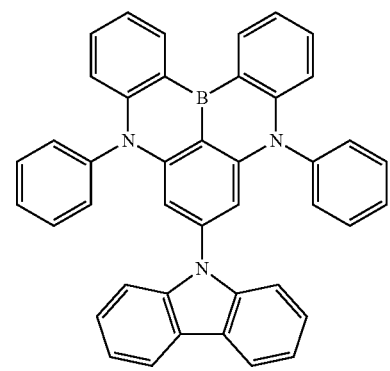
TD-10
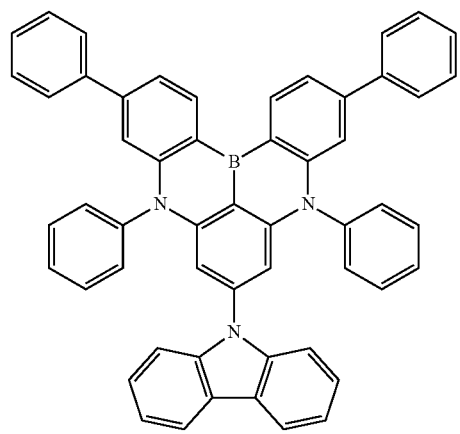
TD-11
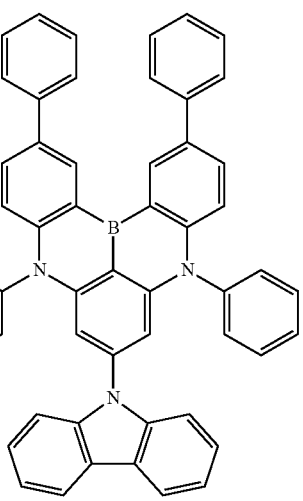
TD-12
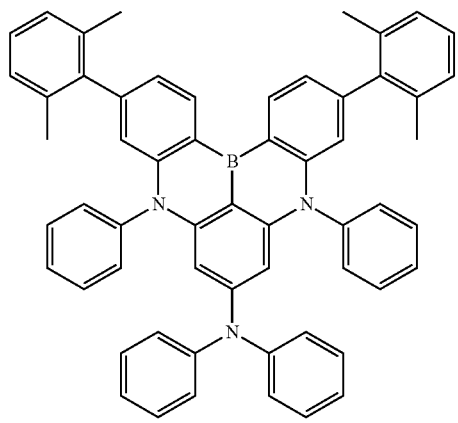
TD-13
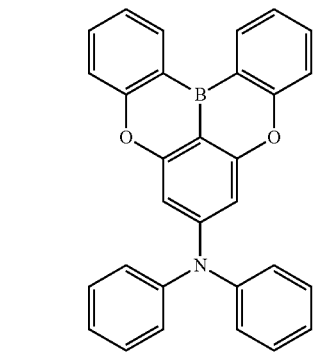
TD-14
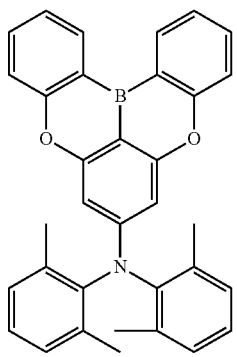

TD-15
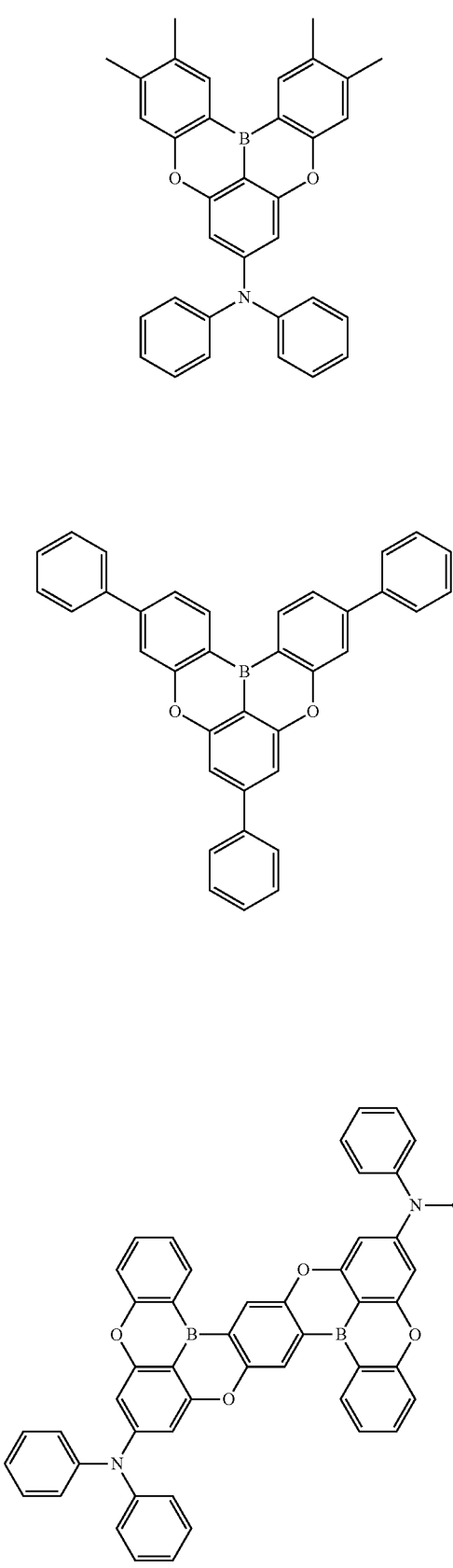
TD-16
TD-17
TD-18
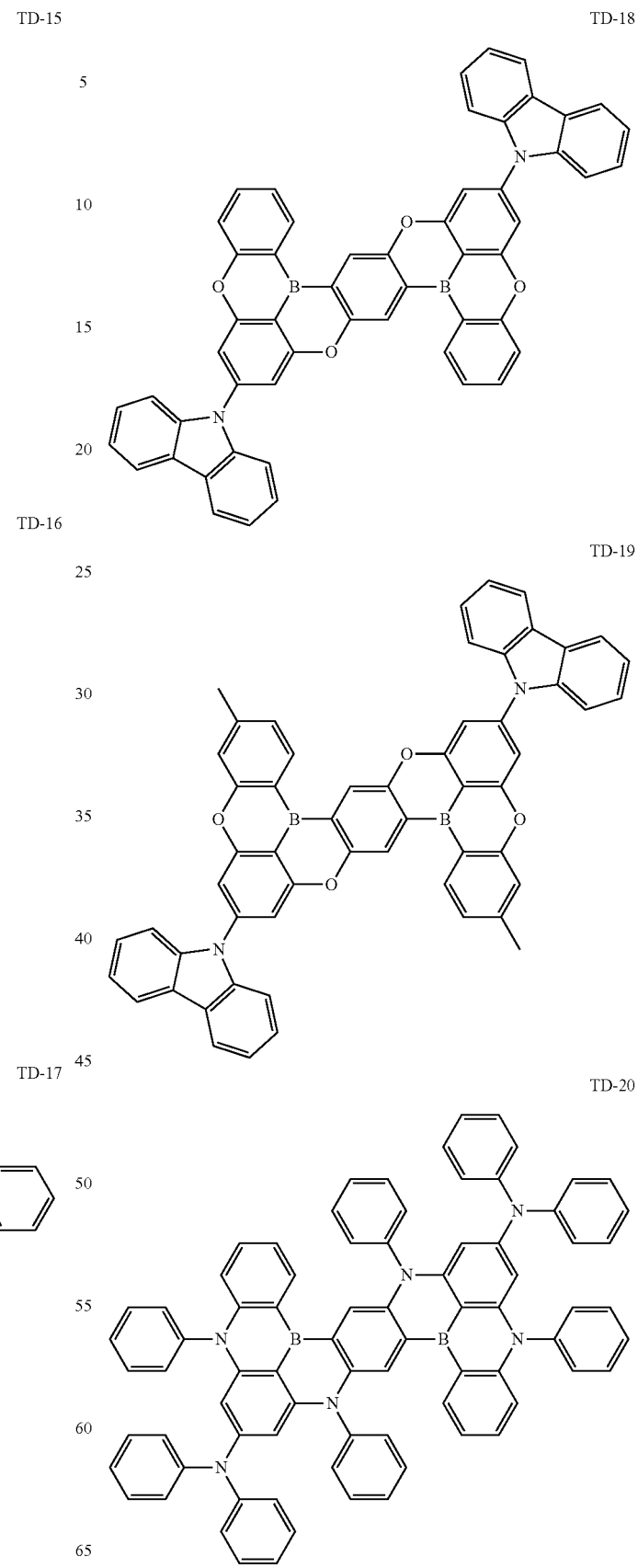
TD-19
TD-20

TD-21

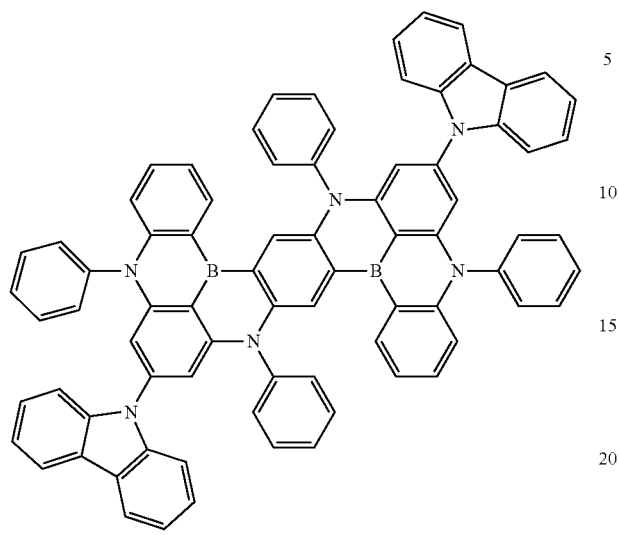

TD-22

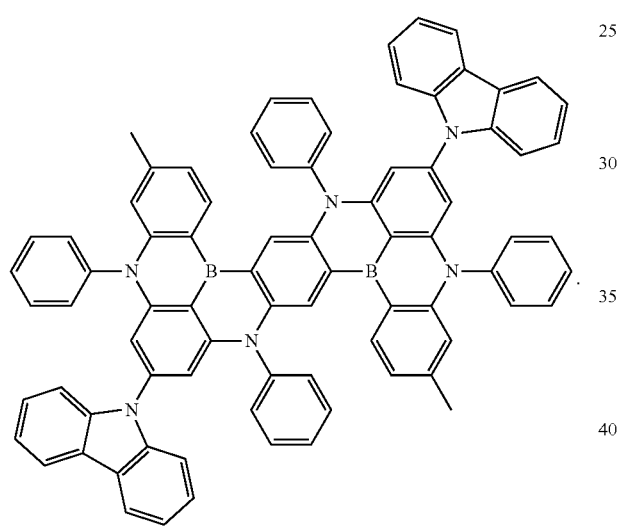

13. The organic electroluminescence device of claim 1, wherein the emission layer is to emit blue fluorescence.
14. The organic electroluminescence device of claim 1, wherein the lowest triplet exciton energy level of the first dopant is higher than the lowest triplet exciton energy level of the second dopant.
15. An organic electroluminescence device comprising:
a first electrode;
a second electrode on the first electrode; and
an emission layer between the first electrode and the second electrode,
wherein the emission layer comprises:
a first host represented by Formula H-1;
a second host represented by Formula H-2;
a first dopant represented by Formula D-1a or Formula D-1b; and
a second dopant as a delayed fluorescence emitter,
wherein the lowest triplet exciton energy level of the first dopant is higher than the lowest triplet exciton energy level of the second dopant:

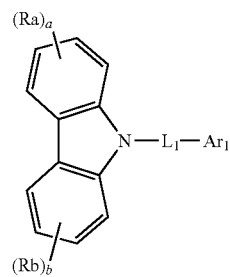

Formula H-1

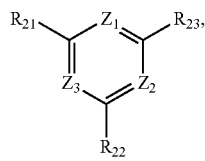

Formula H-2 wherein in Formula H-1, $L_1$ is a direct linkage, a substituted or unsubstituted arylene group having 6 to 30 carbon atoms for forming a ring, or a substituted or unsubstituted heteroarylene group having 2 to 30 carbon atoms for forming a ring, $Ar_1$ is a substituted or unsubstituted aryl group having 6 to 30 carbon atoms for forming a ring, or a substituted or unsubstituted heteroaryl group having 2 to 30 carbon atoms for forming a ring, a and b are each independently an integer of 0 to 4, and $R_a$ and $R_b$ are each independently a substituted or unsubstituted aryl group having 6 to 30 carbon atoms for forming a ring, or a substituted or unsubstituted heteroaryl group having 2 to 30 carbon atoms for forming a ring, in Formula H-2, $Z_1$ to $Z_3$ are each independently $CR_y$ or N, and $R_y$ and $R_{21}$ to $R_{23}$ are each independently a hydrogen atom, a deuterium atom, a cyano group, a substituted or unsubstituted silyl group, a substituted or unsubstituted aryl group having 6 to 30 carbon atoms for forming a ring, or a substituted or unsubstituted heteroaryl group having 2 to 30 carbon atoms for forming a ring,

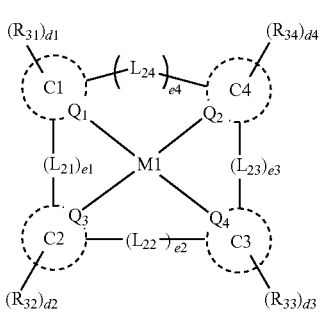

Formula D-1a

-continued

Formula D-1b

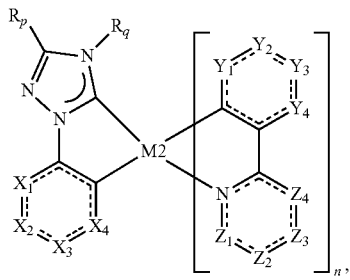

and
wherein in Formula D-1a,
M1 is Pt, Pd, Cu, or Os,
$Q_1$ to $Q_4$ are each independently C or N,
C1 to C4 are each independently a substituted or unsubstituted hydrocarbon ring having 5 to 30 carbon atoms for forming a ring, or a substituted or unsubstituted heterocyclic ring having 2 to 30 carbon atoms for forming a ring,
$L_{21}$ to $L_{24}$ are each independently a direct linkage, *—O—*, *—S—

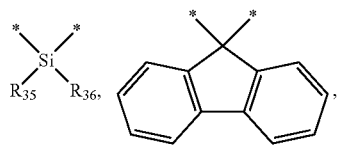

a substituted or unsubstituted alkyl group having 1 to 20 carbon atoms, a substituted or unsubstituted arylene group having 6 to 30 carbon atoms for forming a ring, or a substituted or unsubstituted heteroarylene group having 2 to 30 carbon atoms for forming a ring,
e1 to e4 are each independently 0 or 1,
$R_{31}$ to $R_{36}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{31}$ to $R_{36}$ are optionally combined with an adjacent group to form a ring, and
d1 to d4 are each independently an integer of 0 to 4,
in Formula D-1b,
M2 is Ir, Ru, or Rh,
n is 1 or 2,
$X_1$ to $X_4$, $Y_1$ to $Y_4$, and $Z_1$ to $Z_4$ are each independently CRn or N, and
$R_p$, $R_q$, and $R_n$ are each independently a hydrogen atom, a deuterium atom, a halogen atom, a cyano group, a substituted or unsubstituted alkyl group having 1 to 20 carbon atoms, a substituted or unsubstituted hydrocarbon ring having 5 to 30 carbon atoms for forming a ring, a substituted or unsubstituted heterocyclic ring having 2 to 30 carbon atoms for forming a ring, or a substituted or unsubstituted amine group, and any of $R_p$, $R_q$, and $R_n$ are optionally combined with an adjacent group to form a ring.

16. The organic electroluminescence device of claim 15, wherein the second dopant is represented by Formula D-2:

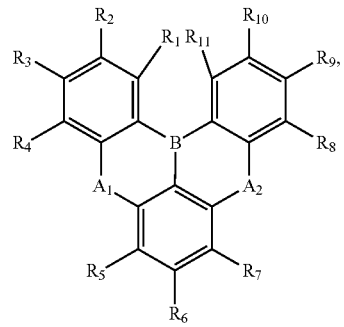

Formula D-2 and
wherein in Formula D-2,
$A_1$ and $A_2$ are each independently $NR_m$ or O,
$R_m$ is a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group of 2 to 30 carbon atoms for forming a ring, and
$R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and any of $R_1$ to $R_{11}$ are optionally combined with an adjacent group to form a ring.

17. The organic electroluminescence device of claim 16, wherein the second host is represented by Formula H-2a, and the first dopant is represented by Formula D-1a-1 or Formula D-1b-1:

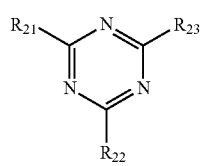

Formula H-2a

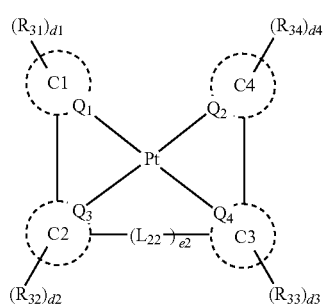

[Formula D-1a-1]

-continued

[Formula D-1b-1]

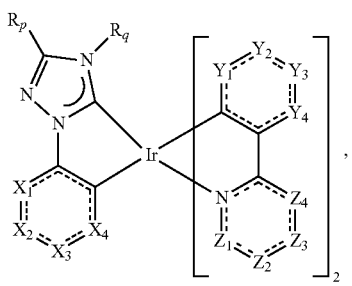

and
wherein in Formula H-2a, $R_{21}$ to $R_{23}$ are the same as those defined in Formula H-2, in Formula D-1a-1, C1 to C4, $Q_1$ to $Q_4$, $R_{31}$ to $R_{34}$, d1 to d4, $L_{22}$, and e2 are the same as those defined in Formula D-1a, and in Formula D-1 b-1, $X_1$ to $X_4$, $Y_1$ to $Y_4$, $Z_1$ to $Z_4$, $R_p$, and $R_q$ are the same as those defined in Formula D-1b.

18. The organic electroluminescence device of claim 16, wherein the second host is represented by Formula H-2b, and the first dopant is represented by the following Formula D-1a-1 or Formula D-1b-1:

Formula H-2b

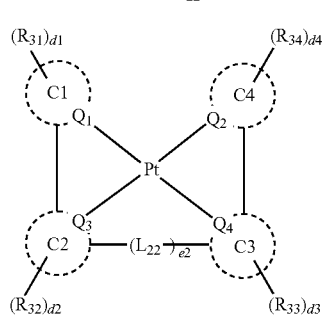

[Formula D-1a-1]

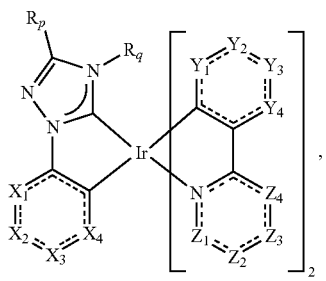

[Formula D-1b-1]

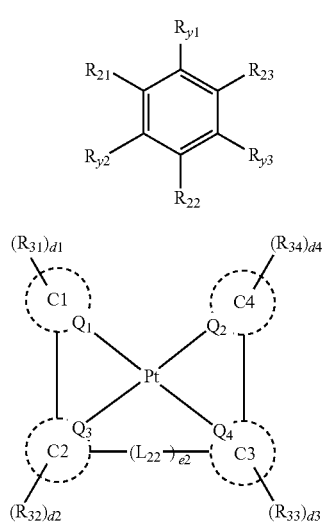

and
wherein, in Formula H-2b,
$R_{21}$ to $R_{23}$ and $R_{y1}$ to $R_{y3}$ are each independently a hydrogen atom, a deuterium atom, a cyano group, a substituted or unsubstituted silyl group, a substituted or unsubstituted aryl group having 6 to 30 carbon atoms for forming a ring, or a substituted or unsubstituted heteroaryl group having 2 to 30 carbon atoms for forming a ring, and at least one selected from $R_{21}$ to $R_{23}$ and $R_{y1}$ to $R_{y3}$ is a cyano group, an aryl group having 6 to 30 carbon atoms for forming a ring and comprising at least one cyano group as a substituent, or a heteroaryl group having 2 to 30 carbon atoms for forming a ring and comprising at least one cyano group as a substituent, in Formula D-1a-1, C1 to C4, $Q_1$ to $Q_4$, $R_{31}$ to $R_{34}$, and d1 to d4 are the same as those defined in Formula D-1a, and in Formula D-1b-1, $X_1$ to $X_4$, $Y_1$ to $Y_4$, $Z_1$ to $Z_4$, $R_p$, and $R_q$ are the same as those defined in Formula D-1b.

19. The organic electroluminescence device of claim 15, wherein the first host comprises at least one compound selected from Compound Group 1:

Compound Group 1

HT-01

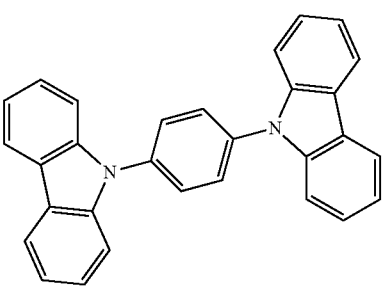

HT-02

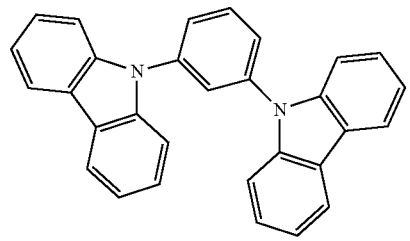

HT-03

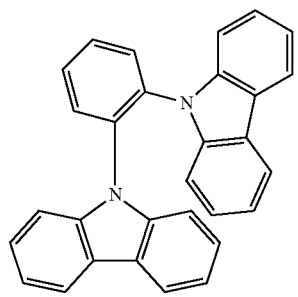

HT-04
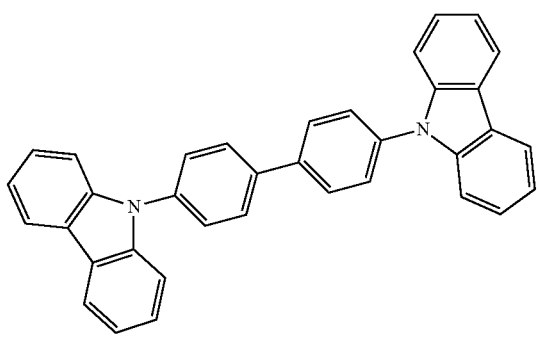
HT-05
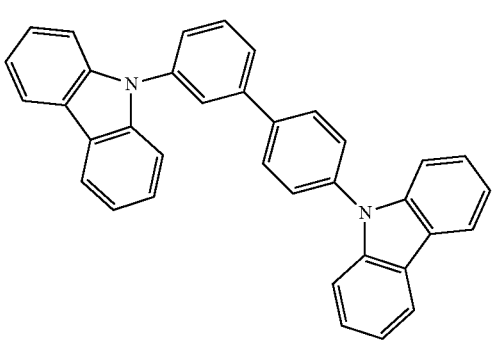
HT-06
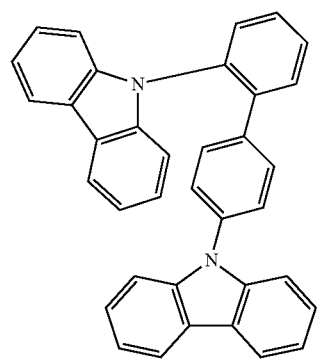
HT-07
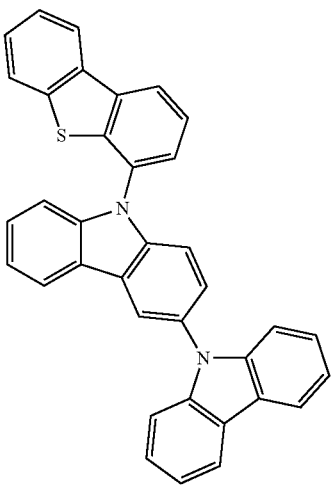
HT-08
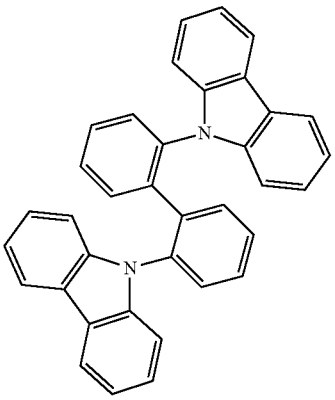
HT-09
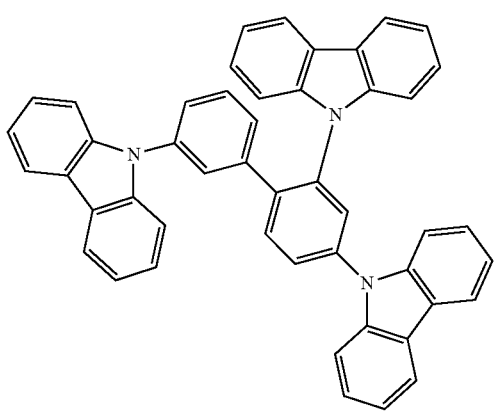
HT-10

HT-11
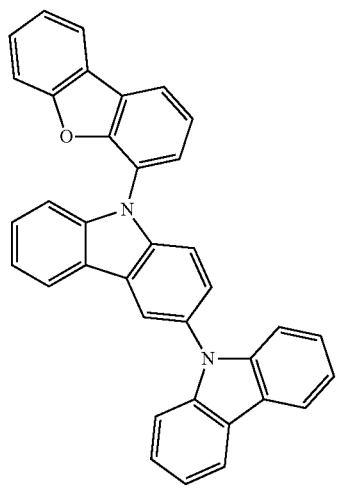
HT-12
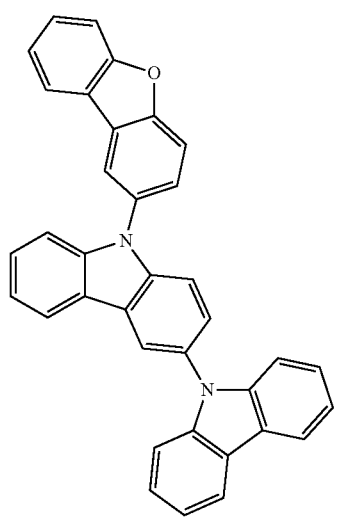
HT-13
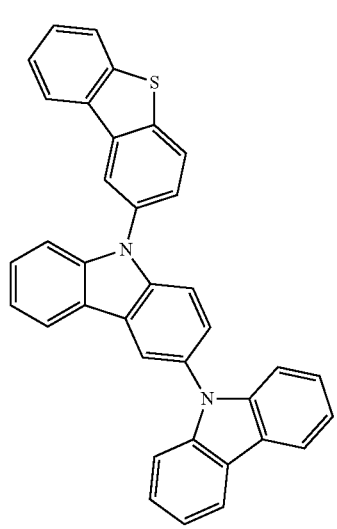
HT-14
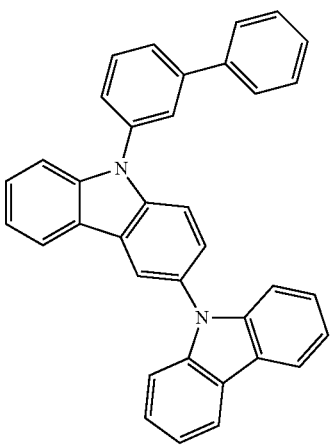
HT-15
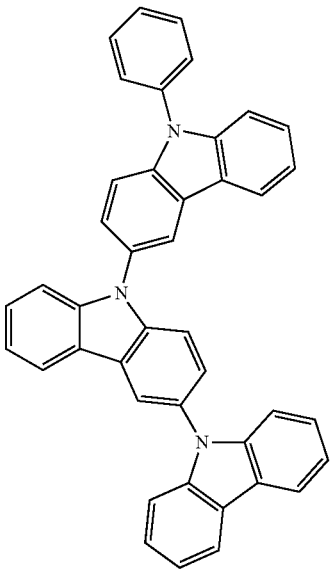
HT-16
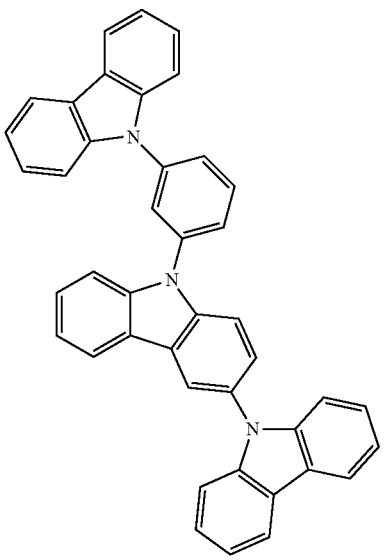

HT-17
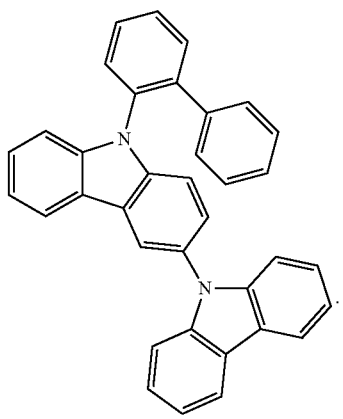
20. The organic electroluminescence device of claim 15, wherein the second host comprises at least one compound selected from Compound Group 2-1 and Compound Group 2-2:
Compound Group 2-1
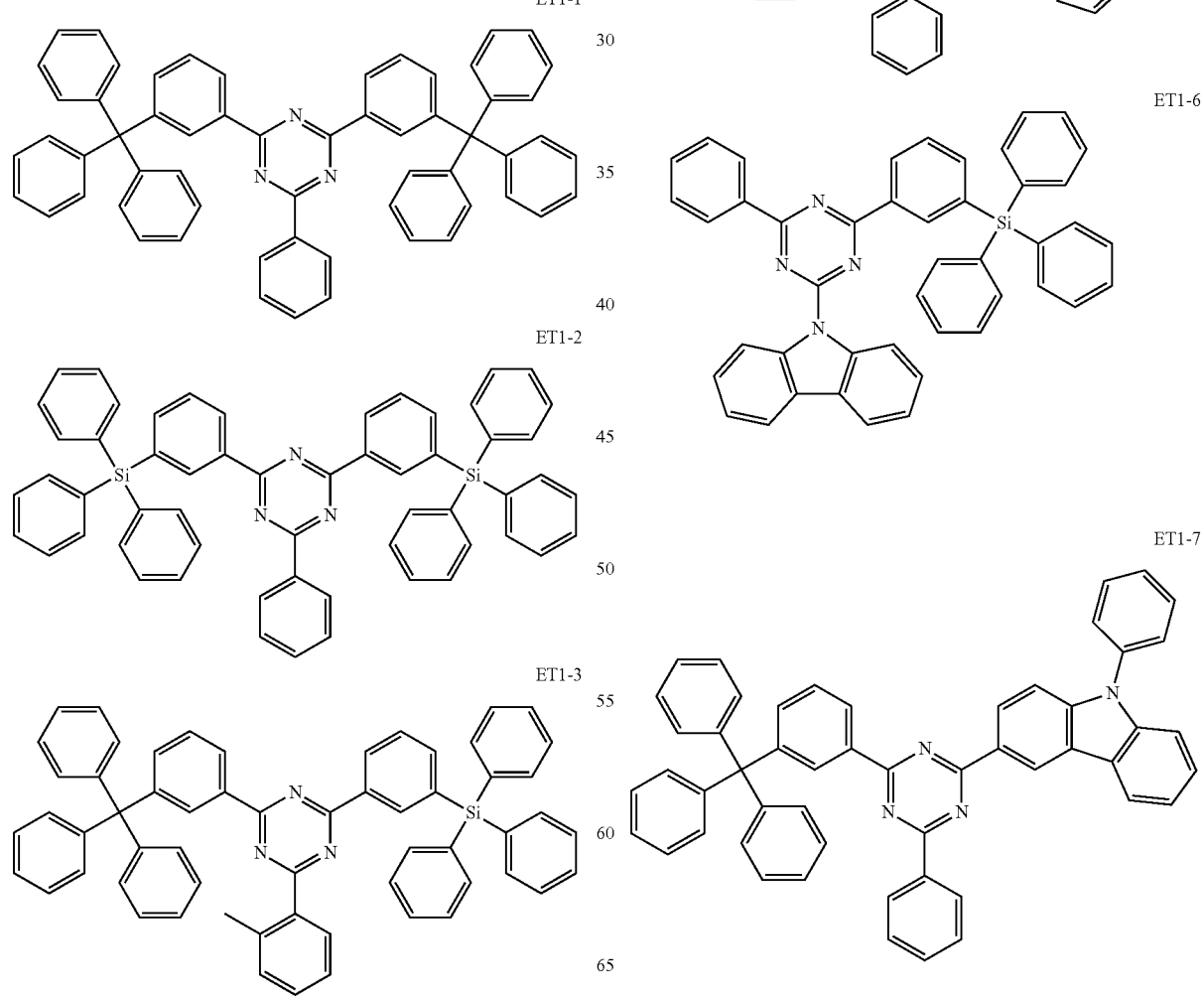
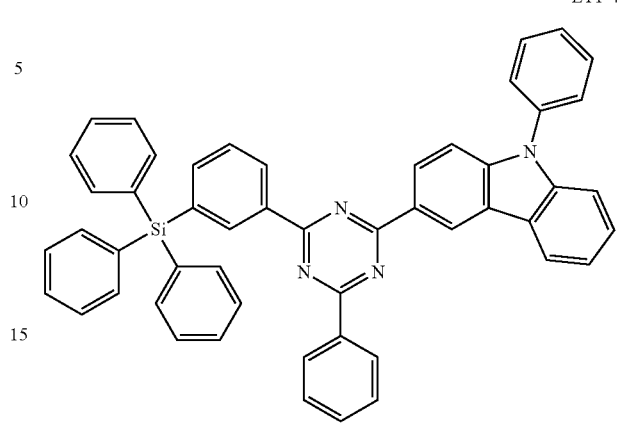

ET1-8
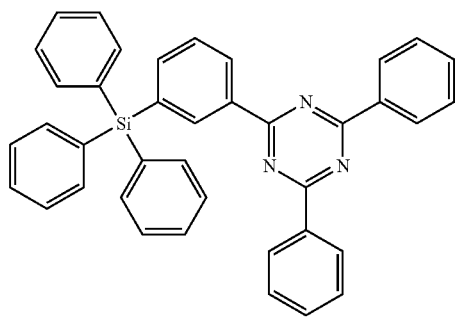
ET1-9
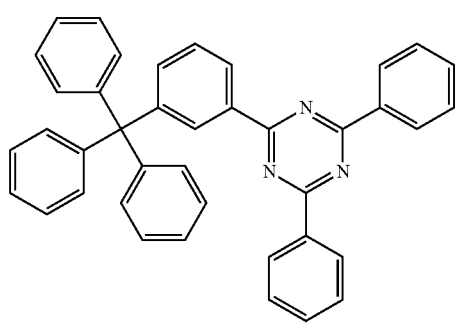
ET1-10
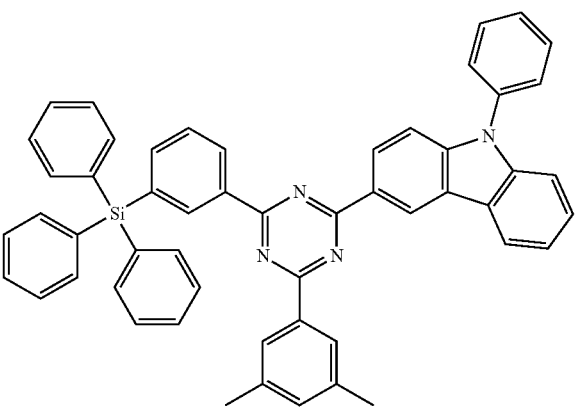
ET1-11
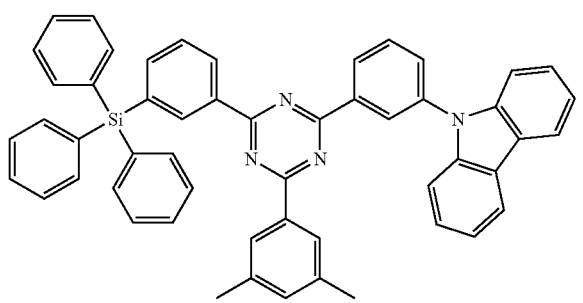
ET1-12
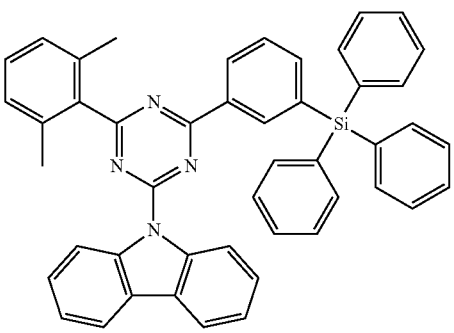
ET1-13
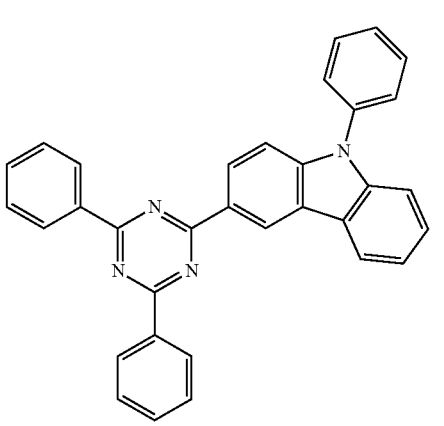
ET1-14
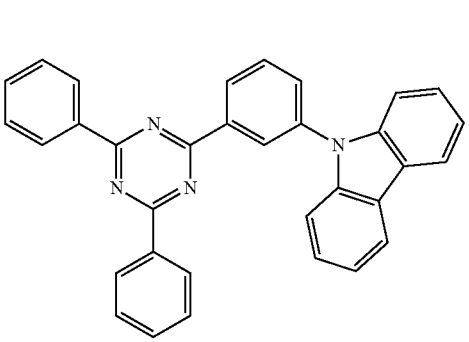
ET1-15
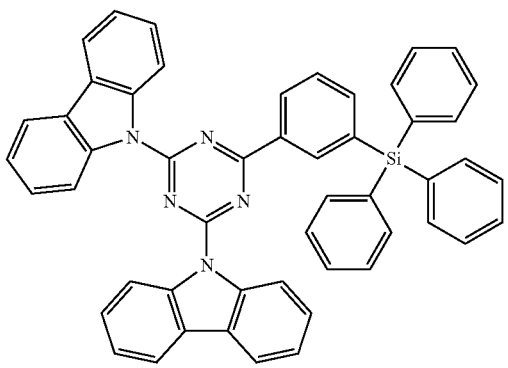

-continued
Compound Group 2-2
ET2-1
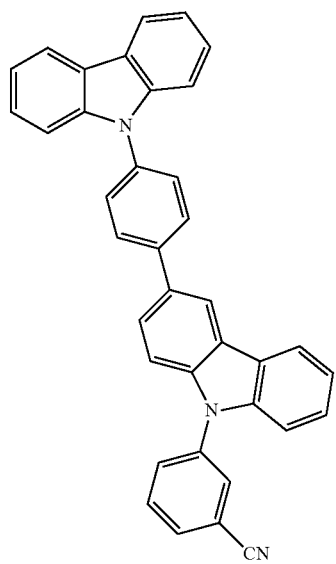
ET2-2
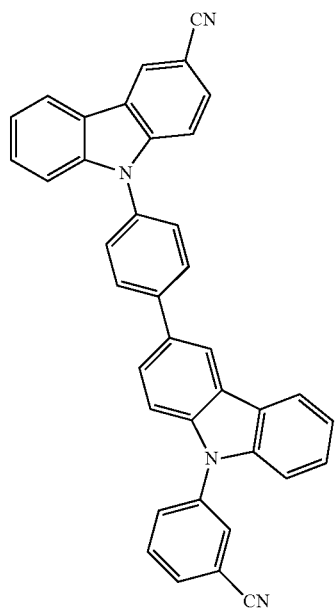
-continued
ET2-3
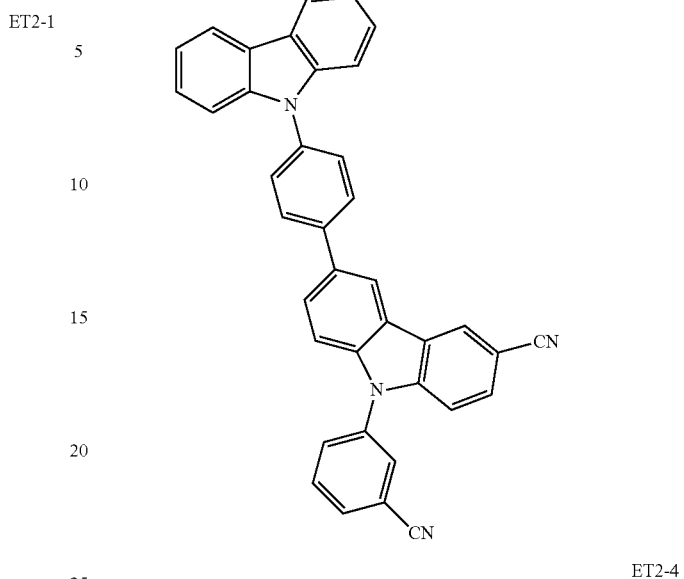
ET2-4
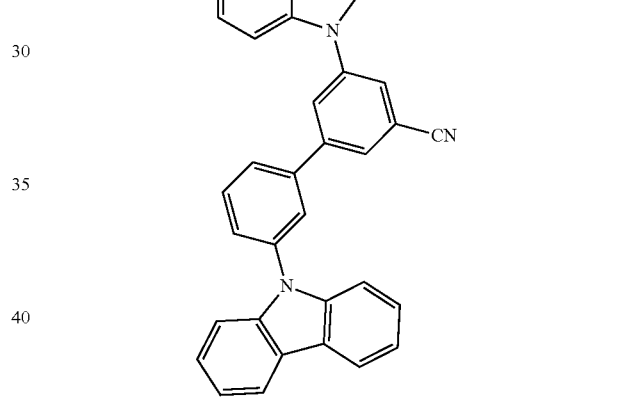
ET2-5
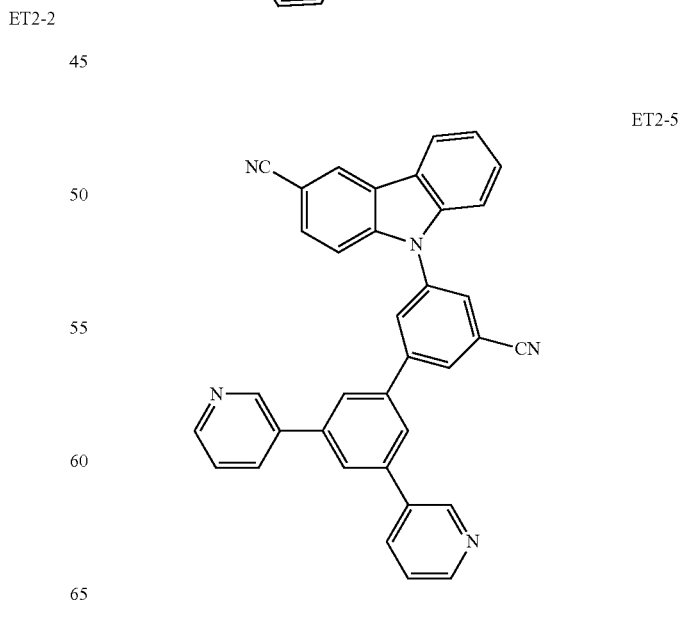

ET2-6
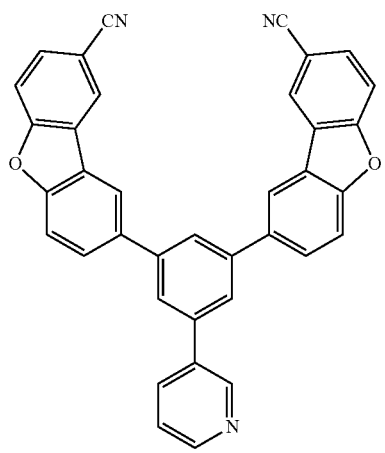
ET2-7
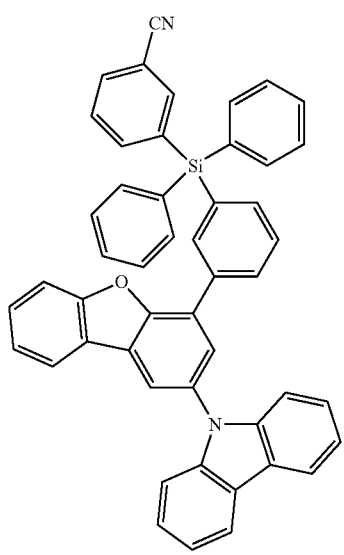
ET2-8
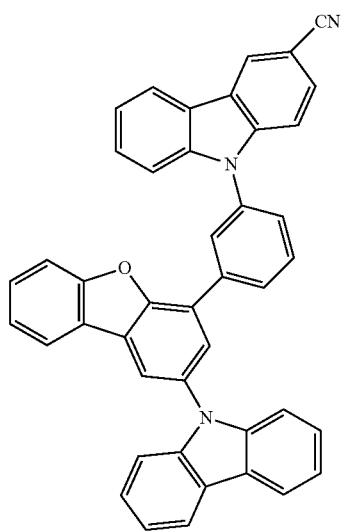
ET2-9
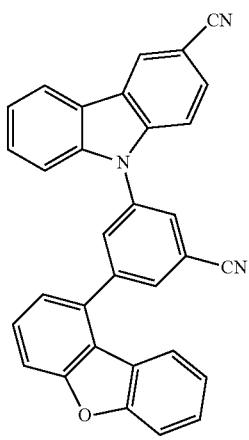
ET2-10
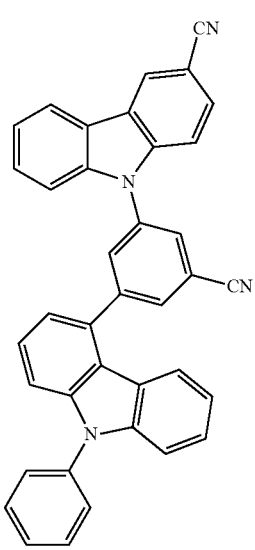
ET2-11
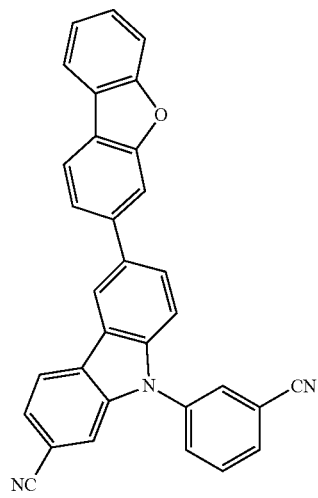

ET2-12
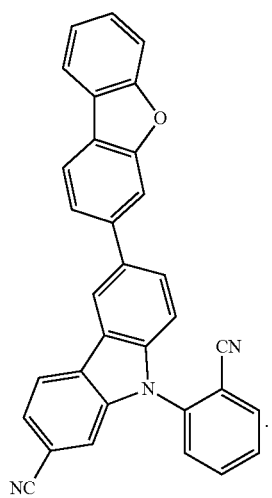
21. The organic electroluminescence device of claim 16, wherein the first dopant comprises at least one compound selected from Compound Group 3-1 and Compound Group 3-2:
Compound Group 3-1
AD1-1
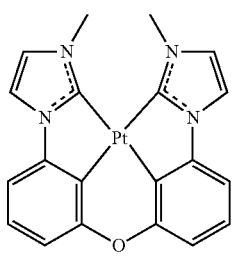
AD1-2
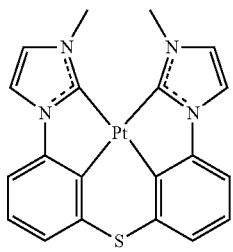
AD1-3
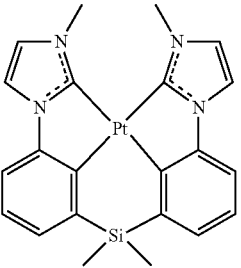
AD1-4
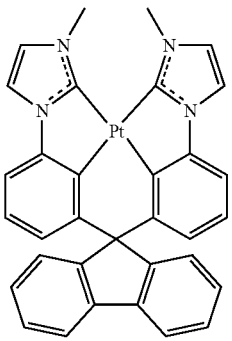
AD1-5
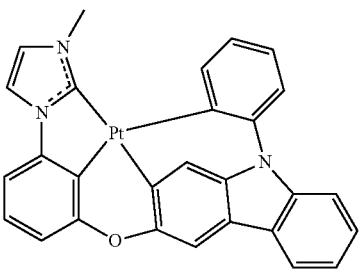
AD1-6
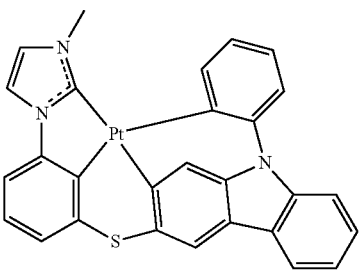
AD1-7
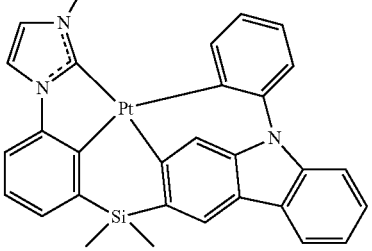
AD1-8
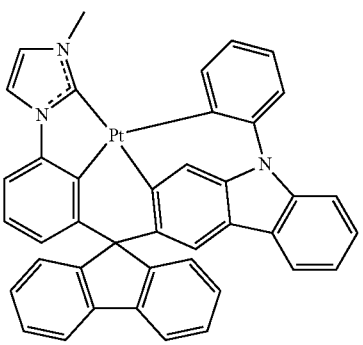

AD1-9
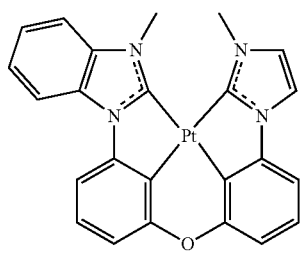
AD1-10
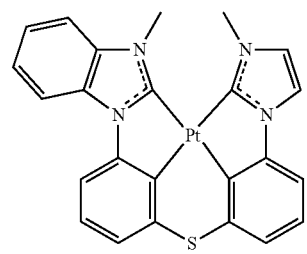
AD1-11
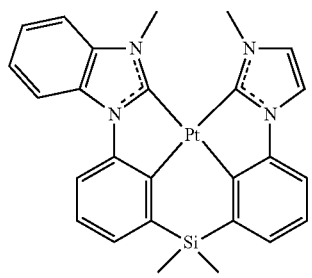
AD1-12
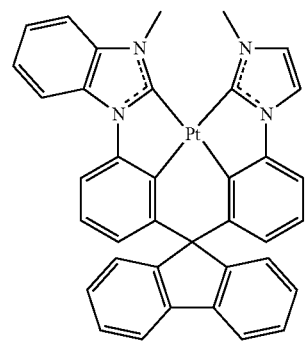
AD1-13
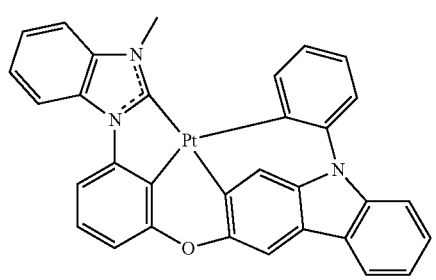
AD1-14
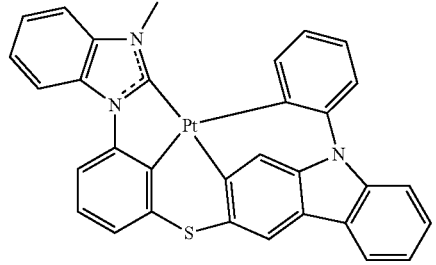
AD1-15
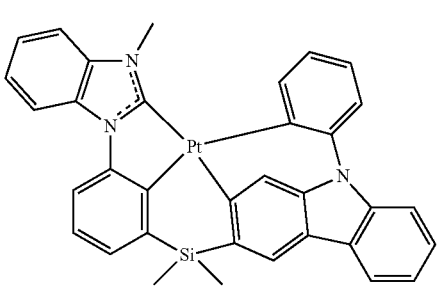
AD1-16
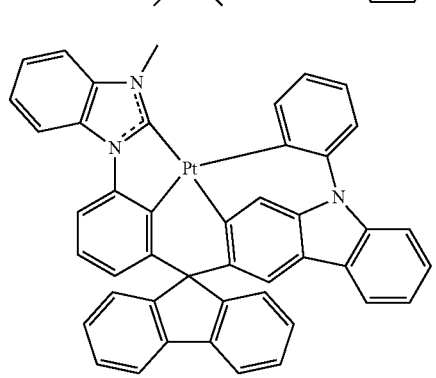
AD1-17
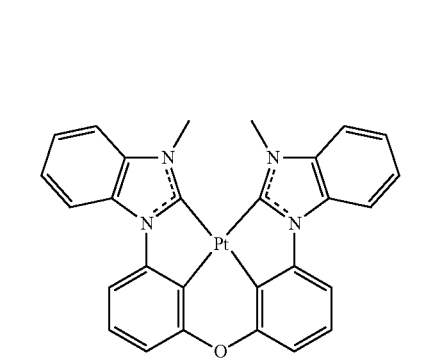
AD1-18
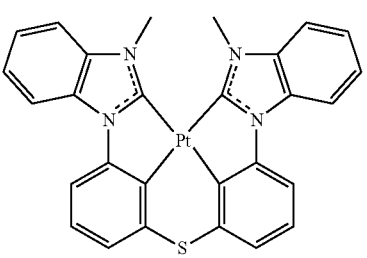

AD1-19
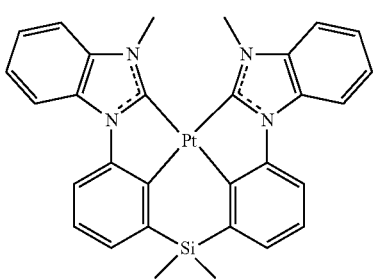
AD1-20
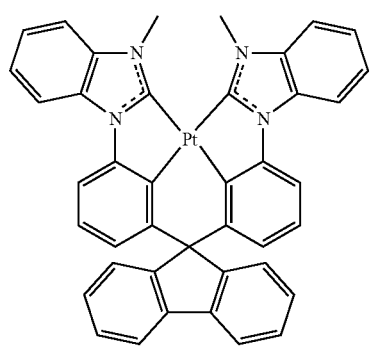
AD1-21
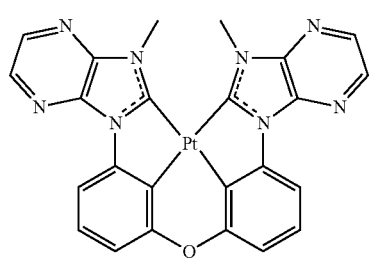
AD1-22
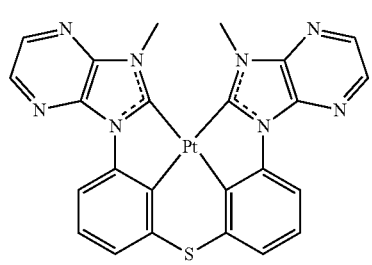
AD1-23
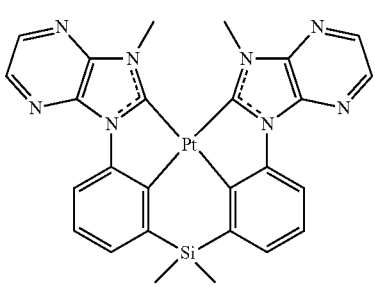
AD1-24
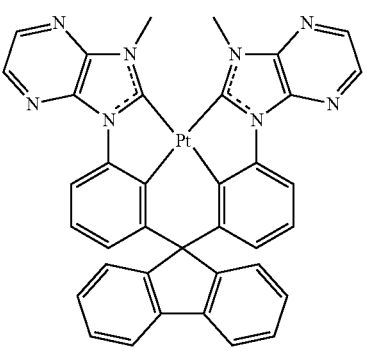
AD1-25
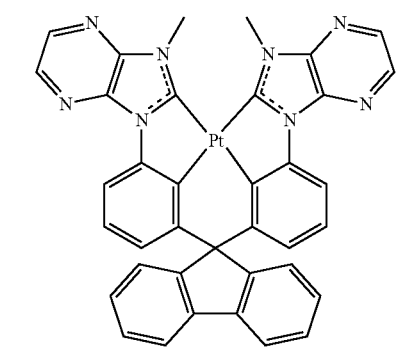
AD1-26
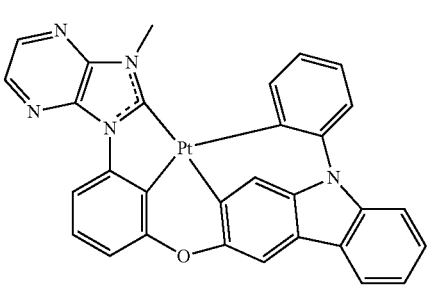
AD1-27
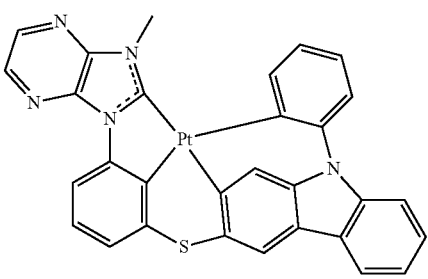
AD1-28
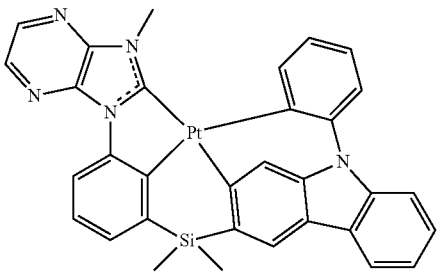

-continued
AD1-29
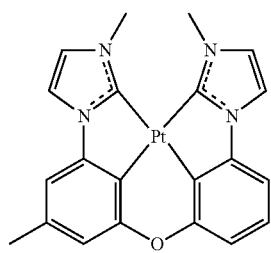
AD1-30
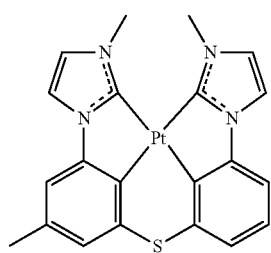
AD1-31
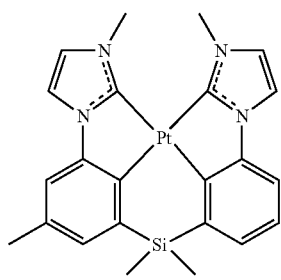
AD1-32
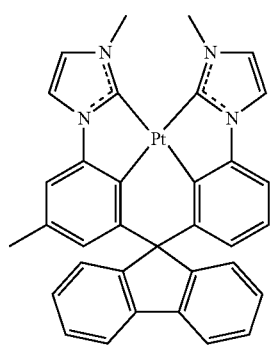
AD1-33
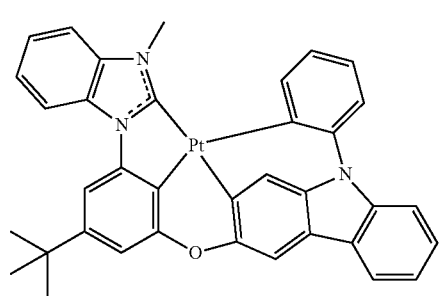
-continued
AD1-34
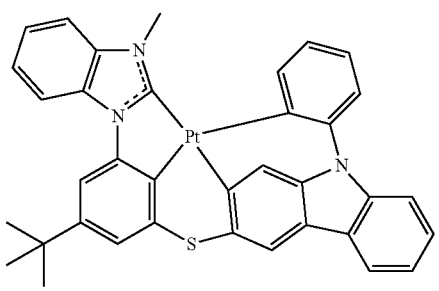
AD1-35
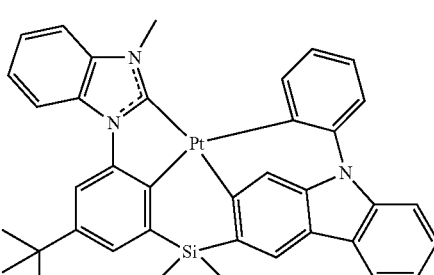
AD1-36
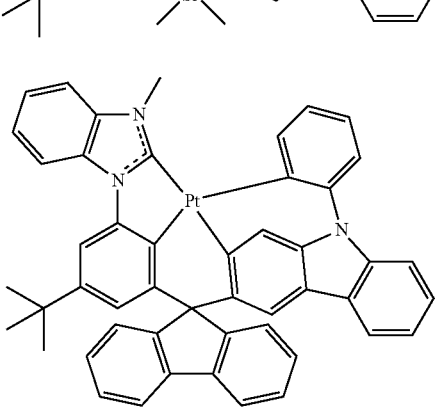
Compound Group 3-2
AD2-1
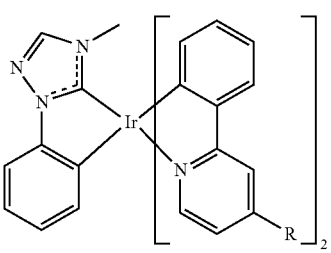
AD2-2
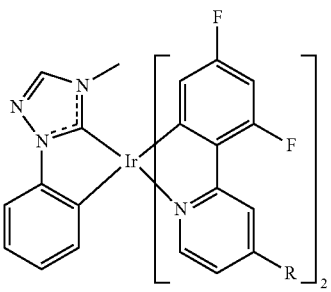

-continued
AD2-3
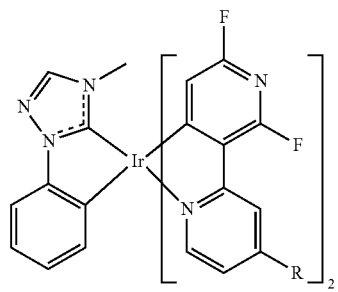
AD2-4
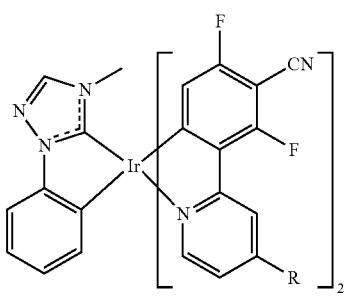
AD2-5
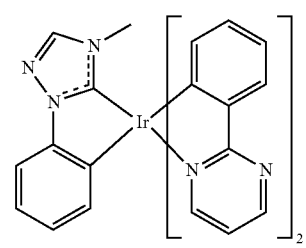
AD2-6
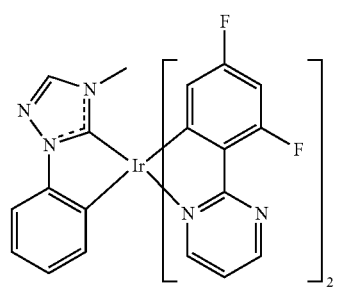
AD2-7
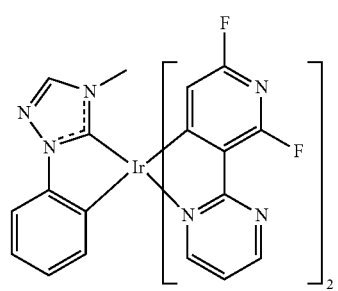
AD2-8
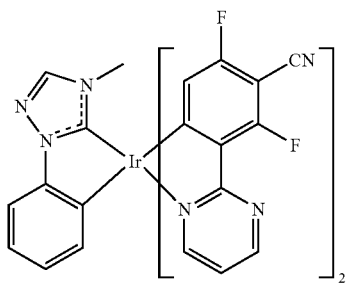
AD2-9
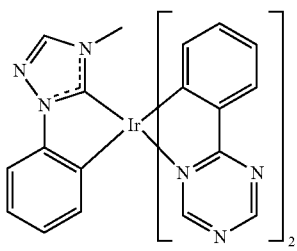
AD2-10
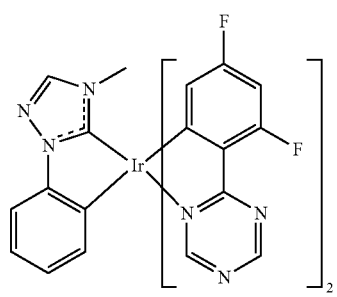
AD2-11
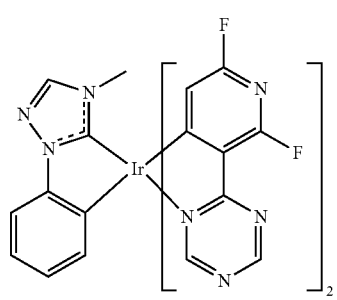
AD2-12
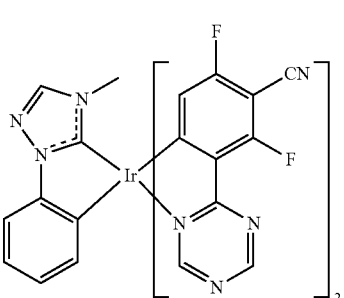

AD2-13
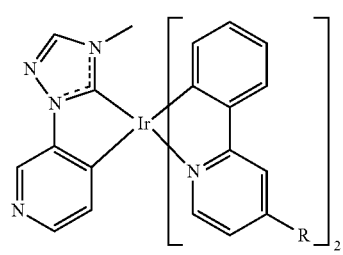
AD2-14
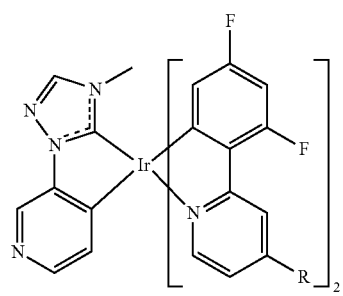
AD2-15
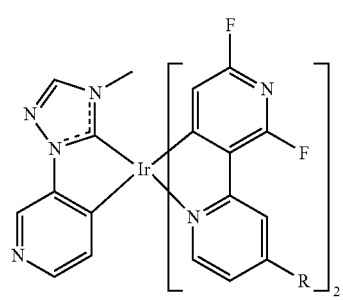
AD2-16
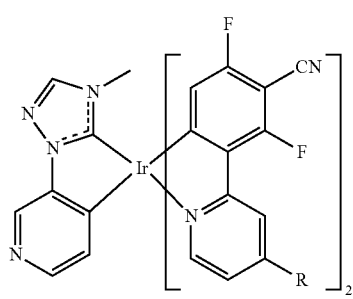
AD2-17
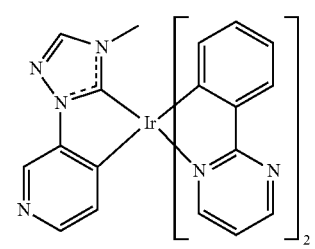
AD2-18
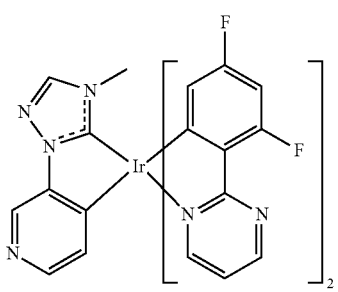
AD2-19
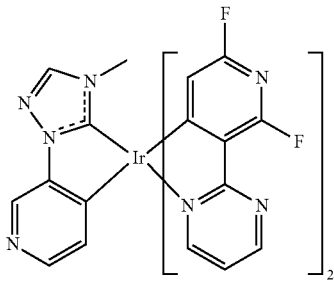
AD2-20
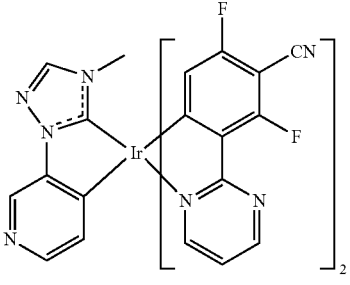
AD2-21
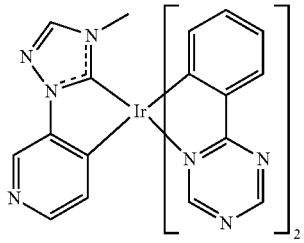
AD2-22
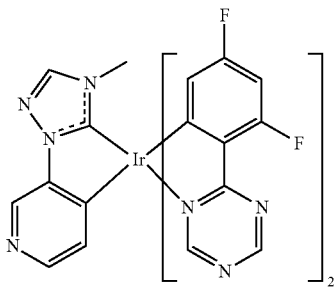

AD2-23
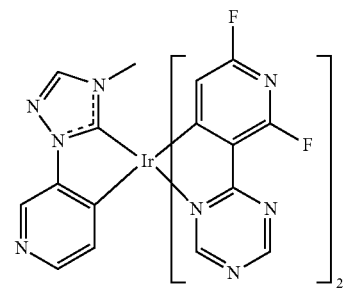
AD2-24
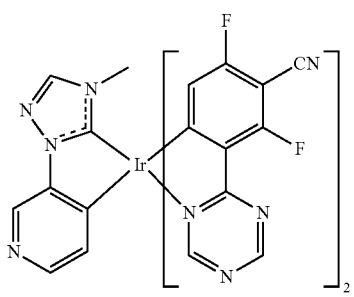
AD2-25
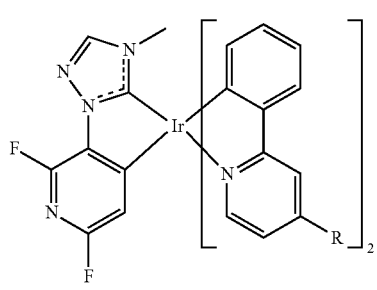
AD2-26
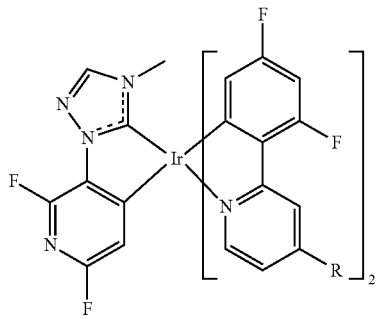
AD2-27
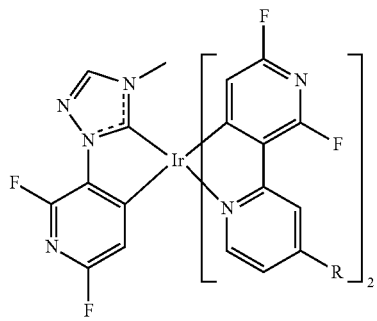
AD2-28
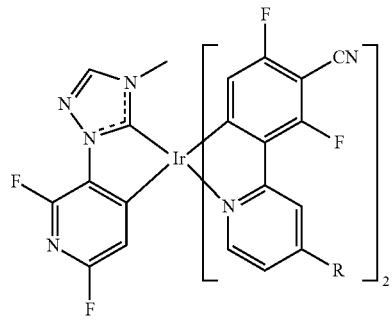
AD2-29
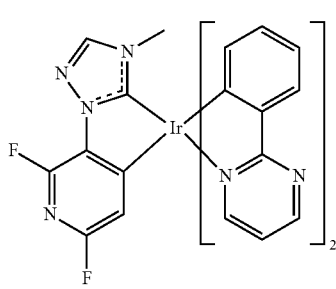
AD2-30
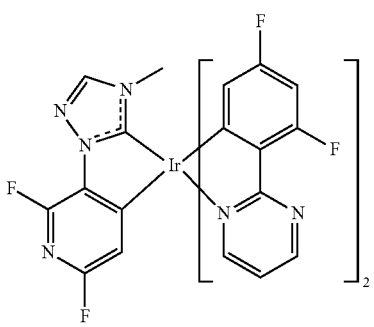
AD2-31
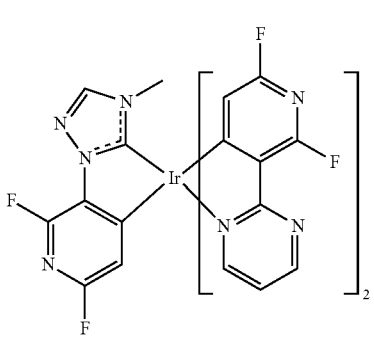
AD2-32
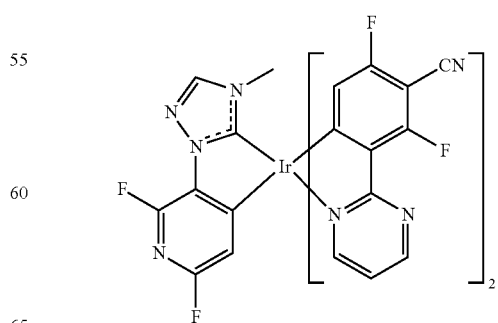

-continued
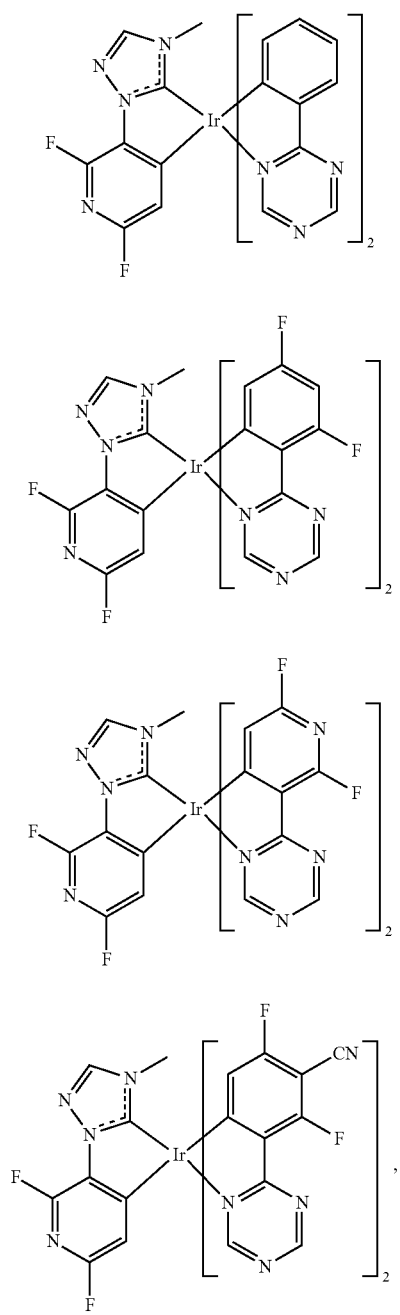
and
wherein, in each of Compound Group 3-2, in AD2-1 to AD2-4, AD2-13 to AD2-16, and AD2-25 to AD2-28, R is independently a hydrogen atom, a methyl group, an isopropyl group, a tert-butyl group, or a dimethylamine group.
22. The organic electroluminescence device of claim 15, wherein the second dopant comprises at least one compound selected from Compound Group 4:
Compound Group 4
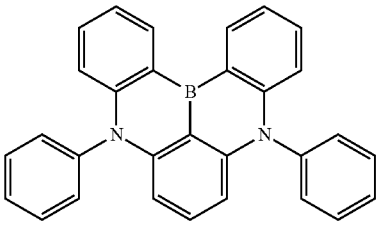
TD-01
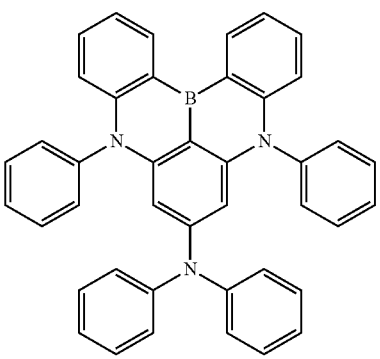
TD-02
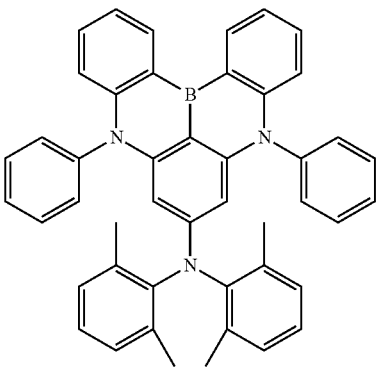
TD-03
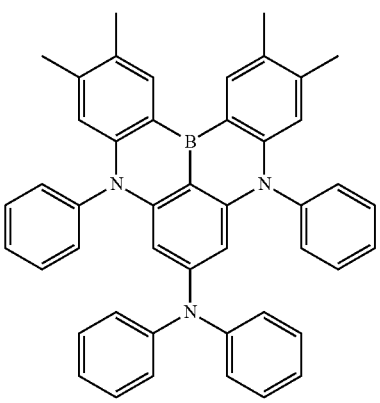
TD-04

TD-05
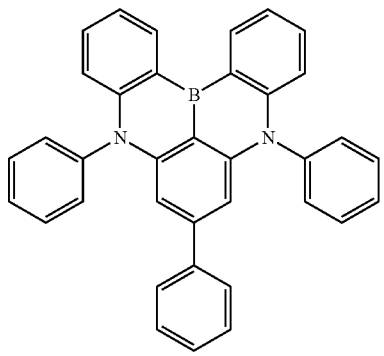
TD-06
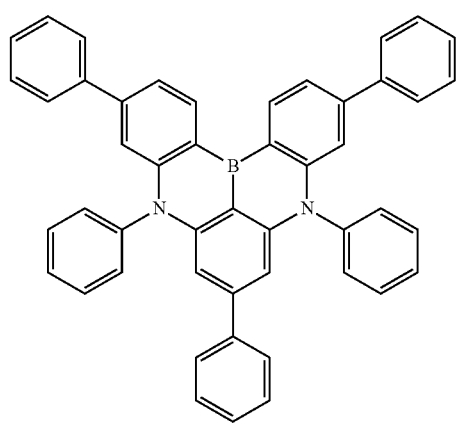
TD-07
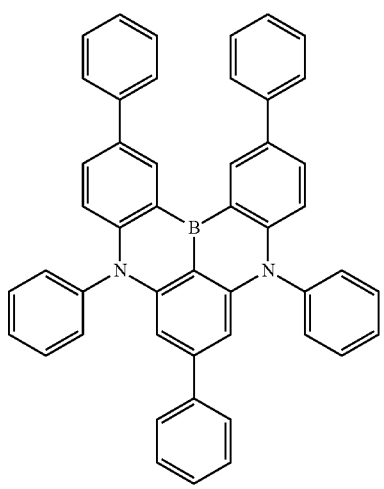
TD-08
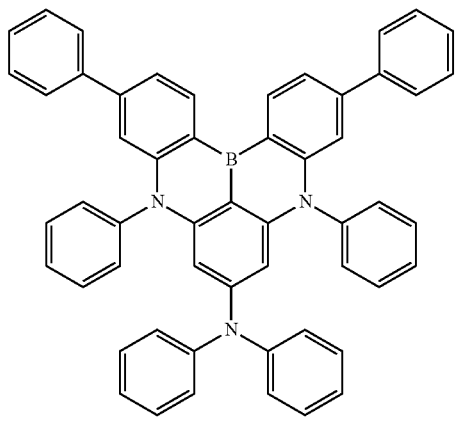
TD-09
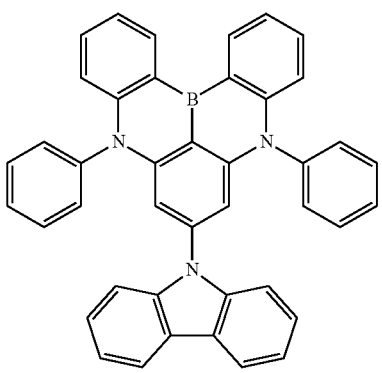
TD-10
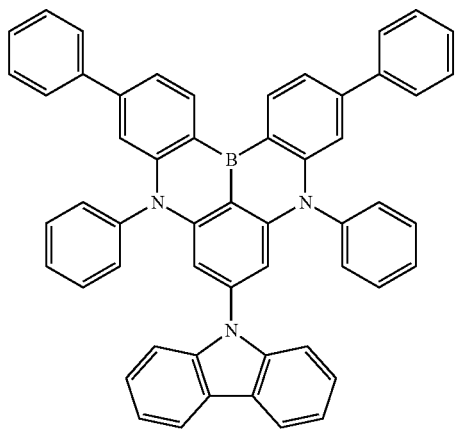

-continued
TD-11
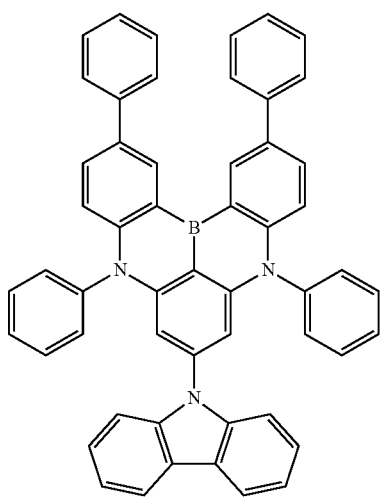
TD-12
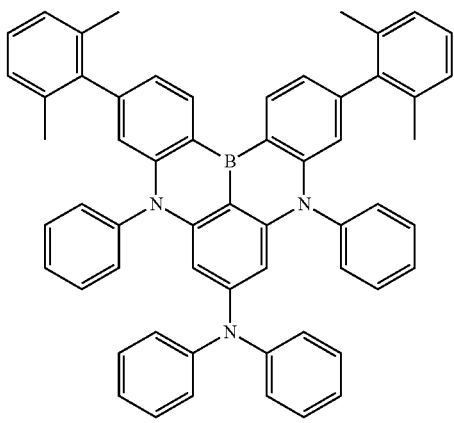
TD-13
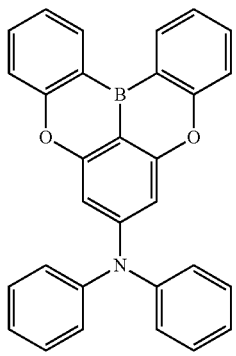
TD-14
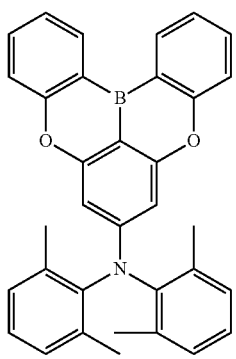
-continued
TD-15
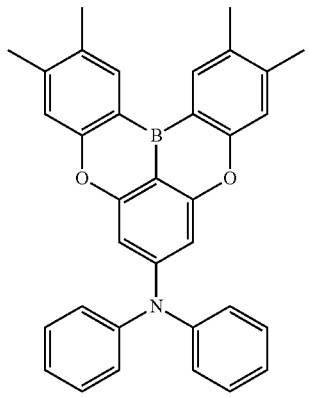
TD-16
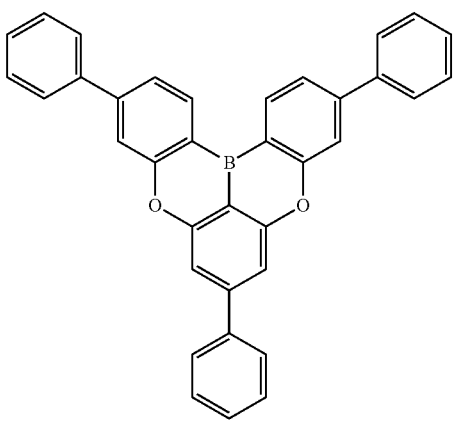
TD-17
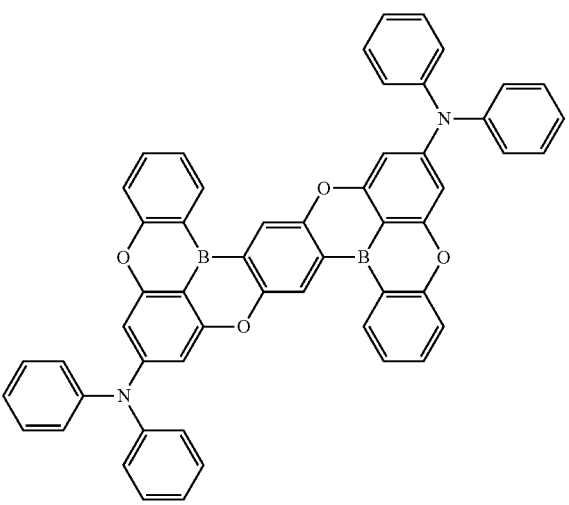

TD-18
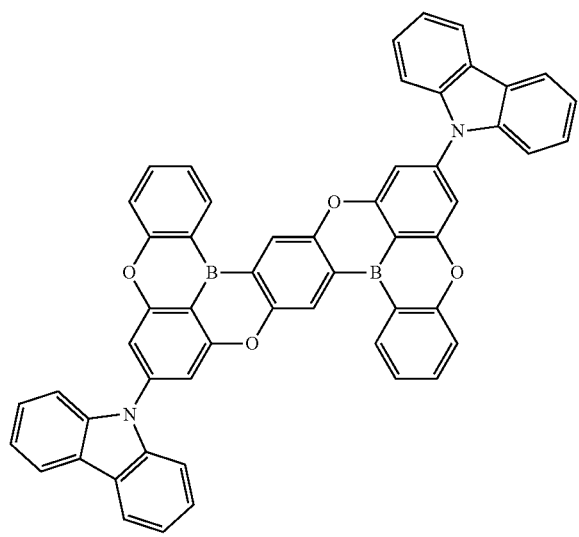
TD-19
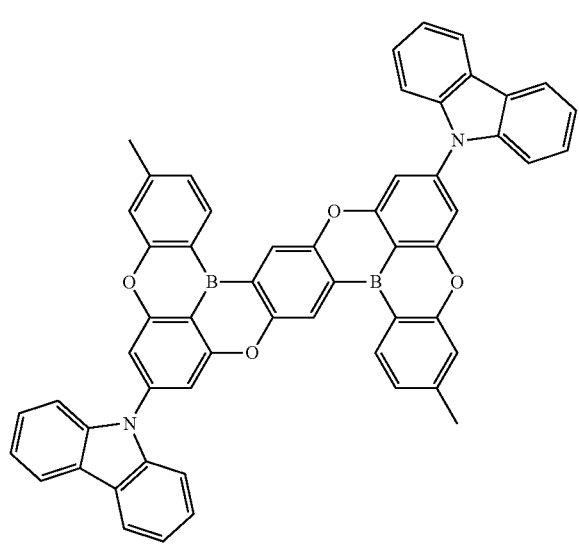
TD-20
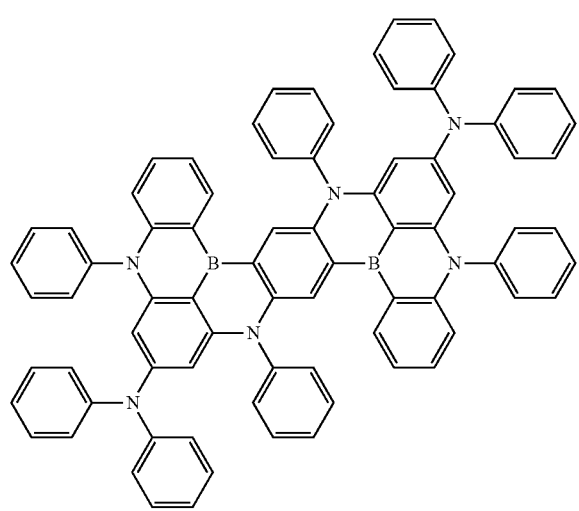
TD-21
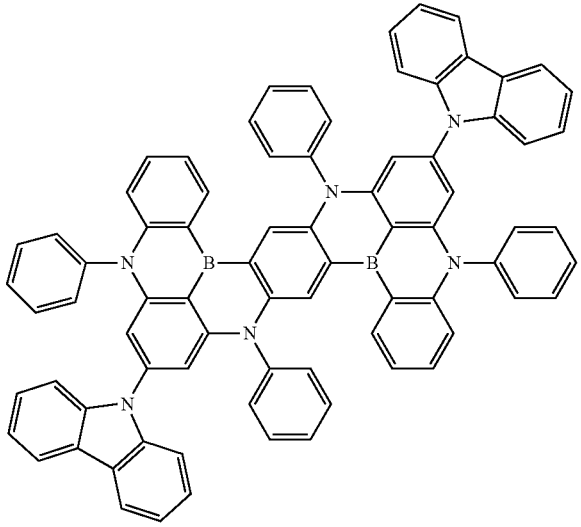
TD-22
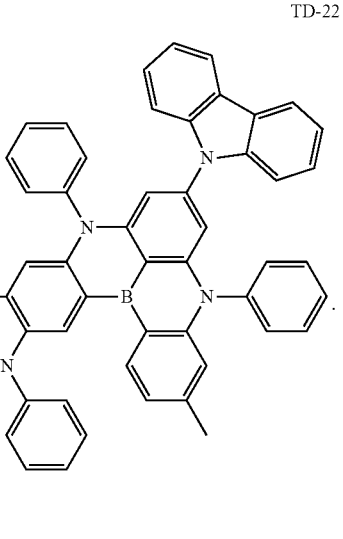
* * * * *